(12) United States Patent
Furuyama et al.

(10) Patent No.: US 10,723,850 B2
(45) Date of Patent: Jul. 28, 2020

(54) POLYMER FILM, WATERPROOF SOUND-PERMEABLE MEMBRANE, WATERPROOF SOUND-PERMEABLE MEMBER, ELECTRONIC DEVICE, ELECTRONIC DEVICE CASE, WATERPROOF SOUND TRANSMISSION STRUCTURE, WATERPROOF GAS-PERMEABLE MEMBRANE, WATERPROOF GAS-PERMEABLE MEMBER, WATERPROOF VENTILATION STRUCTURE, SUCTION SHEET, METHOD FOR HOLDING WORKPIECE BY SUCTION ON SUCTION UNIT, METHOD FOR PRODUCING CERAMIC CAPACITOR, OPTICAL FILM, OPTICAL MEMBER, AND COMPOSITION

(71) Applicant: NITTO DENKO CORPORATION, Osaka (JP)

(72) Inventors: Satoru Furuyama, Osaka (JP); Masaaki Mori, Osaka (JP); Yozo Nagai, Osaka (JP); Yuuzou Muraki, Osaka (JP); Toshimitsu Tachibana, Osaka (JP); Hajime Yamamoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 383 days.

(21) Appl. No.: 15/513,736

(22) PCT Filed: Sep. 24, 2015

(86) PCT No.: PCT/JP2015/004856
§ 371 (c)(1),
(2) Date: Mar. 23, 2017

(87) PCT Pub. No.: WO2016/047140
PCT Pub. Date: Mar. 31, 2016

(65) Prior Publication Data
US 2017/0292000 A1    Oct. 12, 2017

(30) Foreign Application Priority Data

Sep. 24, 2014 (JP) .................................. 2014-194354
Sep. 24, 2014 (JP) .................................. 2014-194355
(Continued)

(51) Int. Cl.
*C08K 5/18* (2006.01)
*C08J 5/18* (2006.01)
(Continued)

(52) U.S. Cl.
CPC ................ *C08J 5/18* (2013.01); *B01D 71/48* (2013.01); *B25J 15/0691* (2013.01);
(Continued)

(58) Field of Classification Search
CPC ......... C08J 5/18; C08J 7/04; C08J 7/12; C08J 7/123; C08J 9/00; C08J 2367/02;
(Continued)

(56) References Cited

U.S. PATENT DOCUMENTS

| 4,832,997 A | 5/1989 | Balanzat et al. |
| 2008/0025875 A1 | 1/2008 | Martin et al. |

(Continued)

FOREIGN PATENT DOCUMENTS

| CN | 2471400 Y | 1/2002 |
| CN | 102946969 A | 2/2013 |

(Continued)

OTHER PUBLICATIONS

Machine Translation of JP H07-501988(A). (Year: 1995).*
(Continued)

*Primary Examiner* — Brian Handville
(74) *Attorney, Agent, or Firm* — Greenblum & Bernstein, P.L.C.

(57) ABSTRACT

The polymer film of the present invention has through holes extending from one principal surface of the polymer film to
(Continued)

the other principal surface of the polymer film. The through holes are straight holes having a central axis extending straight, and have a shape in which the area of a cross-section perpendicular to the direction of the central axis increases from the one principal surface of the polymer film toward the other principal surface. This polymer film has passages in its thickness direction, has an unconventional structure, and can be used in various applications, such as in a waterproof sound-permeable membrane, in a waterproof gas-permeable membrane, and in a suction sheet. The ratio a/b of the opening diameter a of the through holes at the one principal surface to the opening diameter b of the through holes at the other principal surface is 80% or is less than 80%.

24 Claims, 21 Drawing Sheets

(30) Foreign Application Priority Data

Sep. 24, 2014 (JP) .................. 2014-194356
Sep. 24, 2014 (JP) .................. 2014-194357

(51) Int. Cl.
| | | |
|---|---|---|
| B01D 71/48 | (2006.01) | |
| H05K 5/06 | (2006.01) | |
| C08J 9/00 | (2006.01) | |
| B25J 15/06 | (2006.01) | |
| C04B 33/32 | (2006.01) | |
| C08J 7/04 | (2020.01) | |
| C08J 7/12 | (2006.01) | |
| G10K 13/00 | (2006.01) | |
| H01G 4/12 | (2006.01) | |
| H05K 5/02 | (2006.01) | |

(52) U.S. Cl.
CPC ............ *C04B 33/32* (2013.01); *C08J 7/04* (2013.01); *C08J 7/12* (2013.01); *C08J 7/123* (2013.01); *C08J 9/00* (2013.01); *G10K 13/00* (2013.01); *H01G 4/12* (2013.01); *H05K 5/0217* (2013.01); *H05K 5/06* (2013.01); *B01D 2325/022* (2013.01); *B01D 2325/38* (2013.01); *C04B 2235/66* (2013.01); *C08J 2367/02* (2013.01)

(58) Field of Classification Search
CPC .. C04B 33/32; C04B 2235/66; B25J 15/0691; H05K 5/0217; H05K 5/06; G10K 13/00; H01G 4/12; B01D 71/48; B01D 2325/38; B01D 2325/022

See application file for complete search history.

(56) References Cited

U.S. PATENT DOCUMENTS

| | | |
|---|---|---|
| 2008/0075935 A1 | 3/2008 | Iida et al. |
| 2012/0247647 A1 | 10/2012 | Moriyama et al. |
| 2013/0074691 A1 | 3/2013 | Furuyama et al. |
| 2013/0087042 A1 | 4/2013 | Furuyama et al. |
| 2013/0333978 A1 | 12/2013 | Abe et al. |
| 2015/0065597 A1 | 3/2015 | Furuyama et al. |

FOREIGN PATENT DOCUMENTS

| | | |
|---|---|---|
| EP | 2216361 A1 | 8/2010 |
| JP | S63-154750 A | 6/1988 |
| JP | S64-045700 A | 2/1989 |
| JP | H07-501988 A | 3/1995 |
| JP | 07-289865 A1 | 11/1995 |
| JP | 11-114334 A | 4/1999 |
| JP | 2003-053872 A | 2/2003 |
| JP | 2003-318557 A | 11/2003 |
| JP | 2006-026981 A | 2/2006 |
| JP | 2007-241045 A | 9/2007 |
| JP | 2008-065183 A | 3/2008 |
| JP | 2008-156200 A | 10/2008 |
| JP | 2010-231076 A | 10/2010 |
| JP | 2011-171728 A | 9/2011 |
| JP | 2012-020279 A | 2/2012 |
| JP | 2012-195928 A | 10/2012 |
| JP | 2012-524299 A | 10/2012 |
| JP | 2013-205688 A | 10/2013 |
| WO | 93/11861 | 6/1993 |
| WO | 2010/120864 A1 | 10/2010 |
| WO | 2013/145742 A1 | 10/2013 |

OTHER PUBLICATIONS

European search report issued with respect to European Patent Application No. 15843491.0, dated Apr. 13, 2018.
International Search Report issued with respect to Application No. PCT/JP2015/004856, dated Dec. 22, 2015.
International Preliminary Report on Patentability issued with respect to Application No. PCT/JP2015/004856, dated Mar. 28, 2017.

* cited by examiner

POLYMER FILM, WATERPROOF SOUND-PERMEABLE MEMBRANE, WATERPROOF SOUND-PERMEABLE MEMBER, ELECTRONIC DEVICE, ELECTRONIC DEVICE CASE, WATERPROOF SOUND TRANSMISSION STRUCTURE, WATERPROOF GAS-PERMEABLE MEMBRANE, WATERPROOF GAS-PERMEABLE MEMBER, WATERPROOF VENTILATION STRUCTURE, SUCTION SHEET, METHOD FOR HOLDING WORKPIECE BY SUCTION ON SUCTION UNIT, METHOD FOR PRODUCING CERAMIC CAPACITOR, OPTICAL FILM, OPTICAL MEMBER, AND COMPOSITION

TECHNICAL FIELD

The present invention relates to a polymer film.

The present invention also relates to: a waterproof sound-permeable membrane and waterproof sound-permeable member in which the polymer film is used; an electronic device, electronic device case, and waterproof sound transmission structure that include the waterproof sound-permeable membrane (or waterproof sound-permeable member); a waterproof gas-permeable membrane and waterproof gas-permeable member in which the polymer film is used; a waterproof ventilation structure including the waterproof gas-permeable membrane (or waterproof gas-permeable member); a suction sheet in which the polymer film is used; a method for holding a workpiece by suction on a suction unit using the suction sheet; a method for producing a ceramic capacitor using the suction sheet; an optical film; an optical member; and a composition.

BACKGROUND ART

Polymer films having passages extending in their thickness direction are used in various applications. An example of the applications is the use in a waterproof sound-permeable membrane having both waterproofness and sound permeability.

A waterproof sound-permeable membrane is used, for example, in an electronic device having an audio function. Nowadays, it is typical for electronic devices such as mobile phones, tablet computers, digital cameras, and game consoles to have an audio function. The housing of such an electronic device having an audio function encloses an audio part including a sound emitter such as a speaker and/or a sound receiver such as a microphone. The housing of the electronic device typically has an opening positioned in register with the audio part. This opening allows sound to be transmitted between the outside of the electronic device and the audio part.

Naturally, entry of water into the housing of an electronic device must be prevented; however, the above opening for transmission of sound may act as a passage that permits water to easily enter the housing. In particular, portable electronic devices have an increased risk of suffering from entry of water because they are often exposed to rain or water used in daily life and because the orientation of the opening cannot be fixed at a given orientation that allows the avoidance of water (for example, a downward orientation for which rain is less likely to come into the housing). For this reason, a waterproof sound-permeable membrane that permits transmission of sound between the audio part and the outside of the housing and that also prevents water from entering the housing from the outside through the opening is placed to cover the opening.

Another example of the applications of the polymer films is the use in a waterproof gas-permeable membrane having both waterproofness and gas permeability.

Various housings are often provided with openings for maintaining ventilation between the outside and inside of the housings, and examples of the housings include: a housing enclosing an electronic circuit board such as a vehicle ECU (Electrical Control Unit) and a control board for a solar cell; a housing enclosing an electronic device or components such as a motor, a light source, and a sensor; a housing of a household electric appliance such as an electric toothbrush and an electric shaver; and a housing of an information terminal such as a mobile phone. The provision of an opening to a housing makes possible, for example, elimination or reduction of pressure difference occurring between the inside and outside of the housing. The opening is often covered by a waterproof gas-permeable membrane that has both gas permeability and waterproofness and that prevents water from entering the housing from outside through the opening while permitting permeation of gas (typically air) between the inside and outside of the housing for maintenance of ventilation, especially when a product enclosed in the housing is vulnerable to water.

Examples of the waterproof sound-permeable membrane and the waterproof gas-permeable membrane include stretched porous membranes having a structure in which a huge number of pores formed by stretching are distributed. Patent Literature 1 discloses a waterproof sound-permeable membrane including a stretched porous membrane of polytetrafluoroethylene (PTFE) or of ultrahigh molecular weight polyethylene (UHMWPE), and Patent Literature 2 discloses a waterproof gas-permeable membrane including a stretched porous membrane of PTFE. Another example of the waterproof sound-permeable membrane and waterproof gas-permeable membrane is a non-porous polymer film having through holes formed to extend through the thickness of the film (see Patent Literature 3 and 4). The waterproof sound-permeable membrane of Patent Literature 3 and the waterproof gas-permeable membrane of Patent Literature 4 are formed by irradiating a non-porous polymer film with an ion beam and then chemically etching the film.

Another example of the applications of the polymer films having passages in their thickness direction is the use in a suction sheet, which is placed on a suction face of a suction unit when a workpiece is held by suction on the suction unit. Placing the suction sheet on the suction face allows the workpiece to be held by suction on the suction unit without direct contact between the suction face and the workpiece. The workpiece is, for example, a dielectric thin film (ceramic green sheet) used for production of a ceramic capacitor.

The ceramic green sheet is fabricated by applying a dielectric paste onto a release sheet to form a coating film and drying the coating film. The fabricated ceramic green sheet lying on the release sheet serving as a support is supplied to the production process of a ceramic capacitor together with the release sheet. The ceramic green sheet supplied is separated from the release sheet, optionally after undergoing formation of an electrode film and/or cutting, and is transferred to a predetermined place where the ceramic green sheet is stacked on another ceramic green sheet. The stack of the ceramic green sheets is sintered to produce a ceramic capacitor.

The separation of the ceramic green sheet from the release sheet and the transfer of the separated ceramic green sheet are accomplished using a suction unit that holds the ceramic green sheet by suction. Such transfer using a suction unit may be called "suction transfer". The suction transfer enables reliable separation and transfer, and precise stacking, of ceramic green sheets. The suction unit is typically made of metal, and its suction face is susceptible to flaws caused by a fine ceramic powder contained in ceramic green sheets. The flaws on the suction face act as a cause of flaws on other ceramic green sheets to be subsequently held on the suction face, and the flaws on the sheets lead to defects of the resulting ceramic capacitor. Placing the suction sheet on the suction face provides protection of the suction face, thereby reducing the occurrence of defects of the resulting ceramic capacitor. In addition, the maintenance of a suction transfer device or ceramic green sheet stacking device including the suction unit becomes easy.

An example of the suction sheet is a porous sheet including fine UHMWPE particles sintered together (see Patent Literature 5). Another example of the suction sheet is a non-porous polymer film having through holes formed to extend through the thickness of the film (see Patent Literature 6). These suction sheets have high gas permeability, good surface smoothness, and good releasing properties.

Polymer films having passages extending in their thickness direction are expected to be used in other various applications for which the properties of the films are appropriate, as well as in the applications described above.

CITATION LIST

Patent Literature

Patent Literature 1: JP 2003-53872 A
Patent Literature 2: JP 2003-318557 A
Patent Literature 3: JP 2012-195928 A
Patent Literature 4: JP 2012-20279 A
Patent Literature 5: JP 2006-26981 A
Patent Literature 6: JP 2011-171728 A

SUMMARY OF INVENTION

Technical Problem

An object of the present invention is to provide a polymer film having passages extending in its thickness direction, the polymer film having an unconventional structure and being usable in various applications, such as in a waterproof sound-permeable membrane, in a waterproof gas-permeable membrane, and in a suction sheet.

Solution to Problem

A polymer film of the present invention has through holes extending from one principal surface of the polymer film to the other principal surface of the polymer film. The through holes are straight holes having a central axis extending straight. The through holes have a shape in which the area of a cross-section perpendicular to the direction of the central axis increases from the one principal surface of the polymer film toward the other principal surface.

A waterproof sound-permeable membrane of the present invention includes the above polymer film of the present invention. In the membrane, the through holes have an opening diameter a of 12.0 μm or less at the one principal surface, and a gas permeability from the other principal surface to the one principal surface, as expressed in terms of Frazier number measured according to JIS L 1096, is 2.0 $cm^3/(cm^2 \cdot second)$ or more and 80 $cm^3/(cm^2 \cdot second)$ or less.

A waterproof sound-permeable member of the present invention includes the above waterproof sound-permeable membrane of the present invention and a supporting member joined to the waterproof sound-permeable membrane.

An electronic device of the present invention includes: a housing enclosing an audio part and provided with an opening for transmission of sound between the audio part and the outside of the housing; and a waterproof sound-permeable membrane placed to cover the opening and adapted to permit transmission of sound between the audio part and the outside of the housing and prevent water from entering the housing from the outside through the opening. The waterproof sound-permeable membrane is the above waterproof sound-permeable membrane of the present invention.

An electronic device case of the present invention is an electronic device case for enclosing an electronic device having an audio part. The electronic device case includes: an opening provided for transmission of sound between the audio part of the electronic device and the outside of the case; and a waterproof sound-permeable membrane placed to cover the opening and adapted to permit transmission of sound between the audio part of the electronic device and the outside of the case and prevent water from entering the case from the outside through the opening. The waterproof sound-permeable membrane is the above waterproof sound-permeable membrane of the present invention.

A waterproof sound transmission structure of the present invention includes: a housing provided with an opening for transmission of sound between the inside and outside of the housing; and a waterproof sound-permeable membrane placed to cover the opening and adapted to permit transmission of sound between the inside and outside of the housing and prevent water from entering the housing from the outside through the opening. The waterproof sound-permeable membrane is the above waterproof sound-permeable membrane of the present invention.

A waterproof gas-permeable membrane of the present invention includes the above polymer film of the present invention. In the membrane, the through holes have an opening diameter a at the one principal surface and an opening diameter b at the other principal surface, and a ratio a/b of the opening diameter a to the opening diameter b is 80% or less.

A waterproof gas-permeable member of the present invention includes: the above waterproof gas-permeable membrane of the present invention; and a supporting member joined to the waterproof gas-permeable membrane.

A waterproof ventilation structure of the present invention includes: a housing having an opening; and a waterproof gas-permeable membrane placed to cover the opening and adapted to permit permeation of gas between the inside and outside of the housing and prevent water from entering the housing from the outside through the opening. The waterproof gas-permeable membrane is the above waterproof gas-permeable membrane of the present invention.

A suction sheet of the present invention is a suction sheet to be placed on a suction face of a suction unit that holds a workpiece by suction. The suction sheet includes the above polymer film of the present invention. The through holes have an opening diameter a at the one principal surface and an opening diameter b at the other principal surface, and a ratio a/b of the opening diameter a to the opening diameter b is 80% or less. The opening diameter a is 10 μm or less.

A method of the present invention for holding a workpiece by suction on a suction unit includes holding a workpiece by suction using a suction unit having a suction face with a suction sheet placed thereon, the holding being accomplished without direct contact between the suction face and the workpiece due to the presence of the suction sheet between the suction face and the workpiece. The suction sheet is the above suction sheet of the present invention, and one principal surface of the sheet having smaller-diameter openings of the through holes faces the workpiece.

A method of the present invention for producing a ceramic capacitor includes: a separation step of drawing by suction a ceramic green sheet formed on a release film to a suction face of a suction unit so as to separate the ceramic green sheet from the release film; a stacking step of transferring the separated ceramic green sheet to a place while keeping the ceramic green sheet held by suction on the suction face, and then stacking the ceramic green sheet onto another ceramic green sheet at the place; and a sintering step of sintering a stack of the ceramic green sheets that is formed by two or more repetitions of the separation step and the stacking step. In this method, a suction sheet is placed on the suction face so that the ceramic green sheet is held by suction on the suction unit without direct contact between the suction face and the ceramic green sheet. The suction sheet is the above suction sheet of the present invention, and one principal surface of the sheet having smaller-diameter openings of the through holes faces the ceramic green sheet.

An optical film of the present invention includes the above polymer film of the present invention. In the optical film, the through holes have an opening diameter a at the one principal surface and an opening diameter b at the other principal surface, a ratio a/b of the opening diameter a to the opening diameter b is less than 80%, and the opening diameter a of the through holes at the one principal surface is 20 μm or less.

An optical member of the present invention includes the above optical film of the present invention.

A composition of the present invention includes ground pieces of the above optical film of the present invention.

Advantageous Effects of Invention

The present invention makes it possible to obtain a polymer film having passages extending in its thickness direction, the polymer film having an unconventional structure and being usable in various applications, such as in a waterproof sound-permeable membrane, in a waterproof gas-permeable membrane, and in a suction sheet.

DESCRIPTION OF EMBODIMENTS

Figure 1:
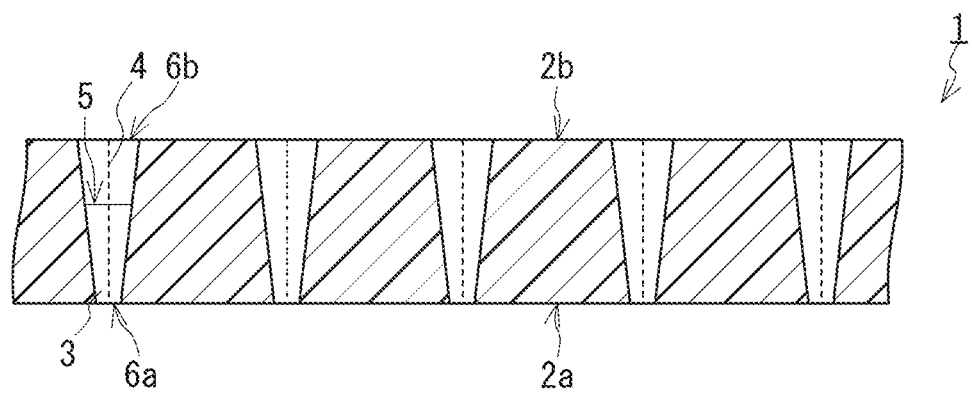
FIG. 1 is a cross-sectional view schematically showing an example of the polymer film of the present invention.

The first aspect of the present disclosure provides a polymer film having through holes extending from one principal surface of the polymer film to the other principal surface of the polymer film, wherein the through holes are straight holes having a central axis extending straight, and the through holes have a shape in which the area of a cross-section perpendicular to the direction of the central axis increases from the one principal surface of the polymer film toward the other principal surface.

The second aspect of the present disclosure provides the polymer film as set forth in the first aspect, wherein the through holes have an opening diameter a at the one principal surface and an opening diameter b at the other principal surface, and a ratio a/b of the opening diameter a to the opening diameter b is 80% or is less than 80%.

The third aspect of the present disclosure provides the polymer film as set forth in the first or second aspect, the polymer film being composed of at least one selected from polyethylene terephthalate, polycarbonate, polyimide, polyethylene naphthalate, and polyvinylidene fluoride.

The fourth aspect of the present disclosure provides a waterproof sound-permeable membrane including the polymer film as set forth in any one of the first to third aspects, wherein the through holes have an opening diameter a of 12.0 μm or less at the one principal surface, and a gas permeability from the other principal surface to the one principal surface, as expressed in terms of Frazier number measured according to JIS L 1096, is 2.0 $cm^3/(cm^2 \cdot second)$ or more and 80 $cm^3/(cm^2 \cdot second)$ or less.

The fifth aspect of the present disclosure provides the waterproof sound-permeable membrane as set forth in the fourth aspect, wherein the through holes have an opening diameter a at the one principal surface and an opening diameter b at the other principal surface, and a ratio a/b of the opening diameter a to the opening diameter b is 80% or less.

The sixth aspect of the present disclosure provides the waterproof sound-permeable membrane as set forth in the fourth or fifth aspect, wherein the polymer film has: the through holes having a central axis extending in a first oblique direction with respect to a perpendicular direction to the principal surfaces of the film; and the through holes having a central axis extending in a second oblique direction with respect to the perpendicular direction, and the first and second oblique directions are different from each other.

The seventh aspect of the present disclosure provides the waterproof sound-permeable membrane as set forth in any one of the fourth to sixth aspects, wherein a water entry pressure as measured according to Method B (high hydraulic pressure method) of water penetration test specified in JIS L 1092 is 3 kPa or more.

The eighth aspect of the present disclosure provides the waterproof sound-permeable membrane as set forth in any one of the fourth to seventh aspects, further including a sound-permeable supporting layer stacked with the polymer film.

The ninth aspect of the present disclosure provides a waterproof sound-permeable member including: the waterproof sound-permeable membrane as set forth in any one of the fourth to eighth aspects; and a supporting member joined to the waterproof sound-permeable membrane.

The tenth aspect of the present disclosure provides an electronic device including: a housing enclosing an audio part and provided with an opening for transmission of sound between the audio part and the outside of the housing; and a waterproof sound-permeable membrane placed to cover the opening and adapted to permit transmission of sound between the audio part and the outside of the housing and prevent water from entering the housing from the outside through the opening, wherein the waterproof sound-permeable membrane is the waterproof sound-permeable membrane as set forth in any one of the fourth to eighth aspects.

The eleventh aspect of the present disclosure provides an electronic device case for enclosing an electronic device having an audio part, the electronic device case including: an opening provided for transmission of sound between the audio part of the electronic device and the outside of the case; and a waterproof sound-permeable membrane placed to cover the opening and adapted to permit transmission of sound between the audio part of the electronic device and the outside of the case and prevent water from entering the case from the outside through the opening, wherein the waterproof sound-permeable membrane is the waterproof sound-permeable membrane as set forth in any one of the fourth to eighth aspects.

The twelfth aspect of the present disclosure provides a waterproof sound transmission structure including: a housing provided with an opening for transmission of sound between the inside and outside of the housing; and a waterproof sound-permeable membrane placed to cover the opening and adapted to permit transmission of sound between the inside and outside of the housing and prevent water from entering the housing from the outside through the opening, wherein the waterproof sound-permeable membrane is the waterproof sound-permeable membrane as set forth in any one of the fourth to eighth aspects.

The thirteenth aspect of the present disclosure provides a waterproof gas-permeable membrane including the polymer film as set forth in any one of the first to third aspects, wherein the through holes have an opening diameter a at the one principal surface and an opening diameter b at the other principal surface, and a ratio a/b of the opening diameter a to the opening diameter b is 80% or less.

The fourteenth aspect of the present disclosure provides the waterproof gas-permeable membrane as set forth in the thirteenth aspect, wherein the opening diameter a is 12 μm or less.

The fifteenth aspect of the present disclosure provides the waterproof gas-permeable membrane as set forth in the thirteenth or fourteenth aspect, wherein the density of distribution of the through holes in the polymer film is $1 \times 10^3$ holes/cm$^2$ or more and $1 \times 10^9$ holes/cm$^2$ or less.

The sixteenth aspect of the present disclosure provides the waterproof gas-permeable membrane as set forth in any one of the thirteenth to fifteenth aspects, wherein an opening area ratio of the one principal surface is 50% or less.

The seventeenth aspect of the present disclosure provides the waterproof gas-permeable membrane as set forth in any one of the thirteenth to sixteenth aspects, wherein the polymer film has: the through holes having a central axis extending in a first oblique direction with respect to a perpendicular direction to the principal surfaces of the film; and the through holes having a central axis extending in a second oblique direction with respect to the perpendicular direction, and the first and second oblique directions are different from each other.

The eighteenth aspect of the present disclosure provides the waterproof gas-permeable membrane as set forth in any one of the thirteenth to seventeenth aspects, having a gas permeability in a thickness direction thereof, the gas permeability being 0.5 seconds/100 mL or more as expressed in terms of Gurley number measured according to JIS L 1096.

The nineteenth aspect of the present disclosure provides the waterproof gas-permeable membrane as set forth in any one of the thirteenth to eighteenth aspects, wherein a water entry pressure as measured according to Method B (high hydraulic pressure method) of water penetration test specified in JIS L 1092 is 5 kPa or more.

The twentieth aspect of the present disclosure provides the waterproof gas-permeable membrane as set forth in any one of the thirteenth to nineteenth aspects, further including a gas-permeable supporting layer stacked with the polymer film.

The twenty-first aspect of the present disclosure provides a waterproof gas-permeable member including: the waterproof gas-permeable membrane as set forth in any one of the thirteenth to twentieth aspects; and a supporting member joined to the waterproof gas-permeable membrane.

The twenty-second aspect of the present disclosure provides a waterproof ventilation structure including: a housing having an opening; and a waterproof gas-permeable membrane placed to cover the opening and adapted to permit permeation of gas between the inside and outside of the housing and prevent water from entering the housing from the outside through the opening, wherein the waterproof gas-permeable membrane is the waterproof gas-permeable membrane as set forth in any one of the thirteenth to twentieth aspects.

The twenty-third aspect of the present disclosure provides a suction sheet to be placed on a suction face of a suction unit that holds a workpiece by suction, the suction sheet including the polymer film as set forth in any one of the first to third aspects, wherein the through holes have an opening diameter a at the one principal surface and an opening diameter b at the other principal surface, a ratio a/b of the opening diameter a to the opening diameter b is 80% or less, and the opening diameter a is 10 μm or less.

The twenty-fourth aspect of the present disclosure provides the suction sheet as set forth in the twenty-third aspect, wherein one principal surface of the suction sheet has a surface roughness (Ra) of 2 μm or less, the one principal surface having smaller-diameter openings of the through holes, and the suction sheet has a gas permeability in a thickness direction thereof, the gas permeability being 10 seconds/100 mL or less as expressed in terms of Gurley number measured according to JIS L 1096.

The twenty-fifth aspect of the present disclosure provides a method for holding a workpiece by suction on a suction unit, the method including holding a workpiece by suction using a suction unit having a suction face with a suction sheet placed thereon, the holding being accomplished without direct contact between the suction face and the workpiece due to the presence of the suction sheet between the suction face and the workpiece, wherein the suction sheet is the suction sheet as set forth in the twenty-third or twenty-fourth aspect, and one principal surface of the sheet having smaller-diameter openings of the through holes faces the workpiece.

The twenty-sixth aspect of the present disclosure provides a method for producing a ceramic capacitor, including: a separation step of drawing by suction a ceramic green sheet formed on a release film to a suction face of a suction unit so as to separate the ceramic green sheet from the release film; a stacking step of transferring the separated ceramic green sheet to a place while keeping the ceramic green sheet held by suction on the suction face, and then stacking the ceramic green sheet onto another ceramic green sheet at the place; and a sintering step of sintering a stack of the ceramic green sheets that is formed by two or more repetitions of the separation step and the stacking step, wherein a suction sheet is placed on the suction face so that the ceramic green sheet is held by suction on the suction unit without direct contact between the suction face and the ceramic green sheet, the suction sheet is the suction sheet as set forth in the twenty-third or twenty-fourth aspect, and one principal surface of the sheet having smaller-diameter openings of the through holes faces the ceramic green sheet.

The twenty-seventh aspect of the present disclosure provides an optical film including the polymer film as set forth in any one of the first to third aspects, wherein the through holes have an opening diameter a at the one principal surface and an opening diameter b at the other principal surface, a ratio a/b of the opening diameter a to the opening diameter b is less than 80%, and the opening diameter a of the through holes at the one principal surface is 20 µm or less.

The twenty-eighth aspect of the present disclosure provides the optical film as set forth in the twenty-seventh aspect, wherein the reflectance of the principal surfaces of the optical film for light in the wavelength range of 300 to 800 nm is different for each principal surface of the optical film.

The twenty-ninth aspect of the present disclosure provides the optical film as set forth in the twenty-seventh or twenty-eighth aspect, wherein the density of distribution of the through holes in the polymer film is $1 \times 10^3$ holes/cm$^2$ or more and $1 \times 10^{10}$ holes/cm$^2$ or less.

The thirtieth aspect of the present disclosure provides the optical film as set forth in any one of the twenty-seventh to twenty-ninth aspects, wherein a ratio c/d of an opening area ratio c of the one principal surface of the polymer film to an opening area ratio d of the other principal surface of the polymer film is 65% or less.

The thirty-first aspect of the present disclosure provides an optical member including the optical film as set forth in any one of the twenty-seventh to thirtieth aspects.

The thirty-second aspect of the present disclosure provides a composition including ground pieces of the optical film as set forth in any one of the twenty-seventh to thirtieth aspects.

[Polymer Film]

FIG. 1 shows an example of the polymer film of the present invention. The polymer film 1 shown in FIG. 1 has through holes 3 extending from one principal surface 2a of the film 1 to the other principal surface 2b. The through holes 3 are straight holes having a central axis (axial line) 4 extending straight, and have a shape in which the area of a cross-section 5 perpendicular to the direction of the central axis 4 increases from the one principal surface 2a of the polymer film 1 toward the other principal surface 2b. The polymer film 1 is, for example, a non-porous film having only the through holes 3 as through-thickness passages that allow transmission of gas such as typically air. The polymer film 1 can be an imperforate (solid) film having no other holes than the through holes 3.

The polymer film 1 shown in FIG. 1 differs, for example, from the non-porous polymer films disclosed in Patent Literature 3 (JP 2012-195928 A), Patent Literature 4 (JP 2012-20279 A), and Patent Literature 6 (JP 2011-171728 A) at least in the shape of the through holes. Specifically, the through holes of these conventional polymer films are "straight holes extending straight through the resin film and having a constant cross-sectional shape" (paragraph [0014] in Patent Literature 3), while the through holes 3 of the polymer film 1 of FIG. 1, albeit being straight holes having a central axis extending straight, have a shape in which the area of the cross-section 5 perpendicular to the direction of the central axis 4 increases from the one principal surface 2a of the film 1 toward the other principal surface 2b. In the polymer film 1, since the through holes 3 have such a shape, the diameter (opening diameter a) of the openings 6a of the through holes 3 at the one principal surface 2a of the film 1 is not equal to the diameter (opening diameter b) of the openings 6b of the through holes 3 at the other principal surface 2b. For example, the smaller opening diameter a corresponds to 80% or less than 80% of the larger opening diameter b. That is, the ratio a/b of the opening diameter a of the through holes 3 at the one principal surface 2a of the polymer film 1 to the opening diameter b of the through holes 3 at the other principal surface 2b is 80% or is less than 80%, for example.

The structure of the polymer film 1 shown in FIG. 1 obviously indicates that the polymer film 1 is completely different in structure from the stretched porous membranes disclosed in Patent Literature 1 and 2 and the porous sheet disclosed in Patent Literature 5 which includes fine particles sintered together.

As shown in FIG. 1, each through hole 3 is a through hole having a shape that is asymmetrical in the thickness direction of the polymer film 1 and whose cross-section 5 varies in shape in the direction of the central axis 4 (direction in which the through hole 3 extends).

The shape of the through holes 3 is not limited, as long as the through holes 3 are straight holes having the central axis 4 extending straight, and the area of the cross-section 5 perpendicular to the direction of the central axis 4 increases from the one principal surface 2a of the polymer film 1 toward the other principal surface 2b. The area of the cross-section 5 may increase continuously from the principal surface 2a toward the principal surface 2b, or may increase stepwise from the principal surface 2a toward the principal surface 2b (this means that the through holes 3 may have a region over which the area of the cross-section 5 is constant). It is preferable for the area of the cross-section 5 to increase continuously from the principal surface 2a toward the principal surface 2b as in the example shown in FIG. 1 (that is, it is preferable for the through holes 3 to have a shape in which the area of the cross-section 5 increases continuously from the one principal surface 2a to the other principal surface 2b). It is more preferable that the increase rate of the cross-sectional area be constant or substantially constant. The production method described later is capable of forming: the polymer film 1 having the through holes 3 having the cross-section 5 the area of which increases continuously from the principal surface 2a toward the principal surface 2b; and the polymer film 1 in which the increase rate of the area is constant or substantially constant.

The shape of the cross-section 5 of the through holes 3 is not particularly limited and is, for example, circular or elliptical. In this case, the shape of the cross-section 5 need not be exactly circular or elliptical. For example, some degree of shape distortion caused by unevenness of chemical etching performed in the production method described later is acceptable. The through holes 3 may have the cross-section 5 that is circular or elliptical and whose area increases continuously at a constant or substantially constant rate from the principal surface 2a to the principal surface 2b. In this case, the shape of the through holes 3 corresponds to the entirety or a part of a circular or elliptical cone whose central line coincides with the central axis 4. The production method described later is capable of forming the polymer film 1 having the through holes 3 having the cross-section 5 that is circular or elliptical.

The diameter (opening diameter a) of the openings 6a which are the relatively small openings of the through holes 3 depends on the specific application of the polymer film 1, and is, for example, 20 µm or less and can be 15 µm or less, 12 µm or less, or 10 µm or less. The lower limit of the opening diameter a depends on the specific application of the polymer film 1 and is, for example, 0.05 µm or more. That is, the opening diameter a can be 0.05 µm or more and 20 µm or less. The diameter (opening diameter b) of the openings 6b which are the relatively large openings of the through holes 3 is not limited as long as it is greater than the opening diameter a. The opening diameter b is, for example, 0.2 μm or more and 30 μm or less.

The diameter of the openings 6a or 6b of the through holes 3 is determined as the diameter of a circle on the assumption that each opening 6a or 6b has the shape of the circle. In other words, the diameter of each opening 6a or 6b is defined to correspond to the diameter of a circle having an area equal to the cross-sectional area (opening area) of the opening 6a or 6b. The diameters of the openings of the through holes 3 at each principal surface of the polymer film 1 need not be exactly equal for all of the openings lying at the principal surface. However, it is preferable for the openings in the effective portion of the polymer film 1 (the portion that can be used in an application of the film 1) to have such uniform diameters that the diameters can be considered substantially equal (e.g., the standard deviation is 10% or less of the average). The production method described later is capable of forming the polymer film 1 in which the diameters of the openings at each of the two principal surfaces are uniform. In the polymer film 1, the opening diameter a and/or opening diameter b of all of the through holes 3 in the effective portion can be within the range(s) specified above.

A through hole 3 extending in an oblique direction with respect to a perpendicular direction to the principal surfaces 2a and 2b of the polymer film 1 can have an opening of elliptical shape. Also in such a case, the cross-section 5 of the through hole 3 inside the film 1 can be considered to be in the shape of a circle, and the diameter of this circle is equal to the minor axis of the ellipse corresponding to the shape of the opening. Thus, for the through hole 3 extending in the oblique direction and having an opening of elliptical shape, the minor axis of the ellipse can be regarded as the opening diameter of the through hole.

The density of distribution of the through holes 3 in the polymer film 1 (hole density: the number of the through holes lying per 1 cm$^2$ of the principal surface of the film) is not particularly limited and is, for example, $1\times10^3$ holes/cm$^2$ or more and $1\times10^{10}$ holes/cm$^2$ or less. The hole density need not be exactly constant over the entirety of the polymer film 1. However, the hole density in the effective portion of the polymer film 1 can be so uniform that the maximum value of the hole density is equal to or less than 1.5 times the minimum value of the hole density.

Figure 2:
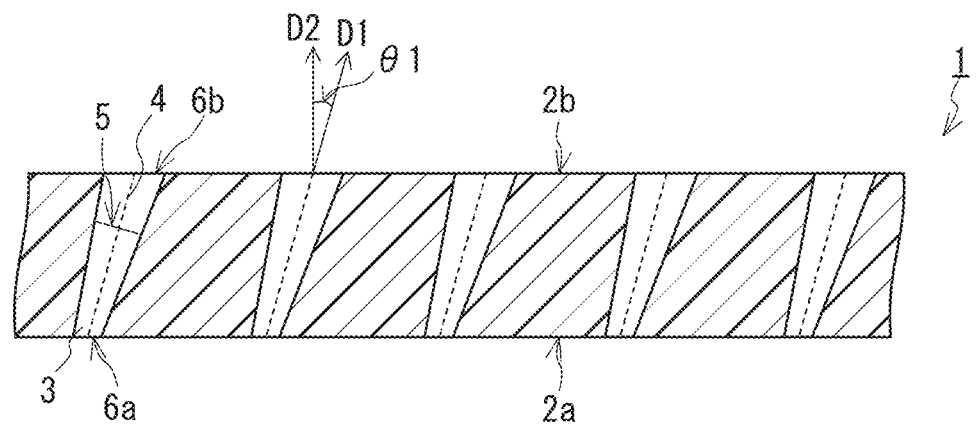
FIG. 2 is a cross-sectional view schematically showing another example of the polymer film of the present invention.

In the example shown in FIG. 1, the central axis 4 of each through hole 3 extends in the perpendicular direction to the principal surfaces 2a and 2b of the polymer film 1. The direction of the central axis 4 of each through hole 3 may be oblique with respect to the perpendicular direction to the principal surfaces 2a and 2b. An example of such a polymer film 1 is shown in FIG. 2.

The polymer film 1 may have through holes 3 the central axes 4 of which extend in different directions. Specifically, the polymer film 1 may have, for example, both a through hole 3 having a central axis 4 extending in a perpendicular direction to the principal surfaces 2a and 2b and a through hole 3 having a central axis 4 extending in an oblique direction with respect to the perpendicular direction. Alternatively, for example, the polymer film 1 may have through holes 3 the central axes 4 of which extend in different oblique directions with respect to the perpendicular direction to the principal surfaces 2a and 2b of the film 1; that is, through holes having a central axis extending in a first oblique direction and through holes having a central axis extending in a second oblique direction different from the first oblique direction may coexist in the polymer film 1. An example of the latter case is shown in FIG. 3.

Figure 3:
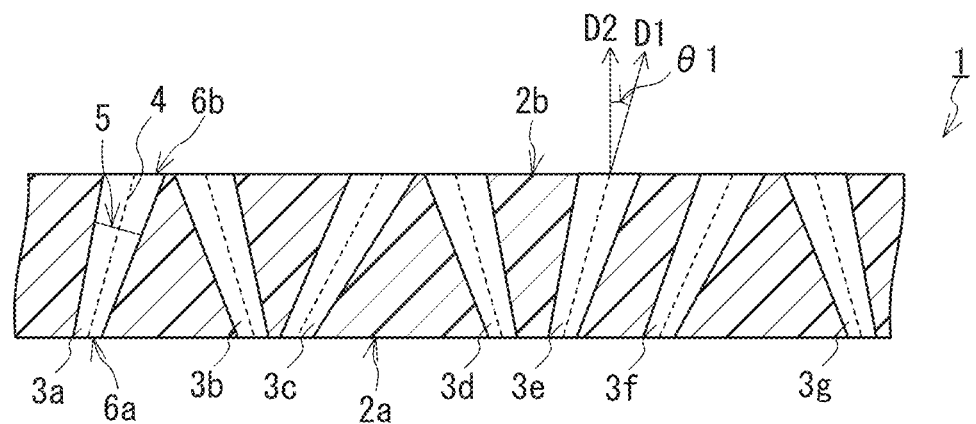
FIG. 3 is a cross-sectional view schematically showing still another example of the polymer film of the present invention.

The polymer film 1 shown in FIG. 3 has through holes 3a to 3g the central axes 4 of which extend in different oblique directions with respect to the perpendicular direction to the principal surfaces 2a and 2b. In other words, the through holes 3 in the polymer film 1 of FIG. 3 include a combination of through holes 3 extending (penetrating through the polymer film 1) in oblique directions with respect to the perpendicular direction to the principal surfaces 2a and 2b of the polymer film 1, the oblique directions being different from each other. The polymer film 1 may have a combination of through holes 3 extending in the same direction. In the example shown in FIG. 3, the directions in which the through holes 3a, 3b, and 3c extend are different from one another, while the directions in which the through holes 3a and 3e extend are the same. In the following description, the term "set" may be used instead of "combination". The term "set" is used not only to refer to the relationship (a pair) between one through hole and another through hole but also to refer to the relationship between one or more through holes and one or more other through holes. Saying that there is a set of through holes having the same characteristics means that there are two or more through holes having the characteristics.

In the polymer film 1 as shown in FIG. 3 which has the through holes 3 extending in different oblique directions, the oblique angles and the proportion of the through holes 3 extending in each direction can be varied. This broadens the range of properties that the polymer film 1 can have. Being possible to have a broad range of properties can be an advantage of the polymer film 1 in various applications.

For the through holes 3 shown in FIGS. 2 and 3, the angle θ1 formed by the oblique direction D1 with the direction D2 perpendicular to the principal surfaces of the polymer film 1 is, for example, 45° or less and can be 30° or less. The lower limit of the angle θ1 is not particularly defined, and the angle θ1 is, for example, 10° or more and can be 20° or more. If the angle θ1 is excessively large, the mechanical strength of the polymer film 1 tends to deteriorate. The through holes 3 shown in FIG. 3 include a set of through holes for which the angle θ1 is different.

When the polymer film 1 as shown in FIG. 3 which has through holes 3 extending in different oblique directions is viewed in a perpendicular direction to a principal surface of the polymer film 1 (when the directions in which the through holes 3 extend are projected on the principal surface), the directions in which the through holes 3 extend may be parallel to each other. The polymer film 1 may have a set of through holes 3 for which the directions are different from each other (there may be through holes 3 for which the directions are different from each other in the polymer film 1).

Figure 4:
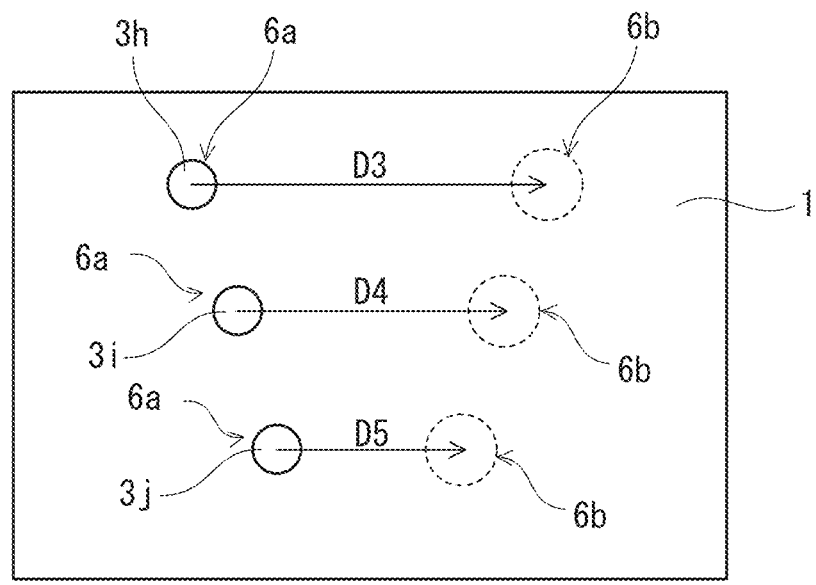
FIG. 4 is a plan view schematically showing an example of the relationship between the through holes of the polymer film of the present invention in terms of the directions in which the through holes extend.

FIG. 4 shows an example where the directions in which the through holes 3 extend when viewed in a perpendicular direction to a principal surface of the polymer film 1 are parallel to each other. In the example shown in FIG. 4 there can be seen three through holes 3 (3h, 3i, and 3j). In the view taken in a perpendicular direction to a principal surface of the polymer film 1, the respective directions D3, D4, and D5 in which the three through holes 3 extend (the directions from the openings 6a of the through holes 3 at the principal surface depicted on the sheet plane toward the openings 6b of the through holes 3 at the opposite principal surface) are parallel to each other (this means that θ2 described later is 0°). It should be recalled that the angles θ1 formed by the through holes 3h, 3i, and 3j are different from each other, the angle θ1 formed by the through hole 3j is smallest, and the angle θ1 formed by the through hole 3h is largest. Thus, the directions in which the through holes 3h, 3i, and 3j extend are different from each other in three dimensions.

Figure 5:
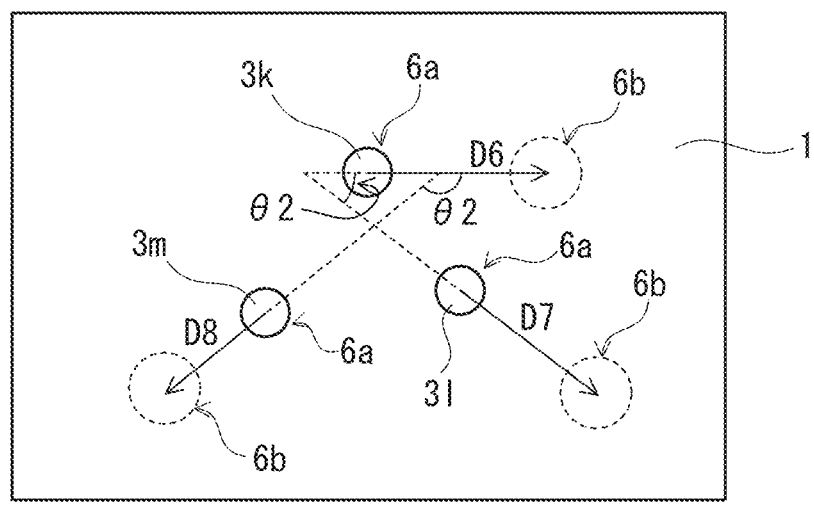
FIG. 5 is a plan view schematically showing another example of the relationship between the through holes of the polymer film of the present invention in terms of the directions in which the through holes extend.

FIG. 5 shows an example where the directions in which the through holes 3 extend when viewed in a perpendicular direction to a principal surface of the polymer film 1 are different from each other. In the example shown in FIG. 5 there can be seen three through holes 3 (3k, 3l, and 3m). In the view taken in a perpendicular direction to a principal surface of the polymer film 1, the respective directions D6, D7, and D8 in which the three through holes 3 extend are different from each other. When viewed in a perpendicular direction to a principal surface of the polymer film 1, the through holes 3k and 3l extend from the principal surface in different directions forming an angle θ2 of less than 90°. In contrast, the through holes 3k and 3m extend from a principal surface of the polymer film 1 in different directions forming an angle θ2 of not less than 90° when viewed in a perpendicular direction to the principal surface. The latter set of through holes is preferable; that is, the polymer film 1 preferably has a set of through holes 3 that, when viewed in a perpendicular direction to a principal surface of the film, extend from the principal surface in different directions forming an angle θ2 of 90° or more. In other words, the polymer film 1, when viewed in a perpendicular direction to a principal surface of the film, preferably has a set of the through hole 3k extending from the principal surface in one direction D6 and the through hole 3m extending from the principal surface in another direction D8 forming an angle θ2 of 90° or more with the one direction D6. The angle θ2 can be 90° or more and 180° or less, and can be 180°.

Figure 6:
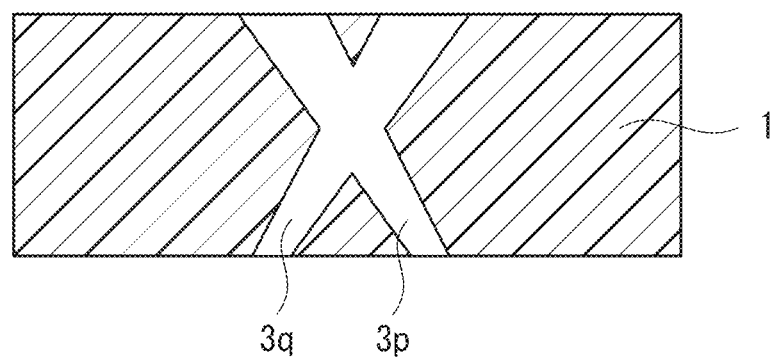
FIG. 6 is a cross-sectional view schematically showing still another example of the polymer film of the present invention.

In the polymer film 1 as shown in FIG. 3 which has through holes 3 extending in different oblique directions, two or more of the through holes 3 may cross each other in the polymer film 1. That is, the polymer film 1 may have a set of through holes 3 crossing each other in the film 1. Such an example is shown in FIG. 6. In the example shown in FIG. 6, the through holes 3p and 3q cross each other in the polymer film 1.

The directions in which the through holes 3 extend in the polymer film 1 (the directions of the central axes 4 of the through holes 3) can be known, for example, by observing the principal surfaces and a cross-section of the film with a scanning electron microscope (SEM).

In the polymer film 1, there may be a through hole that is a straight hole whose cross-section perpendicular to the direction of the central axis has a constant shape in the thickness direction of the film 1.

The polymer film 1 may be subjected to a surface treatment. An example of the surface treatment is a liquid-repellent treatment. The polymer film 1 subjected to the liquid-repellent treatment has a liquid-repellent layer formed on at least a portion of the surfaces thereof. The liquid-repellent layer may be formed on both principal surfaces of the polymer film 1 or only on one of the principal surfaces. The liquid-repellent layer may be formed on the surfaces of the through holes 3.

The liquid-repellent layer is a water-repellent layer and preferably further has oil repellency. When the liquid-repellent layer is formed on at least one principal surface of the polymer film 1, the layer can have openings positioned in register with the openings of the through holes 3.

The liquid-repellent layer can be formed, for example, as follows: A treatment liquid prepared by diluting a water-repellent agent or hydrophobic oil-repellent agent with a diluent is thinly applied and dried on the polymer film 1. The water-repellent agent or hydrophobic oil-repellent agent is, for example, a fluorine compound such as perfluoroalkyl acrylate or perfluoroalkyl methacrylate. The thickness of the liquid-repellent layer is preferably less than ½ of the diameter of the through holes 3.

When the liquid-repellent layer is formed by thinly applying a treatment liquid onto the polymer film 1, the surfaces (inner peripheral surfaces) of the through holes 3 can, depending on the diameters of the through holes, be coated with the liquid-repellent layer extending continuously from the principal surface of the film 1.

The thickness of the polymer film 1 is not limited and is, for example, 5.0 μm or more and 100 μm or less.

The material composing the polymer film 1 is, for example, a material that allows the production method described later to form the through holes 3 in an original film which is a non-porous polymer film made of the material. The polymer film 1 is composed of, for example, a resin degradable by an alkaline solution, an acidic solution, or an alkaline or acidic solution to which has been added at least one selected from an oxidant, an organic solvent, and a surfactant. In this case, the formation of the through holes 3 in the original film by ion beam irradiation and chemical etching becomes easier in the production method described later. The solutions as mentioned above are typical etching solutions. From another standpoint, the polymer film 1 is composed of, for example, a resin that can be etched by hydrolysis or oxidative degradation. The original film used can be a commercially-available film.

The polymer film 1 is composed of, for example, at least one resin selected from polyethylene terephthalate (PET), polycarbonate, polyimide, polyethylene naphthalate, and polyvinylidene fluoride.

In the polymer film 1, the diameter of the openings 6a of the through holes 3 at the one principal surface 2a and the diameter of the openings 6b of the through holes 3 at the other principal surface 2b are different, which is why the properties based on the one principal surface 2a and the properties based on the other principal surface 2b can be different. Such a difference in properties between the principal surfaces can offer an advantage, depending on the application of the polymer film 1. The extent of the difference can be controlled, for example, by adjusting the shape of the through holes 3 of the polymer film 1, in particular by adjusting the opening diameters and the above-described ratio a/b of the through holes 3.

The polymer film 1 may be subjected to a coloring treatment. Depending on the type of the material composing the polymer film 1, the polymer film 1 not subjected to any coloring treatment is, for example, transparent or white.

The coloring treatment can be accomplished, for example, by dyeing the polymer film 1 or incorporating a colorant into the polymer film 1. The coloring treatment may be performed, for example, so as to enable absorption of light in the wavelength range of 380 nm to 500 nm. That is, the polymer film 1 may be subjected to a coloring treatment that enables the polymer film 1 to absorb light in the wavelength range of 380 nm to 500 nm. To this end, for example, the polymer film 1 contains a colorant having the ability to absorb light in the wavelength range of 380 nm to 500 nm or is dyed with a dye having the ability to absorb light in the wavelength range of 380 nm to 500 nm. In this case, the polymer film 1 can be colored blue, gray, brown, pink, green, or yellow, for example. The polymer film 1 may be colored black, gray, brown, or pink. The polymer film 1 may be colored white depending on its application.

The polymer film 1 can optionally contain an additional material. Examples of this material include the colorant described above, carbon black, and titanium oxide particles.

The polymer film 1 can optionally have an additional layer placed on the surface thereof, such as over the entirety of at least one principal surface or on a portion of the at least one principal surface.

The polymer film 1 can be used in various applications, such as in a waterproof sound-permeable membrane, in a waterproof gas-permeable membrane, in a suction sheet, and in an optical film. These applications can take advantage of the characteristic shape of the through holes 3.

The method for producing the polymer film 1 is not particularly limited. For example, the polymer film 1 can be produced by the production method which will hereinafter be described.

[Method for Producing Polymer Film]

In the production method described hereinafter, the polymer film 1 is formed by ion beam irradiation and subsequent chemical etching of an original film. The polymer film 1 formed by the ion beam irradiation and chemical etching may be used per se, may be used after being subjected to various treatments such as a liquid-repellent treatment and coloring treatment, or may be used after being processed into a predetermined shape or being laminated to another layer.

The method employing the ion beam irradiation and subsequent chemical etching allows the opening diameters of the through holes 3 at each of the principal surfaces 2a and 2b of the polymer film 1 to be uniform to a preferred extent as described above.

The original film is a non-porous polymer film having no through-thickness passage in its portion that is to be used as the polymer film 1 after the ion beam irradiation and chemical etching. The original film may be an imperforate (solid) film.

When the original film is irradiated with an ion beam, the polymer chains constituting the polymer film are bombarded with and damaged by ions in those portions of the film through which the ions pass. The damaged polymer chains are more susceptible to chemical etching than the other polymer chains not bombarded with the ions. Chemical etching of the ion beam-irradiated original film thus results in a polymer film having minute holes (through holes) extending along the tracks of the bombarding ions. That is, the directions of the central axes 4 of the through holes 3 coincide with the directions in which the ions have passed through the original film during the ion beam irradiation. In general, those portions of the original film through which no ions have passed have no minute holes formed therein.

Thus, the process for forming the polymer film 1 from the original film according to the production method of the present disclosure includes the steps of (I) irradiating the original film with an ion beam; and (II) chemically etching at least part of the ion-bombarded portions of the ion beam-irradiated original film to form through holes 3 extending along the tracks of the bombarding ions (ion tracks) in the film. In the step (II), a masking layer is placed on one principal surface of the ion-irradiated original film to perform the chemical etching in such a manner that the extent of the etching of the ion-bombarded portions starting from the other principal surface is greater than the extent of the etching of the ion-bombarded portions starting from the one principal surface. In this chemical etching, the extent of the etching of the ion tracks starting from the other principal surface is greater than the extent of the etching of the ion tracks starting from the one principal surface having the masking layer placed thereon. Such non-uniform etching, in particular etching in which the rate of etching starting from one principal surface of the ion-irradiated original film and the rate of etching starting from the other principal surface are different, is capable of forming the through holes 3 having a shape in which the area of the cross-section 5 perpendicular to the direction of the central axis 4 increases from the one principal surface 2a of the polymer film 1 toward the other principal surface 2b. In the techniques disclosed in Patent Literature 3, 4, and 6, etching of the original film subjected to ion beam irradiation eventually progresses uniformly from both principal surfaces of the original film, and thus the resulting film has through holes having a cross-section whose shape is constant in the thickness direction of the film.

Hereinafter, the steps (I) and (II) will be described in more detail.

(Step (I))

In the step (I), an original film is irradiated with an ion beam. The ion beam is composed of accelerated ions. The irradiation with the ion beam causes the original film to be bombarded with the ions in the beam.

Figure 7:
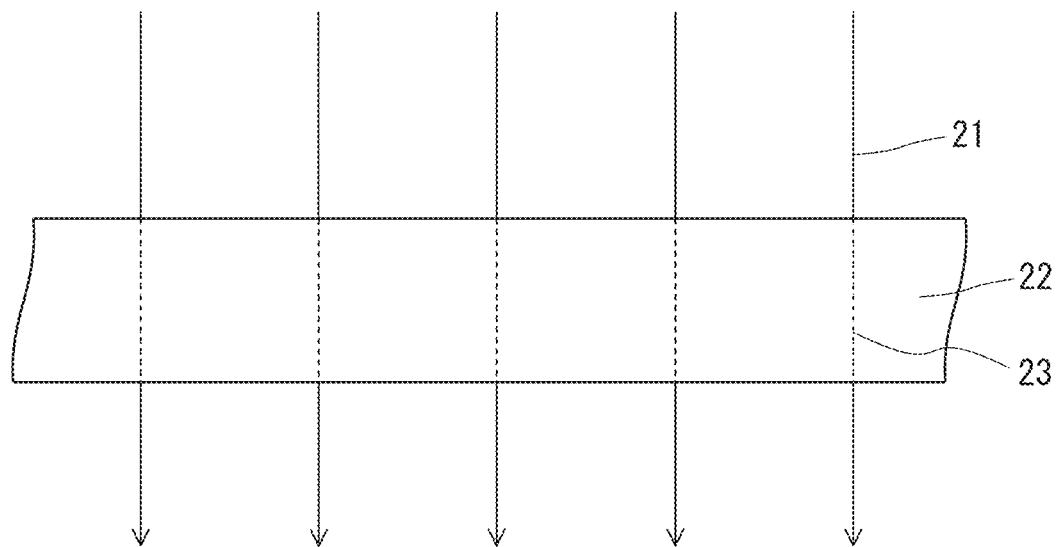
FIG. 7 is a schematic diagram for illustrating the overview of ion beam irradiation in a method for forming the polymer film of the present invention by employing the ion beam irradiation and the subsequent chemical etching.

FIG. 7 illustrates the irradiation of the original film with the ion beam. Ions 21 in the beam collide with an original film 22, and the ions 21 having bombarded the film 22 leave tracks 23 (ion tracks) within the film 22. When viewed on the size scale of the original film 22 to be irradiated, the ions 21 bombard the original film 22 typically along a substantially straight line, thus forming the tracks 23 extending substantially straight in the film 22. In general, the ions 21 penetrate through the original film 22.

The method for irradiating the original film 22 with the ion beam is not limited. For example, the original film 22 is placed in a chamber, the internal pressure of the chamber is reduced (for example, a high vacuum atmosphere is created in the chamber to prevent energy attenuation of the ions 21), and then the ions 21 are emitted from a beamline to irradiate the original film 22. A particular gas may be introduced into the chamber. Alternatively, the original film 22 placed in the chamber may be subjected to ion beam irradiation, for example, at atmospheric pressure without reduction in the internal pressure of the chamber.

It is also conceivable to prepare a roll on which the original film 22 in the form of a long sheet is wound and continuously irradiate the original film 22 with the ion beam while feeding the original film 22 from the roll. This allows efficient formation of the polymer film 1. It is also conceivable to dispose the roll (feed roll) and a take-up roll for winding up the ion-beam-irradiated original film 22 in the chamber described above, create an appropriate atmosphere such as a reduced-pressure or high vacuum atmosphere in the chamber, then continuously irradiate the original film 22 in the form of a long sheet with the ion beam while feeding the film from the feed roll, and then wind the beam-irradiated original film 22 on the take-up roll.

The resin composing the original film 22 is identical to the resin composing the polymer film 1 and is, for example, at least one selected from PET, polycarbonate, polyimide, polyethylene naphthalate, and polyvinylidene fluoride. The original film 22 composed of at least one of these resins is characterized in that chemical etching progresses smoothly in those portions of the film which have been bombarded with the ions 21, while chemical etching progresses slowly in the other portions of the film. This allows easier control of chemical etching of those portions of the original film 22 which correspond to the tracks 23. Thus, for example, the use of such an original film 22 makes easier the control of the shape of the through holes 3 of the polymer film 1.

The original film 22 may be composed of two or more resins and may contain a material different from resins, as long as the polymer film 1 can be formed through the steps (I) and (II). Examples of the material include: additives such as a light stabilizer and an antioxidant; oligomer components derived from resin materials; and metal oxides (such as white pigments, including alumina and titanium oxide).

The thickness of the original film 22 is, for example, 5 to 100 μm. In general, the thickness of the original film 22 remains unchanged before and after the ion beam irradiation in the step (I).

The original film 22 to be irradiated with the ion beam is, for example, an imperforate film. In this case, the polymer film 1 having no holes other than the through holes 3 formed by the steps (I) and (II) can be obtained as long as an additional step of forming holes in the film other than the steps (I) and (II) is not performed. When the additional step is performed, the resulting polymer film 1 has the through holes 3 formed by the steps (I) and (II) and holes formed by the additional step.

The type of the ions 21 with which the original film 22 is irradiated and bombarded is not limited. In terms of preventing chemical reaction with the resin composing the original film 22, the ions preferably include ions having a larger mass number than neon, specifically at least one selected from argon ions, krypton ions, and xenon ions.

The energy (acceleration energy) of the ions 21 is typically 100 to 1000 MeV. When the original film 22 used is a polyester film having a thickness of about 5 to 100 μm and the ions 21 are argon ions, the energy of the ions 21 is preferably 100 to 600 MeV. The energy of the ions 21 to be applied to the original film 22 can be adjusted depending on the type of the ions and on the type of the resin composing the original film 22.

The ion source of the ions 21 to be applied to the original film 22 is not limited. For example, the ions 21 emitted from the ion source are accelerated by an ion accelerator, then passed through a beamline, and applied to the original film 22. The ion accelerator is, for example, a cyclotron, a specific example of which is AVF cyclotron.

The pressure in the beamline serving as a path of the ions 21 is preferably a high vacuum pressure of about $10^{-5}$ to $10^{-3}$ Pa, in terms of preventing the energy attenuation of the ions 21 in the beamline. When the pressure in the chamber enclosing the original film 22 to be irradiated with the ions 21 does not reach a high vacuum pressure, a partition wall permeable to the ions 21 may be used to maintain the pressure difference between the beamline and the chamber. The partition wall is made up of, for example, a titanium membrane or aluminum membrane.

The ions 21 are applied to the original film 22, for example, in a perpendicular direction to the principal surfaces of the film. The irradiation in the example shown in FIG. 7 is performed in this manner. In this case, the tracks 23 extend perpendicular to the principal surfaces of the original film 22; thus, the subsequent chemical etching results in the polymer film 1 as shown in FIG. 1 which has through holes 3 formed to have a central axis 4 extending in the perpendicular direction to the principal surfaces. The ions 21 may be applied to the original film 22 in a direction oblique to the principal surfaces of the film. In this case, the subsequent chemical etching results in the polymer film 1 as shown in FIG. 2 which has through holes 3 formed to have a central axis 4 extending in an oblique direction with respect to the perpendicular direction to the principal surfaces. The direction of the ions 21 applied to the original film 22 can be controlled by known means. The angle θ1 shown in FIG. 2 can be controlled, for example, by adjusting the incident angle of the ion beam to the original film 22.

The ions 21 are applied to the original film 22, for example, in such a manner that the trajectories of the ions 21 are parallel to each other. The irradiation in the example shown in FIG. 7 is performed in this manner. In this case, the subsequent chemical etching results in the polymer film 1 as shown in FIG. 1 or 2 which has through holes 3 extending parallel to each other.

The ions 21 may be applied to the original film 22 in such a manner that the trajectories of the ions 21 are non-parallel to each other (random with respect to each other, for example). This results in, for example, the polymer film 1 as shown in any of FIGS. 3 to 6. Specifically, for example, a possible method for forming the polymer film 1 as shown in any of FIGS. 3 to 6 is to apply the ion beam to the original film 22 in an oblique direction with respect to the perpendicular direction to the principal surfaces of the original film 22 while changing the oblique direction continuously or stepwise. Since the ion beam is composed of ions traveling parallel to each other, the polymer film 1 typically has a set of through holes 3 extending in the same direction (there are typically two or more through holes 3 extending in the same direction in the polymer film 1).

Figure 8:
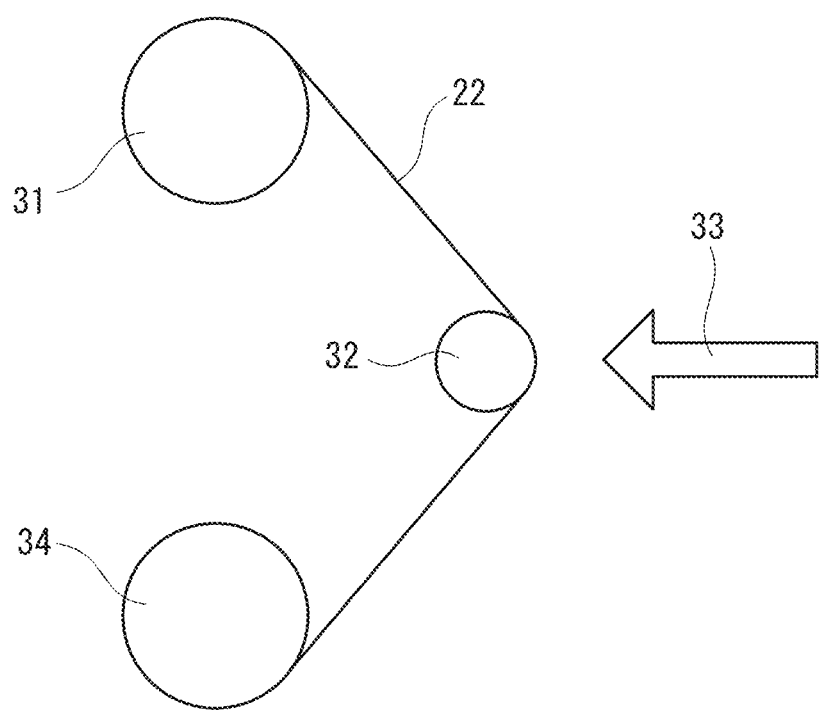
FIG. 8 is a schematic diagram for illustrating an example of ion beam irradiation in a method for forming the polymer film of the present invention by employing the ion beam irradiation and the subsequent chemical etching.

FIG. 8 shows an example of the method in which the oblique direction is changed continuously or stepwise. In the example shown in FIG. 8, the original film 22 in the form of a long sheet is fed from a feed roll 31, passed through an irradiation roll 32 with a predetermined curvature, and irradiated with an ion beam 33 while moving on the roll 32, after which the irradiated original film 22 is wound on a take-up roll 34. During this process, the ions 21 in the ion beam 33 travel parallel to each other and reach the original film 22 successively. Thus, the angle (incident angle θ1) at which the ion beam collides with the principal surface of original film 22 varies with the movement of the original film 22 on the irradiation roll 32. Continuous emission of the ion beam 33 allows continuous change of the oblique direction, while intermittent emission of the ion beam 33 allows stepwise change of the oblique direction. Such control can be considered as control based on ion beam emission timing. The properties (for example, angle θ1) of the tracks 23 to be formed in the original film 22 can be controlled by adjusting the cross-sectional shape of the ion beam 33 and the cross-sectional area of the beamline of the ion beam 33 formed on the area of the irradiation target surface of the original film 22.

The hole density of the polymer film 1 can be controlled by the conditions of the irradiation of the original film 22 with the ion beam (such as the type of the ions, the energy of the ions, and the density of the bombarding ions (irradiation density)).

The ions 21 may be emitted from two or more beamlines to irradiate the original film 22.

The step (I) may be performed in the presence of a masking layer on a principal surface, such as the one principal surface defined above, of the original film 22.

(Step (II))

The original film 22 irradiated with the ion beam in the step (I) has portions bombarded with the ions 21 and, in the step (II), at least part of the ion-bombarded portions are chemically etched to form the through holes 3 extending along the tracks 23 of the bombarding ions 21 in the film. The polymer film 1 thus obtained is basically identical to the original film 22 yet to be subjected to the ion beam irradiation except for the presence of the through holes 3, as long as another step of modifying the state of the film is not performed.

In the step (II), the chemical etching is performed in the presence of a masking layer on one principal surface of the ion beam-irradiated original film 22. In this chemical etching of those portions of the original film 22 which have been bombarded with the ions 21, the extent of etching starting from the other principal surface is greater than the extent of etching starting from the one principal surface having the masking layer thereon. That is, in the step (II), the chemical etching of those portions of the original film 22 which have been bombarded with the ions 21 is performed in such a manner that the etching starting from one principal surface of the film and the etching starting from the other principal surface progress in a non-uniform fashion (such etching may be referred to as "non-uniform etching"). Saying that "the extent of etching is great" specifically means, for example, that the amount of etching of the ion-bombarded portions per unit time is large, that is, the rate of etching of the portions is high.

In the step (II), a masking layer more resistant to chemical etching than those portions of the original film 22 which have been bombarded with the ions 21 may be placed on one principal surface of the original film 22 to perform the chemical etching in which the etching of the portions starting from the other principal surface of the original film 22 is allowed to progress while the etching of the portions starting from the one principal surface is inhibited. Such etching can be accomplished, for example, by appropriately selecting the type and thickness of the masking layer, the manner of placement of the masking layer, and the etching conditions.

The type of the masking layer is not particularly limited. The masking layer is preferably a layer composed of a material more resistant to chemical etching than those portions of the original film 22 which have been bombarded with the ions 21. Saying that a material is "resistant to etching" specifically means, for example, that the amount of the material etched per unit time is small, that is, the rate at which the material is etched is low. Whether or not a material is resistant to chemical etching can be determined on the basis of the conditions (such as the type of the etching solution, the etching temperature, and the etching time) of the non-uniform etching to be actually performed in the step (II). When, in the step (II), a plurality of non-uniform etching operations are performed as described later by changing the type of the masking layer and/or alternating the surface on which the layer is placed, the type of the masking layer can be determined on the basis of the conditions of each etching operation.

The masking layer may be more susceptible or more resistant to chemical etching than those portions of the original film 22 which have not been bombarded with the ions 21. The masking layer is preferably more resistant to chemical etching than such portions. In this case, for example, the thickness required of the masking layer used in the non-uniform etching can be decreased.

When the original film 22 with a masking layer thereon is irradiated with the ion beam in the step (I), ion tracks are formed also in the masking layer. Given this, the material composing the masking layer is preferably a material having polymer chains resistant to damage by ion beam irradiation.

The masking layer is composed of, for example, at least one selected from polyolefin, polystyrene, polyvinyl chloride, polyvinyl alcohol, and a metal foil. These materials are resistant to chemical etching as well as being resistant to damage by ion beam irradiation.

The masking layer should be placed on at least a portion of one principal surface of the original film 22, the portion corresponding to the area to be subjected to the non-uniform etching. It should be understood that the masking layer can be placed over the entirety of one principal surface of the original film 22 where necessary.

The method for placing the masking layer on the principal surface of the original film 22 is not limited as long as the masking layer is not separated from the principal surface during the non-uniform etching. The masking layer is placed on the principal surface of the original film 22, for example, by means of an adhesive. That is, in the step (II), the chemical etching described above (non-uniform etching) may be performed in the presence of the masking layer bonded to the one principal surface by means of an adhesive. It is relatively easy to dispose the masking layer by means of an adhesive. Appropriately selecting the type of the adhesive makes it easy to separate the masking layer from the original film 22 after the non-uniform etching.

In the step (II), a plurality of non-uniform etching operations may be performed. Uniform etching in which etching of the tracks 23 is allowed to progress uniformly from both principal surfaces of the original film 22 may be performed, as long as at least one non-uniform etching operation is performed. For example, the masking layer may be separated from the polymer film 1 in the course of the etching to switch the mode of etching from the non-uniform etching to the uniform etching. Alternatively, the masking layer may be placed after the end of the uniform etching to subsequently perform the non-uniform etching.

When a plurality of non-uniform etching operations are performed, the etching conditions may be changed for each etching operation.

Figure 9:
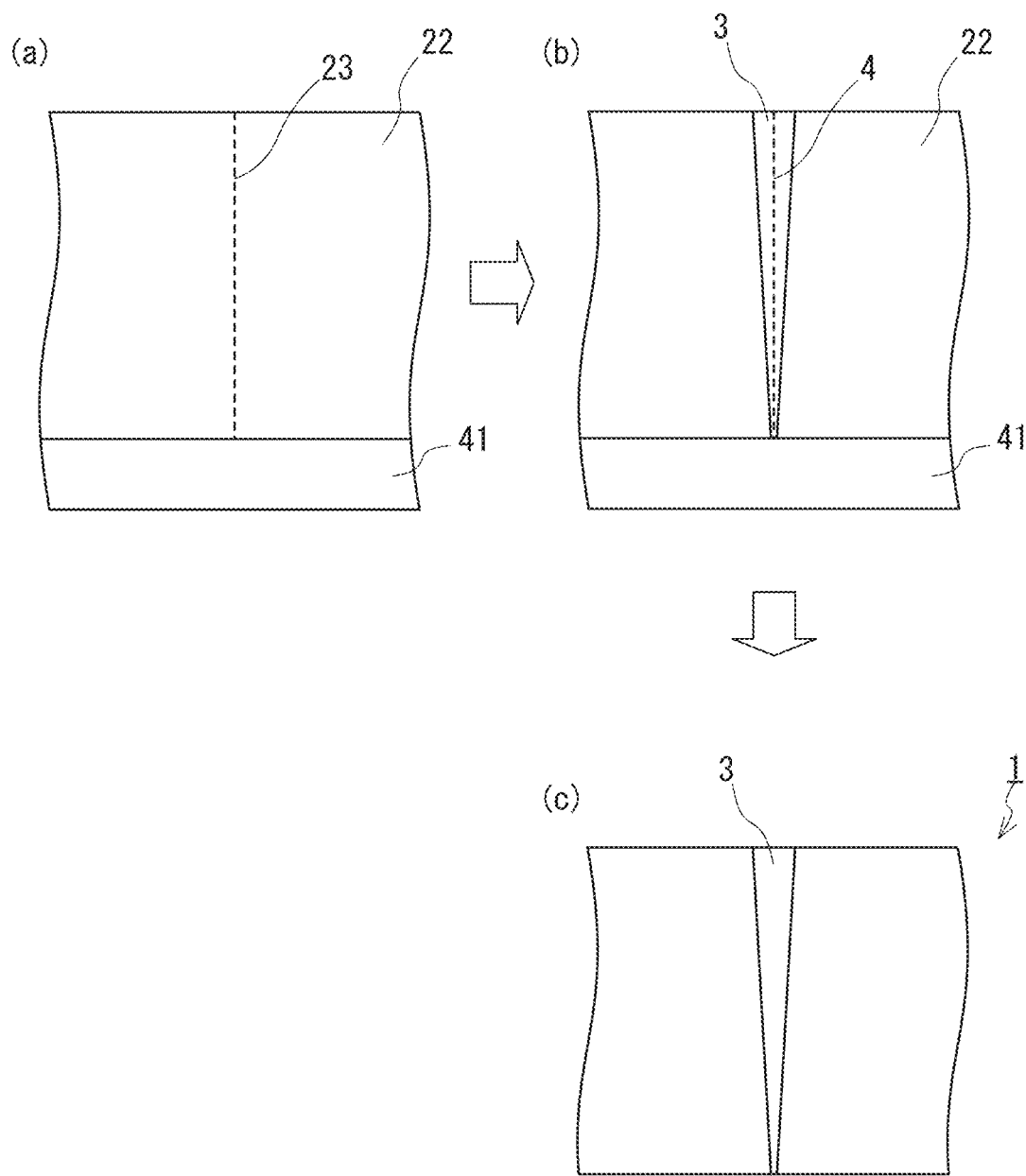
FIG. 9 shows process diagrams (a) to (c) schematically showing an example of how chemical etching progresses in a method for forming the polymer film of the present invention by employing ion beam irradiation and the subsequent chemical etching.

FIG. 9 illustrates an example of the step (II).

In the example illustrated in FIG. 9, a masking layer 41 is placed on one principal surface of the ion beam-irradiated original film 22 (see (a)), and the chemical etching is performed in this state. This allows the etching to progress from the other surface with no masking layer thereon along the track 23 formed by the ion beam irradiation, thus resulting in the formation of a through hole 3 extending along the track 23 (see (b)). As shown in (b), the etching does not progress from the one principal surface with the masking layer 41 thereon. The cross-section of the formed through hole 3 is in the shape of a cone, and the tip of the through hole 3 opens at the one principal surface of the original film 22. The opening diameter of the through hole 3 at the one principal surface and the opening diameter of the through hole 3 at the other principal surface are different from each other, and the opening diameter at the other principal surface from which the etching has progressed is larger. That is, in the example illustrated in FIG. 9, the resulting polymer film 1 has the through hole 3 formed to have a conical cross-section and have different opening diameters at the two principal surfaces of the film (see (c)). The ratio a/b of the opening diameter a of the through hole 3 at the one principal surface to the opening diameter b of the through hole 3 at the other principal surface is 80% or is less than 80%, for example. This ratio can be further reduced by adjusting the conditions of the etching performed in the step (II).

In the step (II), as described above, the through hole 3 having a diameter varying in the thickness direction of the film can be formed. The direction of the central axis 4 of the through hole 3 coincides with the direction of the track 23.

In the example illustrated in FIG. 9, one non-uniform etching operation has been completed. The chemical etching may be allowed to further progress from the state shown in (c) of FIG. 9 where the masking layer 41 has been separated.

By doing so, for example, the opening diameters of the through hole 3, or the ratio a/b of the opening diameter a of the through hole 3 at the one principal surface to the opening diameter b of the through hole 3 at the other principal surface, can be controlled.

The opening diameters of the through hole 3 can also be controlled, for example, by adjusting the etching conditions such as the etching temperature, the etching time, and the composition of the etching solution.

Any conventional method is not capable of forming the polymer film 1 having the through hole 3.

The etching solution used in the chemical etching is not particularly limited. The etching solution is, for example, an alkaline solution, an acidic solution, or an alkaline or acidic solution to which has been added at least one selected from an oxidant, an organic solvent, and a surfactant. The alkaline solution is, for example, a solution (typically an aqueous solution) containing a base such as sodium hydroxide or potassium hydroxide. The acidic solution is, for example, a solution (typically an aqueous solution) containing an acid such as nitric acid or sulfuric acid. The oxidant is, for example, potassium dichromate, potassium permanganate, or sodium hypochlorite. The organic solvent is, for example, methanol, ethanol, 2-propanol, ethylene glycol, amino alcohol, N-methylpyrrolidone, or N,N-dimethylformamide. The surfactant is, for example, an alkylbenzene sulfonate or an alkyl sulfate.

The specific etching technique employed may be the same as any of known techniques, except that the non-uniform etching is performed using the masking layer 41. For example, the beam-irradiated original film 22 with the masking layer 41 thereon may be immersed in the etching solution at a predetermined temperature for a predetermined time.

The etching temperature is, for example, 40 to 150° C., and the etching time is, for example, 10 seconds to 60 minutes.

A part or the entirety of the masking layer 41 may be allowed to remain on the polymer film 1 after the step (II) where necessary. The masking layer 41 remaining on the polymer film 1 can be used, for example, as an indicator for differentiating between the one principal surface (the principal surface with the masking layer thereon) and the other principal surface of the polymer film 1.

The method for producing the polymer film 1 may further include an optional step other than the steps (I) and (II). Examples of the optional step include the liquid-repellent treatment and coloring treatment described above.

The polymer film 1 can be used in various applications. The following will describe examples of the applications of the polymer film 1 and specific embodiments of the polymer film 1 in each application.

Embodiment 1: Waterproof Sound-Permeable Membrane (Waterproof Sound-Permeable Membrane)

An example of the applications of the polymer film 1 is the use in a waterproof sound-permeable membrane. The waterproof sound-permeable membrane has both waterproofness and sound permeability and is used, for example, in an electronic device that has a housing enclosing an audio part and having an opening in proximity to the audio part. The waterproof sound-permeable membrane is placed over the opening to prevent entry of water into the housing from the outside through the opening while permitting transmission of sound between the audio part and the outside of the electronic device. In recent years, there is a demand for a waterproof sound-permeable membrane whose sound permeability and waterproofness can be controlled with high flexibility. For example, if a waterproof sound-permeable membrane has high levels of both sound permeability and waterproofness which are conflicting properties, specifically if a waterproof sound-permeable membrane has high sound permeability and at the same time can achieve high waterproofness, the waterproof sound-permeable membrane provides an increase in flexibility in the design of an electronic device, in particular a portable information terminal. The use of the polymer film 1 of the present invention makes it possible to obtain a waterproof sound-permeable membrane whose sound permeability and waterproofness can be controlled with higher flexibility than those of conventional waterproof sound-permeable membranes.

Figure 10:
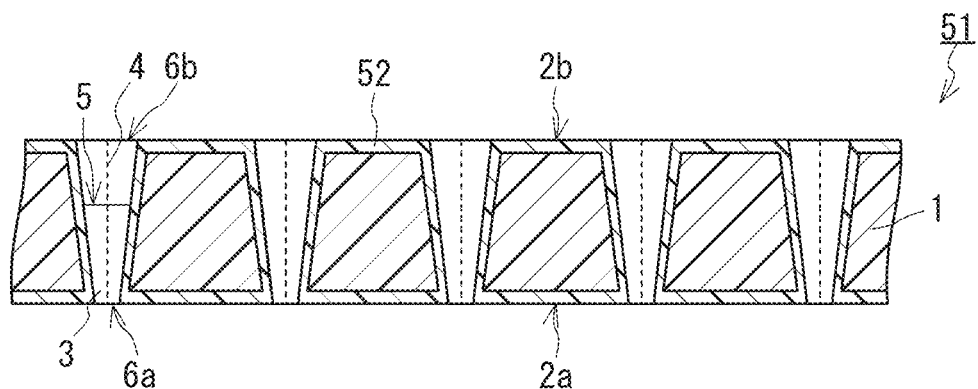
FIG. 10 is a cross-sectional view schematically showing an example of the waterproof sound-permeable membrane of the present invention.

FIG. 10 shows an example of a waterproof sound-permeable membrane including a polymer film 1 (the waterproof sound-permeable membrane of the present invention). The waterproof sound-permeable membrane 51 shown in FIG. 10 includes the polymer film 1 and a liquid-repellent layer 52 formed on the principal surfaces of the polymer film 1. The polymer film 1 shown in FIG. 10 is identical to the polymer film 1 shown in FIG. 1. Specifically, the polymer film 1 has through holes 3 extending from one principal surface 2a of the film 1 to the other principal surface 2b. The through holes 3 are straight holes having a central axis (axial line) 4 extending straight, and have a shape in which the area of a cross-section 5 perpendicular to the direction of the central axis 4 increases from the one principal surface 2a of the polymer film 1 toward the other principal surface 2b. The diameter (opening diameter) a of openings 6a of the through holes 3 at the one principal surface 2a is 12.0 μm or less. The gas permeability from the other principal surface 2b of the waterproof sound-permeable membrane 51 to the principal surface 2a is 2.0 $cm^3/(cm^2 \cdot second)$ or more and 80 $cm^3/(cm^2 \cdot second)$ or less, as expressed in terms of Frazier number measured according to JIS L 1096.

The liquid-repellent layer 52 is formed also on the surfaces of the through holes 3 (the surfaces of the film 1 inside the through holes 3). The liquid-repellent layer 52 formed on the principal surfaces of the polymer film 1 has openings positioned in register with the through holes 3 of the film 1 (positioned in register with the openings 6a and 6b).

Sound entering the waterproof sound-permeable membrane 51 is transmitted through the through holes 3 serving as gas passages of the polymer film 1 or transmitted by vibration of the waterproof sound-permeable membrane 51 itself.

The waterproof sound-permeable membrane 51 differs from the waterproof sound-permeable membrane disclosed in Patent Literature 3 (JP 2012-195928 A) at least in the shape of the through holes. Specifically, the through holes of the waterproof sound-permeable membrane of Patent Literature 3 are "straight holes extending straight through the resin film and having a constant cross-sectional shape" (paragraph [0014]), while the through holes 3 of the waterproof sound-permeable membrane 51 of FIG. 10, albeit being straight holes having a central axis extending straight, have a shape in which the area of the cross-section 5 perpendicular to the direction of the central axis 4 increases from the one principal surface 2a of the film 1 toward the other principal surface 2b. In the waterproof sound-permeable membrane 51, since the through holes 3 have such a shape, the opening diameter a of the through holes 3 at the one principal surface 2a of the film 1 is not equal to the opening diameter b of the through holes 3 at the other principal surface 2b. For example, the opening diameter a corresponds to 80% or less of the opening diameter b.

At least by virtue of such a shape of the through holes 3, the waterproof sound-permeable membrane 51 allows higher flexibility in control of sound permeability and waterproofness than conventional waterproof sound-permeable membranes. For example, the waterproof sound-permeable membrane of Patent Literature 1 has a membranous structure composed of a huge number of fine PTFE fibrils formed by stretching and a huge number of pores formed between the fibrils by stretching, and the pores are three-dimensionally distributed over the entire sound-permeable membrane and are continuous with each other. Thus, the size and shape of the pores of the waterproof sound-permeable membrane of Patent Literature 1 vary so widely in the membrane that it is difficult to allow high flexibility in control of sound permeability and waterproofness, in particular to achieve high levels of both sound permeability and waterproofness. By contrast, the polymer film 1 constituting the waterproof sound-permeable membrane 51 is a non-porous film having no through-thickness gas passages other than the through holes which are straight holes, and the size and shape of the through holes serving as gas passages are more uniform, in addition to which the shape, the opening diameters, and the above-described ratio a/b of the through holes 3 can be varied by adjusting the conditions of the above-described production of the polymer film 1. Thus, the waterproof sound-permeable membrane 51 allows higher flexibility in control of sound permeability and waterproofness than waterproof sound-permeable membranes in the form of a stretched porous membrane, and can, for example, have high levels of both sound permeability and waterproofness.

When compared with the waterproof sound-permeable membrane of Patent Literature 3 which has through holes extending through a resin film and having a constant cross-sectional shape, the waterproof sound-permeable membrane 51 allows increased flexibility in control of sound permeability and waterproofness thanks to the changing shape of the cross-section 5 of each through hole 3 and to the difference between the diameters of the openings 6a and 6b at the principal surfaces 2a and 2b of the polymer film 1. In a specific, typical example, the waterproofness for the prevention of water penetration from the principal surface 2a having the openings 6a with a smaller diameter is higher than the waterproofness for the prevention of water penetration from the principal surface 2b having the openings 6b with a larger diameter, and the sound permeability for sound entering the principal surface 2b is better than the sound permeability for sound entering the principal surface 2a. That is, the waterproof sound-permeable membrane 51 has waterproofness and sound permeability that are anisotropic between the principal surfaces (between the front and back sides), and such anisotropy contributes to the high flexibility in control of sound permeability and waterproofness of the waterproof sound-permeable membrane. In addition, the fact that the shape, the opening diameters, and the above-described ratio a/b of the through holes 3 can be varied by adjusting the conditions of production of the polymer film 1 helps to enhance the flexibility. The waterproof sound-permeable membrane 51 can be, for example, a waterproof sound-permeable membrane including the polymer film 1 having the through holes 3 having the cross-section 5 the area of which increases continuously from the principal surface 2a toward the principal surface 2b, and can also be a waterproof sound-permeable membrane in which the increase rate of the area is constant or substantially constant.

The ratio a/b of the diameter of the opening 6a (opening diameter a) to the diameter of the opening 6b (opening diameter b) in each through holes 3 is, for example, 80% or less, and is preferably 75% or less and more preferably 70% or less in terms of enhancing the flexibility in control of sound permeability and waterproofness. The lower limit of the ratio a/b is not particularly defined and is, for example, 10%.

The diameter (opening diameter a) of the openings 6a, which are the smaller openings, is 12.0 µm or less. If the opening diameter a is more than 12.0 µm, the waterproof sound-permeable membrane fails to have sufficient waterproofness. The opening diameter a is preferably 1.0 µm or more in terms of enhancing the flexibility in control of sound permeability and waterproofness, particularly in terms of achieving high levels of both waterproofness and sound permeability and in terms of obtaining good sound permeability even when the waterproof sound-permeable membrane 51 has a reduced effective area. That is, the opening diameter a is preferably 1.0 µm or more and 12.0 µm or less. If the opening diameter a is excessively small, the waterproof sound-permeable membrane 51 may fail to have sufficient sound permeability, particularly when the waterproof sound-permeable membrane 51 has a reduced effective area. The opening diameter a is more preferably 2.0 µm or more and 10.0 µm or less and even more preferably 3.0 µm or more and 8.0 µm or less.

The diameter (opening diameter b) of the openings 6b, which are the larger openings, is not limited and may be any value greater than the opening diameter a. The opening diameter b is preferably 4.0 µm or more and 20.0 µm or less, more preferably 5.0 µm or more and 15.0 µm or less, and even more preferably 6.0 µm or more and 13.0 µm or less. When the opening diameter b is in such a range, the flexibility in control of sound permeability and waterproofness is enhanced. Specifically, it is possible to achieve high levels of both waterproofness and sound permeability as well as to obtain good sound permeability even when the waterproof sound-permeable membrane 51 has a reduced effective area.

The opening diameters of the through holes 3 at each principal surface of the polymer film 1 need not be exactly equal for all of the openings lying at the principal surface. However, it is preferable for the openings in the effective portion of the polymer film 1 (the portion that can be used as the waterproof sound-permeable membrane 51) to have such uniform diameters that the diameters can be considered substantially equal (e.g., the standard deviation is 10% or less of the average). The above-described method for producing the polymer film 1 is capable of forming the waterproof sound-permeable membrane 51 in which the diameters of the openings at each principal surface are uniform. In the waterproof sound-permeable membrane 51, the opening diameter a and/or opening diameter b of all of the through holes 3 in the effective portion can be within the range(s) specified above.

The density of distribution of the through holes 3 (hole density) in the polymer film 1 is not particularly limited and is, for example, $1 \times 10^3$ holes/cm$^2$ or more and $1 \times 10^9$ holes/cm$^2$ or less. When the hole density is in this range, the sound permeability and waterproofness of the waterproof sound-permeable membrane 51 can easily be controlled within preferred ranges. The hole density is more preferably $1 \times 10^5$ holes/cm$^2$ or more and $1 \times 10^8$ holes/cm$^2$ or less. The hole density need not be exactly constant over the entirety of the polymer film 1. The hole density in the effective portion of the polymer film 1 is preferably so uniform that the maximum value of the hole density is equal to or less than 1.5 times the minimum value of the hole density.

The opening area ratio of the principal surface $2a$ of the polymer film 1 (the ratio of the sum of the areas of the openings $6a$ to the area of the principal surface) is preferably 50% or less, more preferably 10% or more and 45% or less, and even more preferably 20% or more and 40% or less. When the opening area ratio is in such a range, the sound permeability and waterproofness of the waterproof sound-permeable membrane 51 can easily be controlled within preferred ranges. By adjusting the gas permeability of the waterproof sound-permeable membrane 51 to the range specified above in addition to adjusting the ratio of the areas of the openings $6a$ in the principal surface $2a$ and the opening diameter a to the above preferred ranges, good sound permeability (good properties of sound transmitted through the waterproof sound-permeable membrane) can be obtained even when the waterproof sound-permeable membrane 51 has a reduced effective area. Any stretched porous membrane having a structure in which a huge number of pores formed by stretching are distributed cannot be formed as a waterproof sound-permeable membrane having such a low porosity that is achieved in the polymer film 1.

The waterproof sound-permeable membrane 51 has a gas permeability in the thickness direction from the principal surface $2b$ to the principal surface $2a$, the gas permeability being 2.0 $cm^3/(cm^2 \cdot second)$ or more and 80 $cm^3/(cm^2 \cdot second)$ or less as expressed in terms of Frazier number measured according to JIS L 1096 (simply referred to as "Frazier number" hereinafter). Given that the liquid-repellent layer 52 has almost no influence on the gas permeability, the gas permeability of the polymer film 1 from the principal surface $2b$ to the principal surface $2a$ can be 2.0 $cm^3/(cm^2 \cdot second)$ or more and 80 $cm^3/(cm^2 \cdot second)$ or less as expressed in terms of the Frazier number. It is necessary that the gas permeability from the principal surface $2b$ to the principal surface $2a$ be in this range as well as that the opening diameter a of the through holes 3 be 12.0 μm or less, in order for the waterproof sound-permeable membrane 51 to allow high flexibility in control of sound permeability and waterproofness. If the gas permeability as expressed in terms of the Frazier number is less than 2.0 $cm^3/(cm^2 \cdot second)$, the flexibility in control of waterproofness and sound permeability of the waterproof sound-permeable membrane will be reduced and, in particular, it becomes difficult to obtain sufficient sound permeability when the waterproof sound-permeable membrane has a reduced effective area. If the gas permeability is more than 80 $cm^3/(cm^2 \cdot second)$, the waterproof sound-permeable membrane may have an increased risk of suffering from water entry from the outside, depending on the opening area ratio of the waterproof sound-permeable membrane. The gas permeability from the principal surface $2b$ to the principal surface $2a$ is preferably 5.0 $cm^3/(cm^2 \cdot second)$ or more and 60 $cm^3/(cm^2 \cdot second)$ or less and more preferably 10 $cm^3/(cm^2 \cdot second)$ or more and 50 $cm^3/(cm^2 \cdot second)$ or less, as expressed in terms of the Frazier number.

The polymer film 1 included in the waterproof sound-permeable membrane of the present invention can have any structure, as long as the opening diameter a is 12.0 μm or less and the gas permeability from the other principal surface $2b$ to the one principal surface $2a$ is in the range specified above as expressed in terms of the Frazier number, and the waterproof sound-permeable membrane of the present invention can include any of the polymer films 1 of the present invention such as those shown in FIGS. 2 to 6.

For example, when the waterproof sound-permeable membrane 51 includes the polymer film 1 as shown in FIG. 3 which has through holes 3 extending in different oblique directions, the flexibility in control of sound permeability and waterproofness of the waterproof sound-permeable membrane 51 is enhanced since the oblique angles and the proportion of the through holes 3 extending in each direction can be varied.

When the through holes 3 extend obliquely to the perpendicular direction to the principal surfaces of the polymer film 1 as in the films 1 shown in FIGS. 2 and 3, the angle θ1 formed by the oblique direction D1 with the direction D2 perpendicular to the principal surfaces of the polymer film 1 is preferably 45° or less and more preferably 30° or less. When the angle θ1 is in such a range, the waterproof sound-permeable membrane 51 can have higher levels of both sound permeability and waterproofness. The lower limit of the angle θ1 is not particularly defined, and the angle θ1 is, for example, 10° or more and preferably 20° or more. If the angle θ1 is excessively large, the mechanical strength of the waterproof sound-permeable membrane 51 tends to decrease.

When the waterproof sound-permeable membrane 1 including the polymer film 51 having through holes 3 extending in different oblique directions is viewed in a perpendicular direction to a principal surface of the polymer film 1 (when the directions in which the through holes 3 extend are projected on the principal surface), the directions in which the through holes 3 extend may be parallel to each other or, preferably, the polymer film 1 may have a set of through holes 3 for which the projected directions are different from each other (there are preferably through holes 3 for which the projected directions are different from each other in the polymer film 1). In the latter case, such as when the waterproof sound-permeable membrane 51 includes the polymer film 1 shown in FIG. 5, the waterproof sound-permeable membrane 51 can have higher levels of both sound permeability and waterproofness. In this case, the polymer film 1 preferably has a set of a through hole $3k$ extending from a principal surface of the film in one direction D6 and a through hole $3m$ extending from the principal surface extending in another direction D8 forming an angle θ2 of 90° or more with the direction D6 when the film is viewed in the perpendicular direction to the principal surface. This allows the waterproof sound-permeable membrane 51 to have even higher levels of both sound permeability and waterproofness.

In the waterproof sound-permeable membrane 51 including the polymer film 1 having through holes 3 extending in different oblique directions, two or more of the through holes 3 may cross each other in the polymer film 1 (see FIG. 6). This allows the waterproof sound-permeable membrane 51 to have even higher levels of both sound permeability and waterproofness.

The waterproof sound-permeable membrane 51 may be subjected to a liquid-repellent treatment. In the waterproof sound-permeable membrane 51 subjected to a liquid-repellent treatment, the liquid-repellent layer 52 is formed on at least a portion of the surfaces of the polymer film 1. In the example shown in FIG. 10, the liquid-repellent layer 52 is formed on both of the principal surfaces $2a$ and $2b$ of the polymer film 1 and on the surfaces of the through holes 3. The liquid-repellent layer 52 may be formed only on one of the principal surfaces of the polymer film 1 or may be formed only on one of the principal surfaces and on the surfaces of the through holes 3. It is preferable that the liquid-repellent layer 52 be formed on the principal surface 2a having the openings 6a with a smaller diameter.

The liquid-repellent layer 52 is a water-repellent layer and preferably further has oil repellency. The liquid-repellent layer 52 has openings positioned in register with the through holes 3 of the polymer film 1.

The thickness of the polymer film 1 included in the waterproof sound-permeable membrane 51 is, for example, 5 μm or more and 100 μm or less and preferably 15 μm or more and 50 μm or less.

The waterproof sound-permeable membrane 51 may include two or more polymer films 1. Such a waterproof sound-permeable membrane 51 can be formed, for example, by ion beam irradiation and chemical etching of a stack of two or more original films.

The waterproof sound-permeable membrane 51 is placed, for example, to cover an opening of a housing of an electronic device, and prevents entry of water into the housing from the outside through the opening while permitting transmission of sound between the outside and inside of the housing. In a specific example, the electronic device has an audio part including a sound emitter such as a speaker and/or a sound receiver such as a microphone, the housing is provided with an opening (opening portion) for permitting transmission of sound to/from the audio part, and the waterproof sound-permeable membrane 51 is placed to cover the opening (sound transmission port) so that the membrane prevents entry of water into the electronic device through the opening while permitting transmission of sound between the outside of the electronic device and the audio part.

The water entry pressure measured for the waterproof sound-permeable membrane 51 according to Method B (high hydraulic pressure method) of water penetration test specified in JIS L 1092 is preferably 3 kPa or more, more preferably 5 kPa or more, even more preferably 10 kPa or more, and still even more preferably 15 kPa or more. If the water entry pressure is 10 kPa, this means that the waterproof sound-permeable membrane 51 is capable of withstanding the water pressure at a water depth of 1 m and thus providing waterproofness corresponding to "the degree of protection against water 7 (IPX-7)" as specified in JIS C 0920. An electronic device rated as IPX-7 can avoid entry of water into the device even when accidentally dropped into water, insofar as the water depth and the duration of submergence fall within given limits. It has been empirically found that waterproofness corresponding to "the degree of protection against water 4 (IPX-4)" as specified in JIS C 0920 is provided when the above water entry pressure is around 5 kPa. IPX-4 is also one of the degrees of waterproofness that has recently been required of electronic devices. When the water entry pressure measured for the waterproof sound-permeable membrane 51 is 5 kPa or more or 10 kPa or more, both waterproofness corresponding to IPX-4 or IPX-7 and high sound permeability can be achieved, and it is thus possible to obtain an electronic device that allows high flexibility in visual appearance and design, such as an electronic device that is less restricted in terms of the space required for the opening for the audio part and that can be reduced in size and/or thickness.

In the waterproof sound-permeable membrane 51, there is a difference between the diameter of the openings a of the through holes 3 at the one principal surface 2a of the polymer film 1 constituting the membrane 51 and the diameter of the openings 6b of the through holes 3 at the other principal surface 2b of the polymer film 1. Thus, when the waterproofness is evaluated, for example, by the above water entry pressure, the waterproofness against water penetration from the one principal surface 2a of the polymer film 1 to the other principal surface 2b and the waterproofness against water penetration from the other principal surface 2b to the principal surface 2a are different from each other. Specifically, the waterproofness against water penetration from the principal surface 2a at which the opening diameter of the through holes 3 is smaller is higher than the waterproofness against water penetration from the principal surface 2b at which the opening diameter is larger. The waterproofness against water penetration from the principal surface 2a, at which the opening diameter of the through holes 3 is smaller, is preferably such that the water entry pressure is in the preferred range specified above. In addition, the difference between the water entry pressure measured for the principal surface 2a of the waterproof sound-permeable membrane 51 and the water entry pressure measured for the principal surface 2b of the waterproof sound-permeable membrane 51 is preferably 5 kPa or more and more preferably 10 kPa or more. Such a difference in waterproofness produced by the difference between the principal surfaces 2a and 2b in the waterproof sound-permeable membrane 51 can be controlled by adjusting the shape of the through holes 3 of the polymer film 1, in particular by adjusting the opening diameters and the above-described ratio a/b of the through holes 3. When the waterproof sound-permeable membrane 51 has two or more polymer films 1, the difference in waterproofness can be controlled by adjusting how each polymer film 1 is configured and how the two or more polymer films 1 are stacked (for example, toward which of the principal surfaces of the waterproof sound-permeable membrane 51 the principal surfaces 2a and 2b of each of the stacked polymer films 1 face). The fact that such control is possible contributes to the high flexibility in control of waterproofness of the waterproof sound-permeable membrane 51.

Due to the high flexibility in control of sound permeability of the waterproof sound-permeable membrane 51, the maximum sound pressure loss in the frequency range of 100 Hz to 3 kHz can be 5 dB or less, 3 dB or less, or even 1 dB or less. The frequencies ranging from 100 Hz to 3 kHz are those that humans use in their usual vocalization and conversation and correspond to those that humans can perceive most sensitively when music or the like is played back. The small sound pressure loss in this frequency range enhances the market appeal of an electronic device including the waterproof sound-transmitting membrane 51. The maximum sound pressure loss caused by a waterproof sound-permeable membrane in the frequency range of 100 Hz to 3 kHz is typically observed at a high frequency of 2.5 kHz to 3 kHz. For example, the sound pressure loss caused by the waterproof sound-permeable membrane 51 at a frequency of 1 kHz, which is considered a median in the frequency range of human voice, can be 5 dB or less, 3 dB or less, or even 1 dB or less.

The waterproof sound-permeable membrane 51 is allowed to have sufficient gas permeability, for example, by adjusting the through holes 3 even when the effective area of the waterproof sound-permeable membrane 51 is reduced. For example, the effective area of the waterproof sound-permeable membrane 51 may be 4.9 mm$^2$ or less. The advantageous feature of allowing a reduction in the effective area contributes to, for example, an increase in the flexibility in the visual appearance and design of an electronic device including the waterproof sound-permeable membrane 51, in particular to a reduction in size and/or thickness of the electronic device. The effective area of the waterproof sound-permeable membrane 51 refers to the area of a portion (effective portion) of the membrane through which, when the membrane is placed to cover an opening of a housing, sound actually enters, travels in, and exits the membrane. For example, the effective area does not include the area of a supporting member or a bonding portion placed or formed on the edge region of the waterproof sound-permeable membrane 51 for placement of the membrane. The effective area can typically be equal to the area of the opening over which the membrane is placed. In the case of a waterproof sound-permeable member in which a supporting member is placed on the edge region of the waterproof sound-permeable membrane, the effective area can typically be equal to the area of an opening portion of the supporting member.

For example, when the effective area of the waterproof sound-permeable membrane 51 is 4.9 mm$^2$ (when the membrane is, for example, in the shape of a circle with a diameter of 2.5 mm), the maximum sound pressure loss in the frequency range of 100 Hz to 3 kHz can be 5 dB or less, 3 dB or less, or even 1 dB or less.

The smaller the effective area of a waterproof sound-permeable membrane is, the lower the sound permeability of the membrane is, and, for example, the greater the sound pressure loss is. For the waterproof sound-permeable membrane 51, however, the maximum sound pressure loss in the frequency range of 100 Hz to 3 kHz can be 10 dB or less or even 5 dB or less even when the effective area of the waterproof sound-permeable membrane 51 is, for example, 0.8 mm$^2$ or less (when the membrane is, for example, in the shape of a circle with a diameter of 1 mm).

It should be understood that high levels of both sound permeability and waterproofness of the waterproof sound-permeable membrane 51 can be achieved not only when the effective area of the waterproof sound-permeable membrane 51 is small but also the effective area is large. However, the waterproof sound-permeable membrane 51 is particularly advantageous when a waterproof sound-permeable membrane having a small effective area is, or must be, used.

In the waterproof sound-permeable membrane 51, there is a difference between the diameter of the openings 6a of the through holes 3 at the one principal surface 2a of the polymer film 1 constituting the membrane 51 and the diameter of the openings 6b of the through holes 3 at the other principal surface 2b of the polymer film 1. Thus, when the sound permeability is evaluated, for example, by the amount of the above sound pressure loss, the sound permeability from the one principal surface 2a of the polymer film 1 to the other principal surface 2b and the sound permeability from the other principal surface 2b to the one principal surface 2a are different from each other. Specifically, the sound permeability from the other principal surface 2b at which the opening diameter of the through holes 3 is larger is better than the sound permeability from the one principal surface 2a at which the opening diameter is smaller. The sound permeability from the principal surface 2b, at which the opening diameter of the through holes 3 is larger, is preferably such that the (maximum) sound pressure loss has a value as specified above. Such a difference in sound permeability produced by the difference between the principal surfaces 2a and 2b in the waterproof sound-permeable membrane 51 can be controlled by adjusting the shape of the through holes 3 of the polymer film 1, in particular by adjusting the opening diameters and the above-described ratio a/b of the through holes 3. The fact that such control is possible contributes to the high flexibility in control of sound permeability of the waterproof sound-permeable membrane 51.

The waterproof sound-permeable membrane 51 can yield the preferred sound pressure loss and the preferred water entry pressure together.

Figure 11:
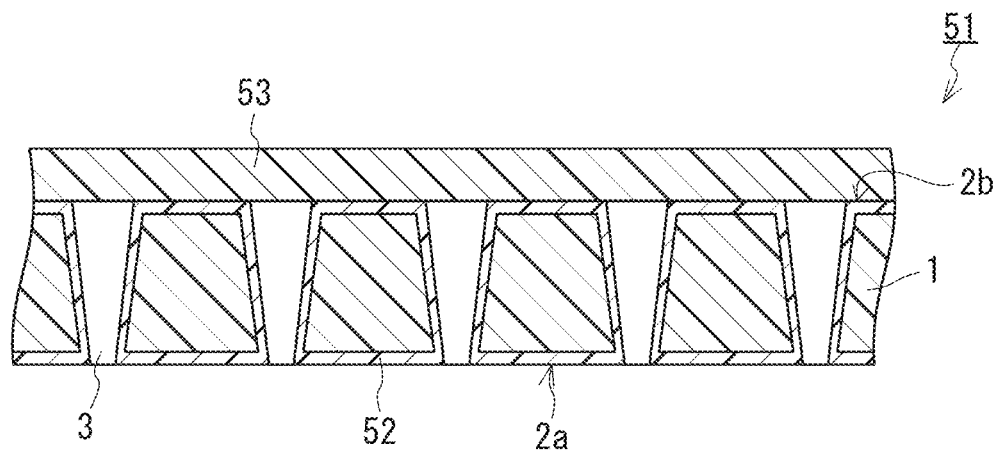
FIG. 11 is a cross-sectional view schematically showing another example of the waterproof sound-permeable membrane of the present invention.

The waterproof sound-permeable membrane 51 may include any member and/or layer other than the polymer film 1 and liquid-repellent layer 52 where necessary. The member is, for example, a sound-permeable supporting layer 53 shown in FIG. 11. In the waterproof sound-permeable membrane 51 shown in FIG. 11, the sound-permeable supporting layer 53 is placed on the other principal surface 2b of the polymer film 1 of the waterproof sound-permeable membrane 51 as shown in FIG. 10. The placement of the sound-permeable supporting layer 53 improves the strength and handling properties of the waterproof sound-permeable membrane 51. The sound-permeable supporting layer 53 may be placed on the one principal surface 2a of the polymer film 1 or on both of the principal surfaces 2a and 2b.

The sound-permeable supporting layer 53 has a higher gas permeability in the thickness direction than the polymer film 1. The sound-permeable supporting layer 53 used can be, for example, a woven fabric, non-woven fabric, net, or mesh. Examples of the material composing the sound-permeable supporting layer 53 include polyester, polyethylene, and aramid resin. The liquid-repellent layer 52 may or may not be formed on that principal surface of the polymer film 1 on which the sound-permeable supporting layer 53 is to be placed. The shape of the sound-permeable supporting layer 53 may be the same as or different from the shape of the polymer film 1. For example, the sound-permeable supporting layer 53 can have a shape adapted for placement only to the edge region of the polymer film 1 (particularly a ring shape adapted for placement only to the edge region of the polymer film that is circular). The sound-permeable supporting layer 53 is placed, for example, by a technique such as thermal welding, or bonding by an adhesive, to the polymer film 1.

The surface density of the waterproof sound-permeable membrane 51 is preferably 5 to 100 g/m$^2$ and more preferably 10 to 50 g/m$^2$ in terms of the strength, handling properties, and sound permeability of the membrane. When a stretched porous membrane as disclosed in Patent Literature 1 which has a structure in which a huge number of pores formed by stretching are distributed is used as a waterproof sound-permeable membrane, the surface density of the membrane needs to be reduced to achieve sufficient sound permeability. However, the porous membrane having a smaller surface density is inferior in strength and in handling properties including production yield and attachment accuracy. Also in this respect, the waterproof sound-transmitting membrane 51 is advantageous.

The thickness of the waterproof sound-permeable membrane 51 is, for example, 5 to 100 μm and preferably 15 to 50 μm.

The waterproof sound-permeable membrane 51 may be subjected to a coloring treatment. Depending on the type of the material composing the polymer film 1, the waterproof sound-permeable membrane 51 not subjected to any coloring treatment is, for example, transparent or white. Such a waterproof sound-permeable membrane 51 may be conspicuous when the membrane 51 is placed to cover an opening of a housing. Such a conspicuous membrane may so stimulate the curiosity of a user as to induce the user to stab the membrane with a needle or the like, thereby impairing the function of the membrane as a waterproof sound-permeable membrane. When the waterproof sound-permeable membrane 51 has been subjected to a coloring treatment so that, for example, the membrane 51 has a color identical or similar to the color of the housing, the possibility of attracting the user's attention can be relatively reduced. In some cases, a colored waterproof sound-permeable membrane is required in view of the visual appearance of a housing of an electronic device or the like. Such a requirement as to visual appearance can be met by means of the coloring treatment.

The coloring treatment can be carried out, for example, by dyeing the polymer film 1 or by incorporating a colorant into the polymer film 1. The coloring treatment may be carried out, for example, so as to enable absorption of light in the wavelength range of 380 nm to 500 nm. That is, the waterproof sound-permeable membrane 51 may be subjected to a coloring treatment that enables the waterproof sound-permeable membrane 51 to absorb light in the wavelength range of 380 nm to 500 nm. To this end, for example, the polymer film 1 contains a colorant having the ability to absorb light in the wavelength range of 380 nm to 500 nm or is dyed with a dye having the ability to absorb light in the wavelength range of 380 nm to 500 nm. In this case, the waterproof sound-permeable membrane 51 can be colored blue, gray, brown, pink, green, yellow, or the like. The waterproof sound-permeable membrane 51 may be colored black, gray, brown, or pink by a coloring treatment.

The waterproof sound-permeable membrane 51 can be used in various applications, such as in a waterproof sound-permeable member, in an electronic device, in an electronic device case, and in a waterproof sound transmission structure.

The method for producing the waterproof sound-permeable membrane 51 constituted by the polymer film 1 having the through holes 3 is not particularly limited.

The method for producing the polymer film 1 is as described above. The polymer film 1 obtained by the method may be used per se as the waterproof sound-permeable membrane 51, or may be subjected to an additional step such as a step of liquid-repellent treatment, coloring treatment, or stacking of the sound-permeable supporting layer 53, and then the resulting membrane may be used as the waterproof sound-permeable membrane 51.

(Waterproof Sound-Permeable Member)

Figure 12:
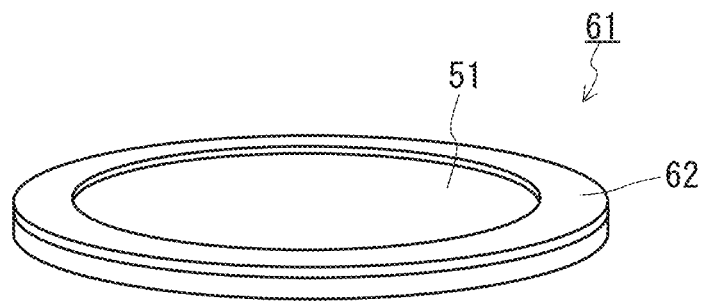
FIG. 12 is a perspective view schematically showing an example of the waterproof sound-permeable member of the present invention.

An example of the waterproof sound-permeable member of the present invention which includes the waterproof sound-permeable membrane 51 is shown in FIG. 12. The waterproof sound-permeable member 61 shown in FIG. 12 includes: the waterproof sound-permeable membrane 51 that is circular when viewed in a perpendicular direction to the principal surfaces of the membrane; and a supporting member 62 that is a ring-shaped sheet joined to the edge region of the membrane 51. Joining the supporting member 62 to the waterproof sound-permeable membrane 51 reinforces the waterproof sound-permeable membrane 51 and improves its handling properties. Additionally, when the waterproof sound-permeable member 61 is placed to an object such as an opening of a housing, the supporting member 62 can serve as a portion attached to the object and thus can make easier the attachment of the waterproof sound-permeable membrane 51.

Figure 13:
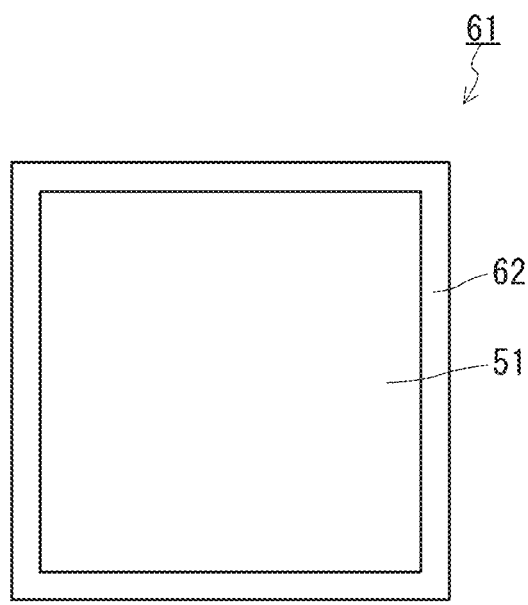
FIG. 13 is a plan view schematically showing another example of the waterproof sound-permeable member of the present invention.

The shape of the supporting member 62 is not limited. For example, as shown in FIG. 13, the supporting member 62 may be a frame-shaped sheet joined to the edge region of the waterproof sound-permeable membrane 51 that is rectangular when viewed in a perpendicular direction to the principal surfaces of the membrane. Conforming the shape of the supporting member 62 to the shape of the edge region of the waterproof sound-permeable membrane 51 as shown in FIGS. 12 and 13 reduces the deterioration in sound permeability of the waterproof sound-permeable membrane 51 caused by the placement of the supporting member 62. It is preferable for the supporting member 62 to be in the form of a sheet, in terms of improving the handling properties of the waterproof gas-permeable member 61 and the ease of placement of the member 61 to a housing, particularly the ease of placement inside the housing.

Examples of the material composing the supporting member 62 include resins, metals, and composites thereof. Examples of the resins include: polyolefins such as polyethylene and polypropylene; polyesters such as PET and polycarbonate; polyimides; and composites of these resins. Examples of the metals include metals having high corrosion resistance such as stainless steel and aluminum.

The thickness of the supporting member 62 is, for example, 5 to 500 μm and preferably 25 to 200 μm. In particular, in view of its function as the portion for attachment, the ring width (flame width: the difference between the outer size and inner size) is suitably about 0.5 to 2 mm. A foamed material made of any of the resins mentioned above may be used as the supporting member 62.

The method for joining the waterproof sound-permeable membrane 51 and the supporting member 62 together is not particularly limited. Examples of methods that can be employed include thermal welding, ultrasonic welding, bonding by an adhesive, and bonding by a double-sided tape.

The orientation of the waterproof sound-permeable membrane 51 in the waterproof sound-permeable member 61 (the direction in which each principal surface of the polymer film 1 included in the waterproof sound-permeable membrane 51 faces) is not limited. For example, the waterproof sound-permeable membrane 51 and the supporting member 62 may be joined together in such a manner that when the waterproof sound-permeable member 61 is fixedly attached to an opening of a housing, the principal surface 2a (the principal surface 2a at which the opening diameter of the through holes 3 is smaller) of the polymer film 1 faces the outside of the housing which may suffer from entry of water. This provides higher waterproofness of the housing and higher sound permeability for sound transmission from the interior of the housing.

The waterproof sound-permeable member 61 may include two or more waterproof sound-permeable membranes 51 and/or two or more supporting members 62.

The waterproof sound-permeable member 61 can be used in the same applications as conventional waterproof sound-permeable members.

(Electronic Device)

Figure 14A:
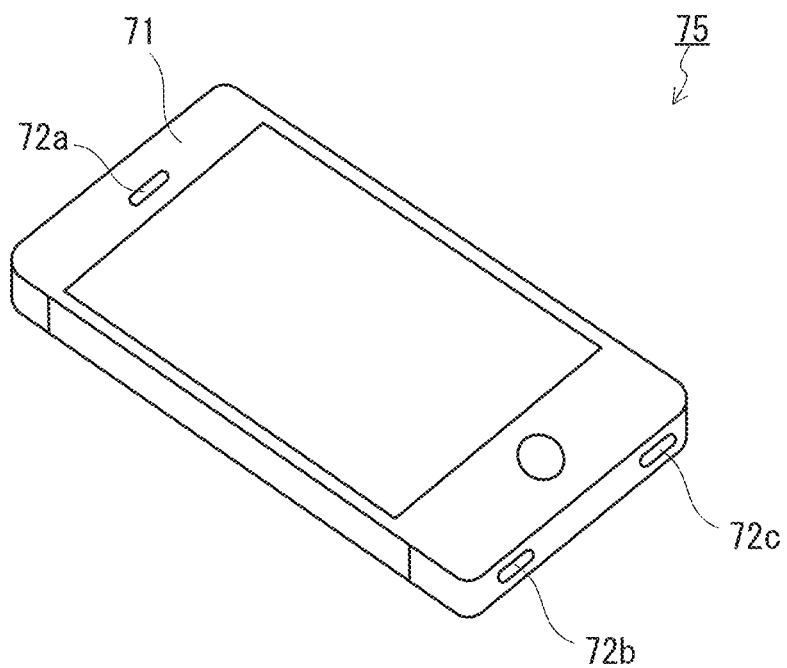
FIG. 14A is a perspective view schematically showing an example of the electronic device of the present invention.
Figure 14B:
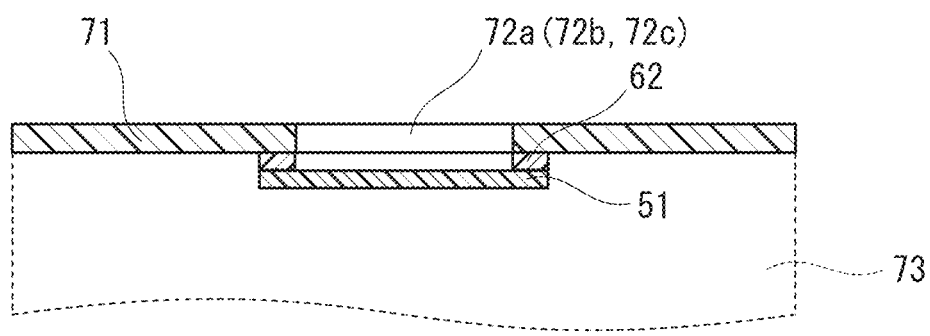
FIG. 14B is a cross-sectional view schematically showing an example of how a waterproof sound-permeable membrane is placed in the electronic device of the present invention.

An example of the electronic device of the present invention which includes a waterproof sound-permeable membrane is shown in FIG. 14A. The electronic device shown in FIG. 14A is a smartphone which is a type of mobile phone. A housing 71 of the smartphone 75 has an opening 72a provided in proximity to a transducer which is a type of sound emitting-receiving device, an opening 72b provided in proximity to a microphone which is a type of sound receiver, and an opening 72c provided in proximity to a speaker which is a type of sound emitter. Sound is transmitted through the openings 72a to 72c between the outside of the smartphone 75 and the audio parts (the transducer, microphone, and speaker) enclosed in the housing 71. In the smartphone 75, as shown in FIG. 14B, the waterproof sound-permeable membranes 51 are attached inside the housing 71 to cover these openings 72a to 72c. This makes it possible to prevent water from entering the housing 71 from the outside of the smartphone 75 through the openings while permitting transmission of sound between the outside of the smartphone 75 and the audio parts. In addition, the use of the waterproof sound-permeable membranes 51, whose sound permeability and waterproofness can be controlled with high flexibility, can provide an increase in the the flexibility in the design and visual appearance of the smartphone 75, in particular a reduction in size and/or thickness of the smartphone 75.

The positions and method for placing the waterproof sound-permeable membranes 51 in the electronic device 75 of the present invention are not limited, as long as the openings (opening portions) provided in the housing 71 of the device 75 are covered by the waterproof sound-permeable membranes 51. In the example shown in FIG. 14B, the joining of each waterproof sound-permeable membrane 51 to the housing 71 is done via the supporting member 62 (that is, waterproof sound-permeable members are joined to the housing). For the placement of the waterproof sound-permeable membranes 51 inside the electronic device 75, techniques such as adhesion using a double-sided tape, thermal welding, high-frequency welding, and ultrasonic welding can be employed.

The orientation of each waterproof sound-permeable membrane 51 in the electronic device 75 (the direction in which each principal surface of the polymer film 1 included in the waterproof sound-permeable membrane 51 faces) is not limited. For example, each waterproof sound-permeable membrane 51 may be placed in such a manner that the principal surface 2a (the principal surface 2a at which the opening diameter of the through holes 3 is smaller) of the polymer film 1 faces the outside of the housing 71 of the electronic device 75. This provides a higher waterproofness and higher sound permeability for sound transmission from the interior of the housing 71.

The housing 71 is composed of a resin, a metal, glass, or a composite thereof. The display screen of the electronic device 75 may constitute a part of the housing 71, as in smartphones and tablet computers.

The electronic device of the present invention is not limited to the smartphone 75. Electronic devices that fall under the category of the electronic device of the present invention include all types of electronic devices that are equipped with an audio part, that have a housing provided with an opening for transmission of sound between the outside of the housing and the audio part, that require prevention of entry of water into the housing from the outside through the opening, and that allow the waterproof sound-permeable membrane 51 to be placed to cover the opening. Examples of the electronic device of the present invention include: mobile phones such as feature phones and smartphones; mobile computers such as tablet computers, wearable computers, PDAs, game consoles, and notebook computers; electronic notebooks; digital cameras; video cameras; and electronic book readers.

(Electronic Device Case)

Figure 15A:
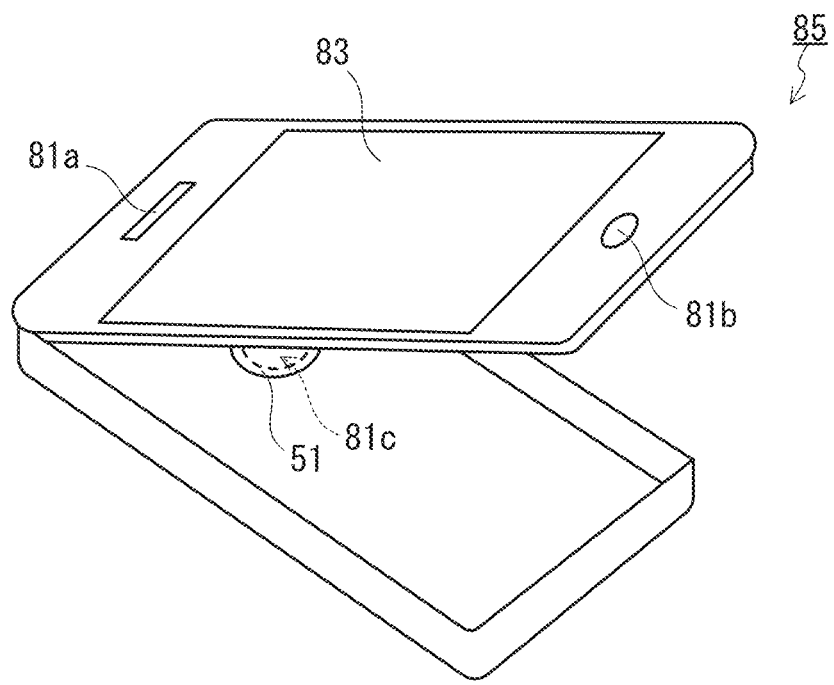
FIG. 15A is a perspective view schematically showing an example of the electronic device case of the present invention.
Figure 15B:
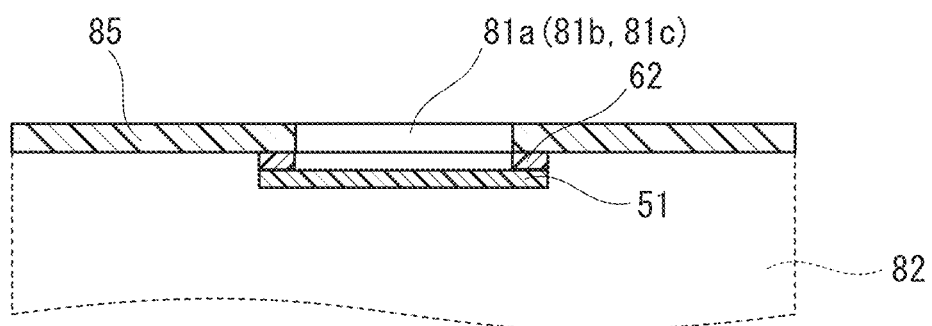
FIG. 15B is a cross-sectional view schematically showing an example of how a waterproof sound-permeable membrane is placed in the electronic device case of the present invention.

An example of the electronic device case of the present invention which includes a waterproof sound-permeable membrane is shown in FIG. 15A. The case 85 shown in FIG. 15A is provided with openings 81a to 81c for transmission of sound between audio parts of an electronic device enclosed in the case 85 and the outside of the case 85. The case 85 shown in FIG. 15A is a case for a smartphone differing in type from the smartphone 75 shown in FIG. 14A. The opening 81a is provided for transmission of sound to the voice receiver of the smartphone, the opening 81b is provided for transmission of sound to the voice transmitter of the smartphone, and the opening 81c is provided for transmission of sound from the speaker of the smartphone to the outside. As shown in FIG. 15B, the case 85 further includes the waterproof sound-permeable membrane 51 placed to cover the opening 81a (81b, 81c). This waterproof sound-permeable membrane 51 can prevent water from entering an interior 82 of the case 85, and then the electronic device enclosed in the interior 82 of the case 85, from the outside of the case 85 through the opening 81a (81b, 81c) while permitting transmission of sound between the audio parts of the electronic device and the outside. In addition, the use of the waterproof sound-permeable membrane 51, whose sound permeability and waterproofness can be controlled with high flexibility, enables the electronic device case 85 to be adapted for an electronic device that allows high flexibility in design and visual appearance and that has a reduced size and/or thickness. Furthermore, the opening 81a (81b, 81c) of the electronic device case 85 can have a small area, and this provides an increase in the flexibility in the design and visual appearance of the case 85 itself.

The method for placing the waterproof sound-permeable membrane 51 in the electronic device case 85 of the present invention is not limited, as long as the opening (opening portion) 81a (81b, 81c) is covered by the membrane 51. In the example shown in FIG. 15B, the waterproof sound-permeable membrane 51 is joined to the case 85 in the interior 82 via the supporting member 62 (that is, a waterproof sound-permeable member is joined to the case). For the placement of the waterproof sound-permeable membrane 51 to the case 85, techniques such as adhesion using a double-sided tape, thermal welding, high-frequency welding, and ultrasonic welding can be employed. The waterproof sound-permeable membrane 51 can be placed on the exterior of the case 85.

The orientation of the waterproof sound-permeable membrane 51 in the electronic device case 85 (the direction in which each principal surface of the polymer film 1 included in the waterproof sound-permeable membrane 51 faces) is not limited. For example, the waterproof sound-permeable membrane 51 may be placed in such a manner that the principal surface 2a (the principal surface 2a at which the opening diameter of the through holes 3 is smaller) of the polymer film 1 faces the outside of the case 85. This provides higher waterproofness and higher sound permeability for sound transmission from the interior of the case 85.

The electronic device case 85 is composed of a resin, a metal, glass, and a composite thereof. The electronic device case 85 may have any structure as long as the effects of the present invention are obtained. For example, the case 85 shown in FIG. 15A is a case for a smartphone and includes a film 83 that enables external operation of a touch panel of the smartphone enclosed in the case.

(Waterproof Sound Transmission Structure)

Figure 16:
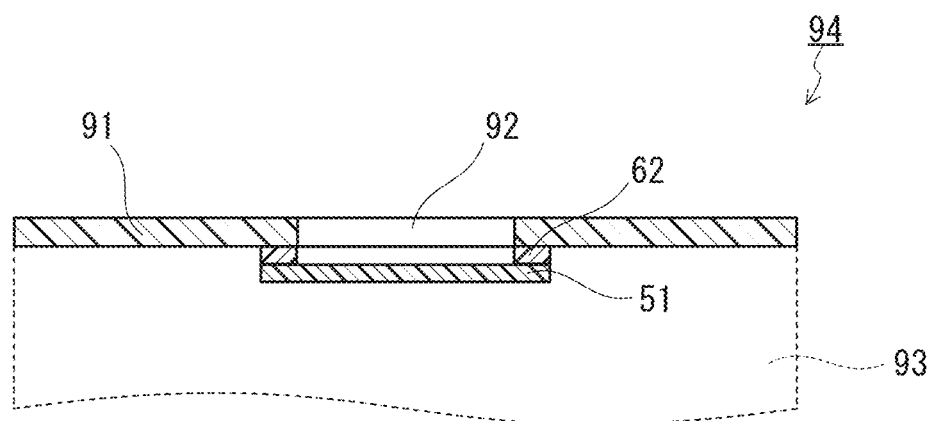
FIG. 16 is a cross-sectional view schematically showing an example of the waterproof sound transmission structure of the present invention.

An example of the waterproof sound transmission structure of the present invention which includes the waterproof sound-permeable membrane 51 is shown in FIG. 16. The waterproof sound transmission structure 94 shown in FIG. 16 includes: a housing 91 having an interior 93 and provided with an opening 92 for transmission of sound between the interior 93 and the outside of the housing 91; and the waterproof sound-permeable membrane 51 placed to cover the opening (opening portion) 92. This waterproof sound-permeable membrane 51 can prevent water from entering the housing 91 from the outside through the opening 92 while permitting transmission of sound between the outside of of the housing 91 and the interior 93. In the example shown in FIG. 16, the waterproof sound-permeable membrane 51 is joined to the housing 91 via the supporting member 62. In other words, a waterproof sound-permeable member including the waterproof sound-permeable membrane 51 and the supporting member 62 is joined to the housing 91. In the example shown in FIG. 16, the waterproof sound-permeable membrane 51 is joined to the housing 91 in the interior 93 of the housing 91. The membrane 51 may be joined to the exterior of the housing 91.

The housing 91 is composed of a resin, a metal, glass, or a composite thereof.

For the placement of the waterproof sound-permeable membrane 51, techniques such as adhesion using a double-sided tape, thermal welding, high-frequency welding, and ultrasonic welding can be employed. The supporting member 62 may be a double-sided tape.

The orientation of the waterproof sound-permeable membrane 51 in the waterproof sound transmission structure 94 (the direction in which each principal surface of the polymer film 1 included in the waterproof sound-permeable membrane 51 faces) is not limited. For example, the waterproof sound-permeable membrane 51 may be placed in such a manner that the principal surface 2a (the principal surface 2a at which the opening diameter of the through holes 3 is smaller) of the polymer film 1 faces the outside of the housing 91 of the waterproof sound transmission structure 94. This provides higher waterproofness and higher sound permeability for sound transmission from the interior of the housing 91.

The component, device, equipment, product or the like that can have the waterproof sound transmission structure 94 is not limited.

The waterproof sound transmission structure 94 can be used in various applications similarly to conventional waterproof sound transmission structures.

Embodiment 2: Waterproof Gas-Permeable Membrane (Waterproof Gas-Permeable Membrane)

Another example of the applications of the polymer film 1 is the use in a waterproof gas-permeable membrane. The waterproof gas-permeable membrane has both waterproofness and gas permeability. For example, the membrane is placed over an opening of a housing to prevent entry of water into the housing from the outside of the housing through the opening while permitting permeation of gas (typically air) between the inside and outside of the housing for maintenance of ventilation. In recent years, there is a demand for a waterproof gas-permeable membrane whose gas permeability and waterproofness can be controlled with high flexibility. For example, if a waterproof gas-permeable membrane has high levels of both gas permeability and waterproofness which are conflicting properties, specifically if a waterproof gas-permeable membrane has high gas permeability and at the same time can achieve high waterproofness, the waterproof gas-permeable membrane makes it possible to obtain required gas permeability with a reduced area for gas permeation, thereby allowing a reduction in size of a waterproof ventilation structure. This leads, for example, to an increase in the flexibility in design of an electronic device, in particular a portable information terminal. The use of the polymer film 1 of the present invention makes it possible to provide a waterproof gas-permeable membrane whose gas permeability and waterproofness can be controlled with higher flexibility than those of conventional waterproof gas-permeable membranes.

Figure 17:
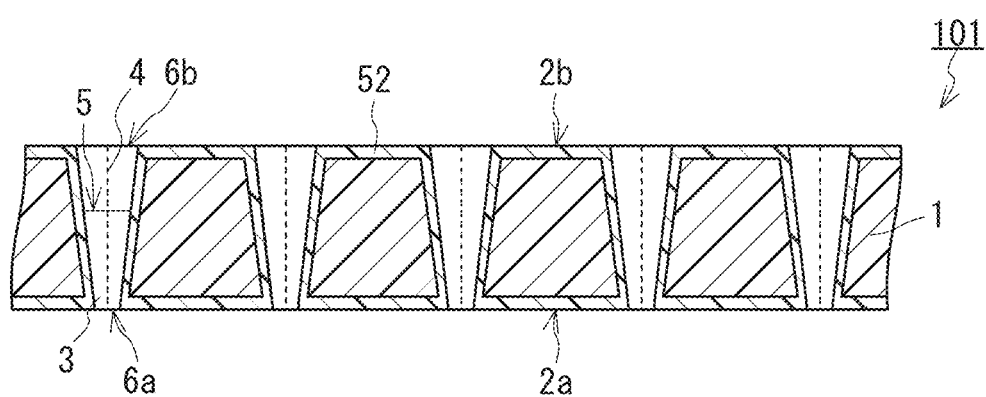
FIG. 17 is a cross-sectional view schematically showing an example of the waterproof gas-permeable membrane of the present invention.

FIG. 17 shows an example of a waterproof gas-permeable membrane including a polymer film 1 (the waterproof gas-permeable membrane of the present invention). The waterproof gas-permeable membrane 101 shown in FIG. 17 includes the polymer film 1 and a liquid-repellent layer 52 formed on the principal surfaces of the polymer film 1. The polymer film 1 shown in FIG. 17 is identical to the polymer film 1 shown in FIG. 1. Specifically, the polymer film 1 has through holes 3 extending from one principal surface 2a of the film 1 to the other principal surface 2b. The through holes 3 are straight holes having a central axis (axial line) 4 extending straight and have a shape in which the area of a cross-section 5 perpendicular to the direction of the central axis 4 increases from the one principal surface 2a of the polymer film 1 toward the other principal surface 2b. The ratio a/b of the diameter (opening diameter) a of openings 6a of the through holes 3 at the one principal surface 2a to the diameter b of openings 6b of the through holes 3 at the other principal surface 2b is 80% or less.

The liquid-repellent layer 52 is identical to the liquid-repellent layer 52 described above for the waterproof sound-permeable membrane of the present invention, and is formed also on the surfaces of the through holes 3 (the surfaces of the film 1 inside the through holes 3). The liquid-repellent layer 52 formed on the principal surfaces of the polymer film 1 has openings positioned in register with the through holes 3 of the film 1 (positioned in register with the openings 6a and 6b).

The waterproof gas-permeable membrane 101 differs from the waterproof gas-permeable membrane disclosed in Patent Literature 4 (JP 2012-20279 A) at least in the shape of the through holes. Specifically, the through holes of the waterproof gas-permeable membrane of Patent Literature 4 are "straight holes extending straight through the resin film and having a constant cross-sectional shape" (paragraph [0015]), while the through holes 3 of the waterproof gas-permeable membrane 101 of FIG. 17, albeit being straight holes having a central axis extending straight, have a shape in which the area of the cross-section 5 perpendicular to the direction of the central axis 4 increases from the one principal surface 2a of the polymer film 1 toward the other principal surface 2b. In the waterproof gas-permeable membrane 101, since the through holes 3 have such a shape, the opening diameter a of the through holes 3 at the one principal surface 2a of the polymer film 1 is not equal to the opening diameter b of the through holes 3 at the other principal surface 2b, and the opening diameter a corresponds to 80% or less of the opening diameter b.

At least by virtue of such a shape of the through holes 3, the waterproof gas-permeable membrane 101 allows higher flexibility in control of gas permeability and waterproofness than conventional waterproof gas-permeable membranes. For example, the waterproof gas-permeable membrane of Patent Literature 2 has a membranous structure composed of a huge number of fine PTFE fibrils formed by stretching and a huge number of pores formed between the fibrils by stretching, and the pores are three-dimensionally distributed over the entire gas-permeable membrane and are continuous with each other. Thus, the size and shape of the pores of the waterproof gas-permeable membrane of Patent Literature 2 vary so widely in the membrane that it is difficult to allow high flexibility in control of gas permeability and waterproofness, in particular to achieve high levels of both gas permeability and waterproofness. By contrast, the polymer film 1 constituting the waterproof gas-permeable membrane 101 is a non-porous film having no through-thickness gas passages other than the through holes which are straight holes, and the size and shape of the through holes serving as gas passages are more uniform, in addition to which the shape, the opening diameters, and the above-described ratio a/b of the through holes 3 can be varied by adjusting the conditions of the above-described production of the polymer film 1. Thus, the waterproof gas-permeable membrane 101 allows higher flexibility in control of gas permeability and waterproofness than waterproof gas-permeable membranes in the form of a stretched porous membrane, and can, for example, have high levels of both gas permeability and waterproofness.

When compared with the waterproof gas-permeable membrane of Patent Literature 4 which has through holes extending through a resin film and having a constant cross-sectional shape, the waterproof gas-permeable membrane 101 allows increased flexibility in control of gas permeability and waterproofness thanks to the changing shape of the cross-section 5 of each through hole 3 and to the difference between the diameters of the openings 6a and 6b at the principal surfaces 2a and 2b of the polymer film 1. In a specific, typical example, the waterproofness for the prevention of water penetration from the principal surface 2a having the openings 6a with a smaller diameter is higher than the waterproofness for the prevention of water penetration from the principal surface 2b having the openings 6b with a larger diameter. That is, the waterproof gas-permeable membrane 101 has waterproofness that is anisotropic between the principal surfaces (front and back sides). If the waterproof gas-permeable membrane 101 has the same opening diameter as a waterproof gas-permeable membrane that has through holes extending through a resin film and having a constant cross-sectional shape, the gas permeability of the waterproof gas-permeable membrane 101 is higher. Such anisotropy and high gas permeability contribute to the high flexibility in control of gas permeability and waterproofness of the waterproof gas-permeable membrane. In addition, the fact that the shape, the opening diameters, and the above-described ratio a/b of the through holes 3 can be varied by adjusting the conditions of production of the polymer film 1 helps to enhance the flexibility. The waterproof gas-permeable membrane 101 can be, for example, a waterproof gas-permeable membrane including the polymer film 1 having the through holes 3 having the cross-section 5 the area of which increases continuously from the principal surface 2a toward the principal surface 2b, and can also be a waterproof gas-permeable membrane in which the increase rate of the area is constant or substantially constant.

The ratio a/b of the diameter (opening diameter a) of the opening 6a to the diameter (opening diameter b) of the opening 6b in each through hole 3 is 80% or less, and is preferably 75% or less and more preferably 70% or less in terms of further enhancing the flexibility in control of gas permeability and waterproofness. The lower limit of the ratio a/b is not particularly defined and is, for example, 10%.

In terms of further enhancing the flexibility in control of gas permeability and waterproofness, particularly in terms of achieving high levels of both waterproofness and gas permeability, the diameter (opening diameter a) of the openings 6a, which are the smaller openings, is preferably 12 µm or less, more preferably 6 µm or less, and even more preferably 2 µm or less. The diameter (opening diameter b) of the openings 6b, which are the larger openings, is preferably 1 µm or more, more preferably 5 µm or more, and even more preferably 10 µm or more. The lower limits of the opening diameters a and b are not particularly defined, and are, for example, 0.01 µm. If the opening diameter a and/or opening diameter b is excessively small, the gas permeability of the waterproof gas-permeable membrane 101 will deteriorate so significantly that it will become difficult to achieve both high gas permeability and high waterproofness.

The opening diameters of the through holes 3 at each principal surface of the polymer film 1 need not be exactly equal for all of the openings lying at the principal surface. However, it is preferable for the openings in the effective portion of the polymer film 1 (the portion that can be used as the waterproof gas-permeable membrane 101) to have such uniform diameters that the diameters can be considered substantially equal (e.g., the standard deviation is 10% or less of the average). The above-described method for producing the polymer film 1 is capable of forming the waterproof gas-permeable membrane 101 in which the diameters of the openings at each principal surface are uniform. In the waterproof gas-permeable membrane 101, the opening diameter a and/or opening diameter b of all of the through holes 3 in the effective portion can be within the range(s) specified above.

The density of distribution of the through holes 3 (hole density) in the polymer film 1 is not particularly limited and is, for example, $1 \times 10^3$ holes/cm$^2$ or more and $1 \times 10^9$ holes/cm$^2$ or less. When the hole density is in this range, the gas permeability and waterproofness of the waterproof gas-permeable membrane 101 can easily be controlled within preferred ranges. The hole density is more preferably $1 \times 10^5$ holes/cm$^2$ or more and $1 \times 10^8$ holes/cm$^2$ or less. The hole density need not be exactly constant over the entirety of the polymer film 1. The hole density in the effective portion of the polymer film 1 is preferably so uniform that the maximum value of the hole density is equal to or less than 1.5 times the minimum value of the hole density.

The opening area ratio of the principal surface 2a of the polymer film 1 (the ratio of the sum of the areas of the openings 6a to the area of the principal surface) is preferably 50% or less, more preferably 10% or more and 45% or less, and even more preferably 20% or more and 40% or less. When the opening area ratio is in such a range, the gas permeability and waterproofness of the waterproof gas-permeable membrane 101 can easily be controlled within preferred ranges. Any stretched porous membrane having a structure in which a huge number of pores formed by stretching are distributed cannot be formed as a waterproof gas-permeable membrane having such a low porosity that is achieved realizes in the polymer film 1.

The polymer film 1 included in the waterproof gas-permeable membrane of the present invention can have any structure, as long as the ratio a/b of the opening diameter a of the through holes 3 at the one principal surface 2a to the opening diameter b of the through holes 3 at the other principal surface 2b is 80% or less, and the waterproof gas-permeable membrane of the present invention can include any of the polymer films 1 of the present invention such as those shown in FIGS. 2 to 6.

For example, when the waterproof gas-permeable membrane 101 includes the polymer film 1 as shown in FIG. 3 which has through holes 3 extending in different oblique directions, the flexibility in control of gas permeability and waterproofness of the waterproof gas-permeable membrane 101 is enhanced since the oblique angles and the proportion of the through holes 3 extending in each direction can be varied.

When the through holes 3 extend obliquely to the perpendicular direction to the principal surfaces of the polymer film 1 as in the films 1 shown in FIGS. 2 and 3, the angle θ1 formed by the oblique direction D1 with the direction D2 perpendicular to the principal surfaces of the polymer film 1 is preferably 45° or less and more preferably 30° or less. When the angle θ1 is in such a range, the waterproof gas-permeable membrane 101 can have higher levels of both gas permeability and waterproofness. The lower limit of the angle θ1 is not particularly defined, and the angle θ1 is, for example, 10° or more and preferably 20° or more. If the angle θ1 is excessively large, the mechanical strength of the waterproof gas-permeable membrane 101 tends to decrease.

When the waterproof gas-permeable membrane 101 including the polymer film 1 having the through holes 3 extending in different oblique directions is viewed in the perpendicular direction to a principal surface of the polymer film 1 (when the directions in which the through holes 3 extend are projected onto the principal surface), the directions in which the through holes 3 extend may be parallel to each other or, preferably, the polymer film 1 may have a set of through holes 3 for which the projected directions are different from each other (there are preferably through holes 3 for which the projected directions are different from each other in the polymer film 1). In the latter case, such as when the waterproof gas-permeable membrane 101 includes the polymer film 1 shown in FIG. 5, the waterproof gas-permeable membrane 101 can have higher levels of both gas permeability and waterproofness. In this case, the polymer film 1 preferably has a set of a through hole $3k$ extending in one direction D6 from a principal surface of the film and a through hole $3m$ extending from the principal surface in another direction D8 forming an angle θ2 of 90° or more with the direction D6 when the film is viewed in the perpendicular direction to the principal surface. This allows the waterproof gas-permeable membrane 101 to have even higher levels of both gas permeability and waterproofness.

In the waterproof gas-permeable membrane 101 including the polymer film 1 having the through holes 3 extending in different oblique directions, two or more of the through holes 3 may cross each other in the polymer film 1 (see FIG. 6). This allows the waterproof gas-permeable membrane 101 to have even higher levels of both gas permeability and waterproofness.

The waterproof gas-permeable membrane 101 may be subjected to a liquid-repellent treatment. In the waterproof gas-permeable membrane 101 subjected to a liquid-repellent treatment, the liquid-repellent layer 52 is formed on at least a portion of the surfaces of the polymer film 1. In the example shown in FIG. 17, the liquid-repellent layer 52 is formed on both of the principal surfaces $2a$ and $2b$ of the polymer film 1 and on the surfaces of the through holes 3. The liquid-repellent layer 52 may be formed only on one of the principal surfaces of the polymer film 1 or may be formed only on one of the principal surfaces and on the surfaces of the through holes 3. It is preferable that the liquid-repellent layer 52 be formed on the principal surface $2a$ having the openings $6a$ with a smaller diameter.

The liquid-repellent layer 52 is a water-repellent layer and preferably further has oil repellency. The liquid-repellent layer 52 has openings positioned in register with the through holes 3 of the polymer film 1.

The thickness of the polymer film 1 included in the waterproof gas-permeable membrane 101 is, for example, 10 μm or more and 100 μm or less and preferably 15 μm or more and 50 μm or less.

The waterproof gas-permeable membrane 101 may include two or more polymer films 1. Such a waterproof gas-permeable membrane 101 can be formed, for example, by ion beam irradiation and chemical etching of a stack of two or more original films.

It is preferable for the waterproof gas-permeable membrane 101 to have a gas permeability of 0.5 seconds/100 mL or more as expressed in terms of Gurley number measured according to JIS L 1096 (which will be simply referred to as "Gurley number" hereinafter) in the thickness direction of the waterproof gas-permeable membrane 101. Given that the liquid-repellent layer 52 has almost no influence on the gas permeability, the polymer film 1 can have a gas permeability of 0.5 seconds/100 mL or more as expressed in terms of the Gurley number in the thickness direction of the polymer film 1.

The water entry pressure measured for the waterproof gas-permeable membrane 101 according to Method B (high hydraulic pressure method) of water penetration test specified in JIS L 1092 is preferably 5 kPa or more, more preferably 10 kPa or more, and even more preferably 20 kPa or more.

In the waterproof gas-permeable membrane 101, there is a difference between the diameter of the openings a of the through holes 3 at the one principal surface $2a$ of the polymer film 1 constituting the membrane 101 and the diameter of the openings $6b$ of the through holes 3 at the other principal surface $2b$ of the polymer film 1. Thus, when the waterproofness is evaluated, for example, by the above water entry pressure, the waterproofness against water penetration from the one principal surface $2a$ of the polymer film 1 to the other principal surface $2b$ and the waterproofness against water penetration from the other principal surface $2b$ to the principal surface $2a$ are different from each other. Specifically, the waterproofness against water penetration from the principal surface $2a$ at which the opening diameter of the through holes 3 is smaller is higher than the waterproofness against water penetration from the principal surface $2b$ at which the opening diameter is larger. The waterproofness against water penetration from the principal surface $2a$, at which the opening diameter of the through holes 3 is smaller, is preferably such that the water entry pressure is 5 kPa or more. In addition, the difference between the water entry pressure measured for the principal surface $2a$ of the waterproof gas-permeable membrane 101 and the water entry pressure measured for the principal surface $2b$ of the waterproof gas-permeable membrane 101 is preferably 5 kPa or more and more preferably 10 kPa or more. Such a difference in waterproofness produced by the difference between the principal surfaces $2a$ and $2b$ in the waterproof gas-permeable membrane 101 can be controlled by adjusting the shape of the through holes 3 of the polymer film 1, in particular by adjusting the opening diameters and the above-described ratio a/b of the through holes 3. When the waterproof gas-permeable membrane 101 has two or more polymer films 1, the difference in waterproofness can be controlled by adjusting how each polymer film 1 is configured and how the two or more polymer films 1 are stacked (for example, toward which of the principal surfaces of the waterproof gas-permeable membrane 101 the principal surfaces $2a$ and $2b$ of each of the stacked polymer films 1 face). The fact that such control is possible contributes to the high flexibility in control of waterproofness of the waterproof gas-permeable membrane 101.

The waterproof gas-permeable membrane 101 can yield the preferred gas permeability and the preferred water entry pressure together.

Figure 18:
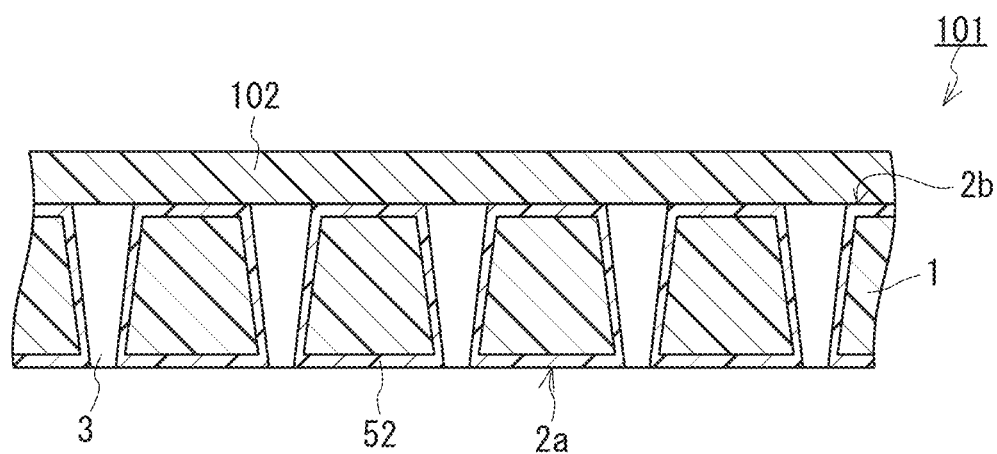
FIG. 18 is a cross-sectional view schematically showing another example of the waterproof gas-permeable membrane of the present invention.

The waterproof gas-permeable membrane 101 may include any member and/or layer other than the polymer film 1 and liquid-repellent layer 52 where necessary. The member is, for example, a gas-permeable supporting layer 102 shown in FIG. 18. In the waterproof gas-permeable membrane 101 shown in FIG. 18, the gas-permeable supporting layer 102 is placed on the other principal surface 2b of the polymer film 1 of the waterproof gas-permeable membrane 101 as shown in FIG. 17. The placement of the gas-permeable supporting layer 102 improves the strength and handling properties of the waterproof gas-permeable membrane 101. The gas-permeable supporting layer 102 may be placed on the one principal surface 2a of the polymer film 1 or on both of the principal surfaces 2a and 2b.

The gas-permeable supporting layer 102 has a higher gas permeability in the thickness direction than the polymer film 1. The gas-permeable supporting layer 102 used can be, for example, a woven fabric, non-woven fabric, net, or mesh. Examples of the material composing the gas-permeable supporting layer 102 include polyester, polyethylene, and aramid resin. The liquid-repellent layer 52 may or may not be formed on that principal surface of the polymer film 1 on which the gas-permeable supporting layer 102 is to be placed. The shape of the gas-permeable supporting layer 102 may be the same as or different from the shape of the polymer film 1. For example, the gas-permeable supporting layer 102 may have a shape adapted for placement only to the edge region of the polymer film 1 (particularly a ring shape adapted for placement only to the edge region of the polymer film that is circular). The gas-permeable supporting layer 102 is placed, for example, by a technique such as thermal welding, or bonding by an adhesive, to the polymer film 1.

The surface density of the waterproof gas-permeable membrane 101 is preferably 5 to 100 g/m$^2$ and more preferably 10 to 50 g/m$^2$ in terms of the strength and handling properties of the membrane.

The thickness of the waterproof gas-permeable membrane 101 is, for example, 10 to 100 μm and preferably 15 to 50 μm.

The waterproof gas-permeable membrane 101 may be subjected to a coloring treatment. Depending on the type of the material composing the polymer film 1, the waterproof gas-permeable membrane 101 not subjected to any coloring treatment is, for example, transparent or white. Such a waterproof gas-permeable membrane 101 may be conspicuous when the membrane 101 is placed to cover an opening of a housing. Such a conspicuous membrane may so stimulate the curiosity of a user as to induce the user to stab the membrane with a needle or the like, thereby impairing the function of the membrane as a waterproof gas-permeable membrane. When the waterproof gas-permeable membrane 101 has been subjected to a coloring treatment so that, for example, the membrane 101 has a color identical or similar to the color of the housing, the possibility of attracting the user's attention can be relatively reduced. In some cases, a colored waterproof gas-permeable membrane is required in view of the visual appearance of a housing. Such a requirement as to visual appearance can be met by means of the coloring treatment.

The coloring treatment can be carried out, for example, by dyeing the polymer film 1 or by incorporating a colorant into the polymer film 1. The coloring treatment may be carried out, for example, so as to enable absorption of light in the wavelength range of 380 nm to 500 nm. That is, the waterproof gas-permeable membrane 101 may be subjected to a coloring treatment that enables the waterproof gas-permeable membrane 101 to absorb light in the wavelength range of 380 nm to 500 nm. To this end, for example, the polymer film 1 contains a colorant having the ability to absorb light in the wavelength range of 380 nm to 500 nm or is dyed with a dye having the ability to absorb light in the wavelength range of 380 nm to 500 nm. In this case, the waterproof gas-permeable membrane 101 can be colored blue, gray, brown, pink, green, yellow, or the like. The waterproof gas-permeable membrane 101 may be colored black, gray, brown, or pink by a coloring treatment.

The waterproof gas-permeable membrane 101 can be used in various applications such as in a waterproof gas-permeable member and in a waterproof ventilation structure.

The method for producing the waterproof gas-permeable membrane 101 including the polymer film 1 having the through holes 3 is not particularly limited.

The method for producing the polymer film 1 is as described above. The polymer film 1 obtained by the method may be used per se as the waterproof gas-permeable membrane 101, or may be subjected to an additional step such as a step of liquid-repellent treatment, coloring treatment, or stacking of the gas-permeable supporting layer 102, and then the resulting membrane may be used as the waterproof gas-permeable membrane 101.

(Waterproof Gas-Permeable Member)

Figure 19:
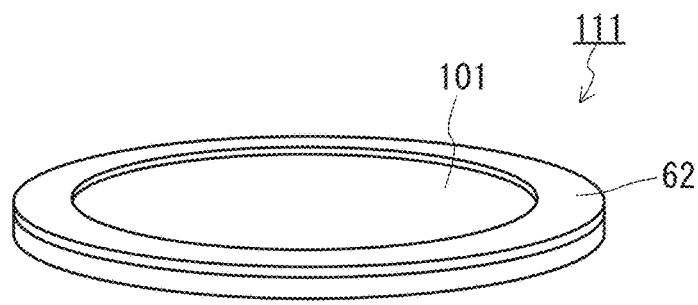
FIG. 19 is a perspective view schematically showing an example of the waterproof gas-permeable member of the present invention.

An example of the waterproof gas-permeable member of the present invention including the waterproof gas-permeable membrane 101 is shown in FIG. 19. The waterproof gas-permeable member 111 shown in FIG. 19 includes: the waterproof gas-permeable membrane 101 that is circular when viewed in a perpendicular direction to the principal surfaces of the membrane; and a supporting member 62 that is a ring-shaped sheet joined to the edge region of the membrane 101. Joining the supporting member 62 to the waterproof sound-permeable membrane 101 reinforces the waterproof gas-permeable membrane 101 and improves its handling properties. Additionally, when the waterproof gas-permeable member 111 is placed to an object such as an opening of a housing, the supporting member 62 can serve as a portion attached to the object and thus can make easier the attachment of the waterproof gas-permeable membrane 101. The supporting member 62 shown in FIG. 19 is identical to the supporting member 62 shown in FIG. 12.

Figure 20:
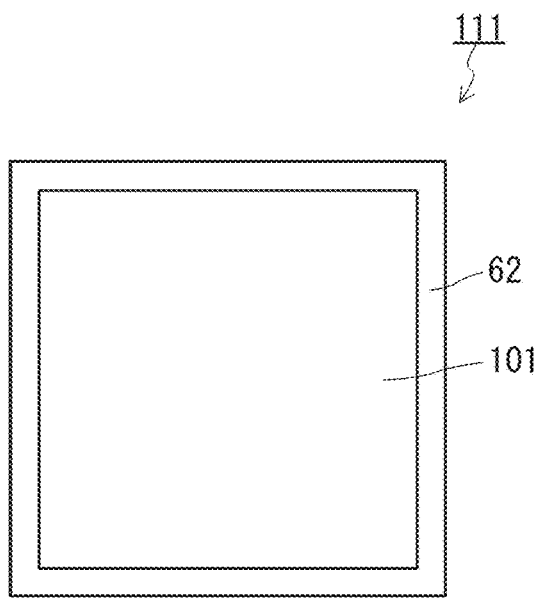
FIG. 20 is a plan view schematically showing another example of the waterproof gas-permeable member of the present invention.

The shape of the supporting member 62 is not limited. For example, as shown in FIG. 20, the supporting member 62 may be a frame-shaped sheet joined to the edge region of the waterproof gas-permeable membrane 101 that is rectangular when viewed in a perpendicular direction to the principal surfaces of the membrane. Conforming the shape of the supporting member 62 to the shape of the edge region of the waterproof gas-permeable membrane 101 as shown in FIGS. 19 and 20 reduces the deterioration in gas permeability of the waterproof gas-permeable membrane 101 caused by the placement of the supporting member 62. It is preferable for the supporting member 62 to be in the form of a sheet, in terms of improving the handling properties of the waterproof gas-permeable member 111 and the ease of placement of the member 111 to a housing, particularly the ease of placement inside the housing.

The method for joining the waterproof gas-permeable membrane 101 and the supporting member 62 together is not particularly limited. For example, techniques such as thermal welding, ultrasonic welding, bonding by an adhesive, and bonding by a double-sided tape can be employed.

The orientation of the waterproof gas-permeable membrane 101 in the waterproof gas-permeable member 111 (the direction in which each principal surface of the polymer film 1 included in the waterproof gas-permeable membrane 101 faces) is not limited. For example, the waterproof gas-permeable membrane 101 and the supporting member 62 may be joined together in such a manner that when the waterproof gas-permeable member 111 is fixedly attached to an opening of a housing, the principal surface 2a (the principal surface 2a at which the opening diameter of the through holes 3 is smaller) of the polymer film 1 faces the outside of the housing which may suffer from entry of water. This provides higher waterproofness of the housing and higher gas permeability.

The waterproof gas-permeable member 111 may include two or more waterproof gas-permeable membranes 101 and/or two or more supporting members 62.

The waterproof gas-permeable member 111 can be used in the same applications as conventional waterproof gas-permeable members.

(Waterproof Ventilation Structure)

Figure 21:
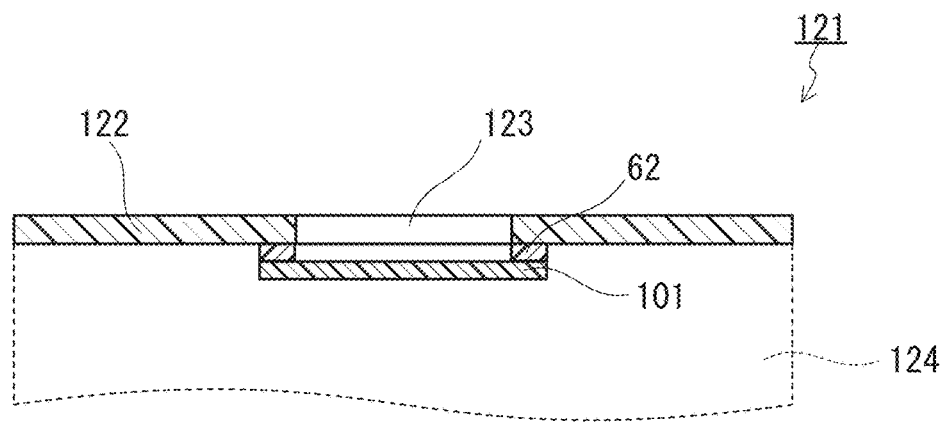
FIG. 21 is a cross-sectional view schematically showing an example of the waterproof ventilation structure of the present invention.

An example of the waterproof ventilation structure of the present invention including the waterproof gas-permeable membrane 101 is shown in FIG. 21. The waterproof ventilation structure 121 shown in FIG. 21 includes: a housing 122 having an interior 124 and an opening 123 for permitting permeation of gas between the interior 124 and the outside of the housing; and the waterproof gas-permeable membrane 101 placed to cover the opening (opening portion) 123. This waterproof gas-permeable membrane 101 can prevent entry of water into the interior 124 of the housing 122 from the outside through the opening 123 while permitting permeation of gas between the outside of the housing 122 and the interior 124. In the example shown in FIG. 21, the waterproof gas-permeable membrane 101 is joined to the housing 122 via the supporting member 62. In other words, a waterproof gas-permeable member including the waterproof gas-permeable membrane 101 and the supporting member 62 is joined to the housing 122. In the example shown in FIG. 21, the waterproof gas-permeable membrane 101 is joined to the housing 122 in the interior 124 of the housing 122. The waterproof gas-permeable membrane 101 may be joined to the exterior of the housing 122.

The housing 122 is composed of a resin, a metal, glass, or a composite thereof.

For the placement of the waterproof gas-permeable membrane 101, techniques such as adhesion using a double-sided tape, thermal welding, high-frequency welding, and ultrasonic welding can be employed. The supporting member 62 may be a double-sided tape.

The orientation of the waterproof gas-permeable membrane 101 in the waterproof ventilation structure 121 (the direction in which each principal surface of the polymer film 1 included in the waterproof gas-permeable membrane 101 faces) is not limited. For example, the waterproof gas-permeable membrane 101 may be placed in such a manner that the principal surface 2a (the principal surface 2a at which the opening diameter of the through holes 3 is smaller) of the polymer film 1 faces the outside of the housing 122 of the waterproof ventilation structure 121 and that the principal surface 2b (the principal surface 2b at which the opening diameter of the through holes 3 is larger) of the polymer film 1 faces the inside of the housing 122. This provides higher waterproofness of the waterproof ventilation structure 121 and higher gas permeability for gas permeation from the interior of the housing 122.

The component, device, equipment, product or the like that can have the waterproof ventilation structure 121 is not limited.

The waterproof ventilation structure 121 can be used in various applications similarly to conventional waterproof ventilation structures.

Embodiment 3: Suction Sheet (Suction Sheet)

Another example of the applications of the polymer film 1 is the use in a suction sheet. The suction sheet is a sheet having gas permeability in the thickness direction, and is placed on a suction face of a suction unit when a workpiece is held by suction on the suction unit. Placing the suction sheet on the suction face allows the workpiece to be held by suction on the suction unit without direct contact between the suction face and the workpiece. The workpiece is, for example, a dielectric thin film (ceramic green sheet) used for production of a ceramic capacitor.

In recent years, ceramic green sheets have been increasingly thinned to achieve size reduction and capacity increase of ceramic capacitors. Ceramic green sheets with a thickness of 1 to 2 μm have already been put into practice. Ceramic green sheets with a thickness of 1 μm or less are under development. A certain amount of reduction in the thickness of a ceramic green sheet causes the sheet itself to have gas permeability, and also increases the effect of the van der Waals force acting between the sheet and a release film that is used in fabrication of the ceramic green sheet and that remains lying on the ceramic green sheet after the fabrication, thus leading to an increase in suction force required for separation of the ceramic green sheet from the release sheet and for suction transfer of the ceramic green sheet. This has created a demand for a suction sheet with improved gas permeability. However, a mere improvement in gas permeability of the suction sheet causes damage to a ceramic green sheet when the ceramic green sheet is held by suction on the suction sheet. With the use of the polymer film 1 of the present invention, it is possible to obtain a suction sheet that has higher gas permeability and causes less damage to a workpiece during suction holding than conventional suction sheets.

Figure 22:
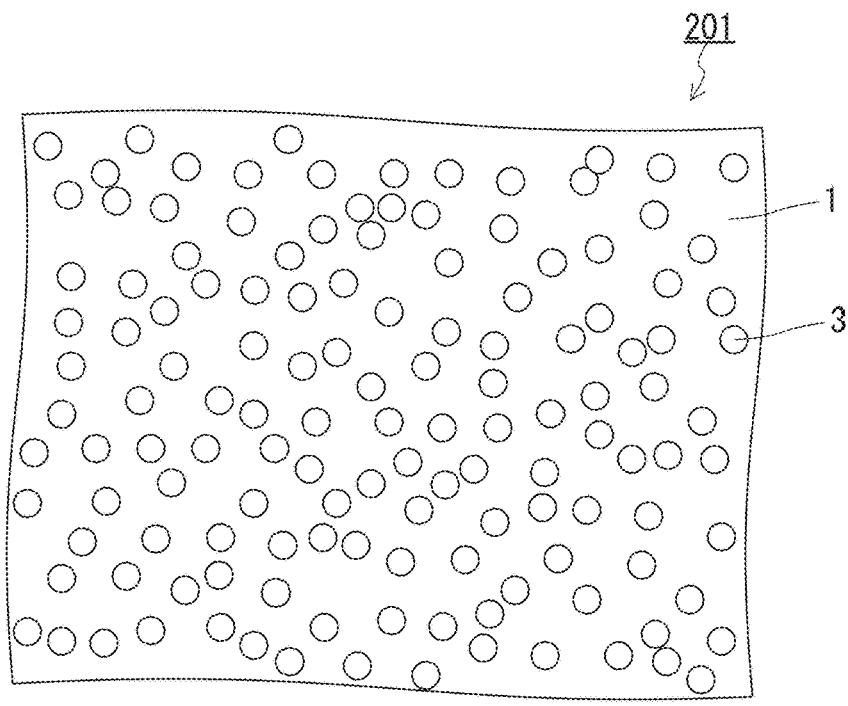
FIG. 22 is a plan view schematically showing an example of the suction sheet of the present invention.
Figure 23:
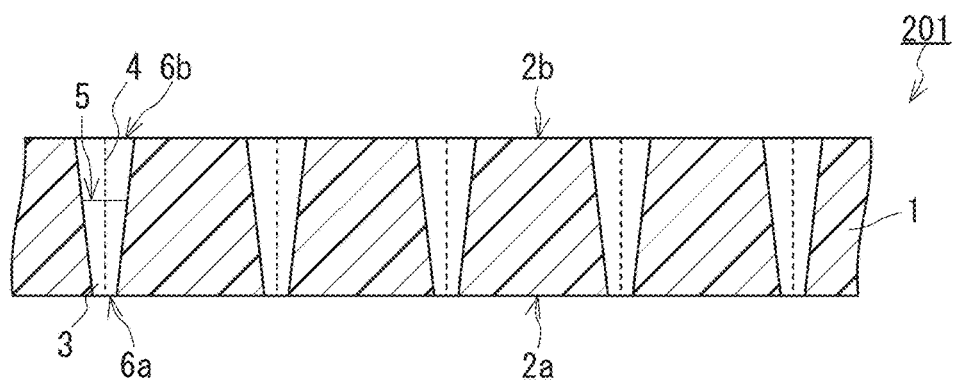
FIG. 23 is a cross-sectional view schematically showing an example of the suction sheet of the present invention.

An example of the suction sheet including the polymer film 1 (the suction sheet of the present invention) is shown in FIGS. 22 and 23. The polymer film 1 has through holes 3 extending from one principal surface 2a of the film 1 to the other principal surface 2b. The through holes 3 are straight holes having a central axis (axial line) 4 extending straight and have a shape in which the area of a cross-section 5 perpendicular to the direction of the central axis 4 increases from the one principal surface 2a of the polymer film 1 toward the other principal surface 2b. The ratio a/b of the diameter (opening diameter) a of openings 6a of the through holes 3 at the one principal surface 2a to the diameter b of openings 6b of the through holes 3 at the other principal surface 2b is 80% or less. The diameter a of the openings 6a of the through holes 3 at the one principal surface 2a is 10 μm or less.

At least by virtue of such a shape of the through holes 3, the suction sheet 201 causes less damage to a workpiece during suction holding of the workpiece, despite having good gas permeability.

The suction sheet of Patent Literature 5 has a membranous structure in which randomly-distributed fine particles are bound together, and has gas passages that are three-dimensionally distributed over the entirety of a gas-permeable membrane and are continuous with each other, although the geometry of the gas passages is different from those in the stretched porous membranes disclosed in Patent Literature 1 and 2. Thus, in the suction sheet of Patent Literature 5, the size and shape of the pores vary to a great extent in the membrane. To improve the gas permeability of such a sheet, the average pore diameter and/or porosity of the sheet needs to be increased. However, increasing the average pore diameter of the suction sheet having the above membranous structure leads to a situation where a workpiece is damaged during suction holding of the workpiece by being sucked in pores, in particular pores having a diameter larger than the average pore diameter, of the surface of the suction sheet. Increasing the porosity of the suction sheet having the above membranous structure leads to a situation where a workpiece is damaged during suction holding of the workpiece due to deformation of the suction sheet itself. These situations are likely to occur, especially when the workpiece is a ceramic green sheet, in particular a ceramic green sheet of reduced thickness. Examples of defects caused by the damage to the workpiece when it is a ceramic green sheet include: deformation of the ceramic green sheet and/or traces (suction traces) formed by suction into the pores of the surface of the suction sheet; and poor stacking in a step subsequent to the suction transfer.

The polymer film 1 constituting the suction sheet 201 is a non-porous film having no through-thickness gas passages other than the through holes 3 which are straight holes, and the size and shape of the through holes 3 serving as gas passages are highly uniform. In addition, the diameter of the openings 6$a$ at the one principal surface 2$a$ and the diameter of the openings 6$b$ at the other principal surface 2$b$ are different from each other. When the suction sheet 201 is placed in such a manner that the principal surface 2$a$ having the openings 6$a$ with a smaller diameter faces a workpiece during suction holding of the workpiece (in other words, when the suction sheet 201 is placed in such a manner that the principal surface 2$b$ having the openings 6$b$ with a larger diameter faces the suction face of the suction unit), the suction sheet 201 exhibits low gas flow resistance and high gas permeability (through-thickness gas permeability) and, at the same time, causes less sucking of the workpiece into the openings of the surface of the suction sheet and is less likely to damage the workpiece during suction holding. These advantages can be reliably achieved by the fact that the shape, the opening diameters, and the above-described ratio a/b of the through holes 3 can be varied by adjusting the conditions of the above-described production of the polymer film 1. In addition, it is possible to prevent lateral leakage (a phenomenon where air is drawn in from the lateral sides of a suction sheet so that the suction force exerted on a workpiece by a suction unit decreases) which is highly likely to occur when a conventional suction sheet is used.

The shape of the through holes 3 is not limited, provided that: the through holes 3 extend from the one principal surface 2$a$ of the polymer film 1 to the other principal surface 2$b$; the through holes 3 are straight holes having the central axis (axial line) 4 extending straight; the through holes 3 have a shape in which the area of the cross-section 5 perpendicular to the direction of the central axis 4 increases from the one principal surface 2$a$ of the polymer film 1 toward the other principal surface 2$b$; the opening diameter ratio a/b is 80% or less; and the diameter a of the openings 6$a$ at the one principal surface 2$a$ is 10 μm or less. For example, the suction sheet 201 can be a suction sheet including the polymer film 1 having the through holes 3 having the cross-section 5 the area of which increases continuously from the principal surface 2$a$ toward the principal surface 2$b$, and can also be a suction sheet in which the increase rate of the area is constant or substantially constant.

The ratio a/b of the diameter (opening diameter a) of the opening 6$a$ to the diameter (opening diameter b) of the opening 6$b$ in each through hole 3 is 80% or less. In terms of improving the balance between the gas permeability and the preventing effect on damage to a workpiece caused during suction holding, the ratio a/b is preferably 70% or less and more preferably 60% or less. The lower limit of the ratio a/b is not particularly defined. The ratio a/b is preferably such that the through-thickness gas permeability of the suction sheet 201 (the through-thickness gas permeability of the polymer film 1), as expressed in terms of Gurley number measured according to JIS L 1096 (which may be simply referred to as "Gurley number" hereinafter), is 0.1 seconds/100 mL or less when the surface roughness (arithmetic average roughness Ra, which will be described later) of the principal surface having smaller-diameter openings of the through holes 3 is 1.5 to 1.0 μm. The ratio a/b is preferably such that the through-thickness gas permeability of the suction sheet 201 is 3.0 seconds/100 mL or less when Ra is 1.0 to 0.5 μm and that the through-thickness gas permeability of the suction sheet 201 is 5.0 seconds/100 mL or less when Ra is 0.5 μm or less.

The diameter (opening diameter a) of the openings 6$a$, which are the smaller-diameter openings, is 10 μm or less. If the opening diameter a is more than 10 μm, workpieces are likely to be damaged when held by suction. Even if the damage only leaves a suction trace, for example, a difference in thickness can occur between a workpiece with a suction trace and a workpiece free from a suction trace. When the workpieces are ceramic green sheets, such a difference in thickness leads to poor stacking of the sheets in the stacking step. The opening diameter a is preferably 5 μm or less. The opening diameter a preferably falls within a range where the through-thickness gas permeability of the suction sheet 201 can be 10 seconds/100 mL or less as expressed in terms of the Gurley number. The lower limit of the opening diameter a is, for example, 0.01 μm, although the lower limit may vary depending on the hole density.

The diameter (opening diameter b) of the openings 6$b$, which are the larger-diameter openings, is not limited, as long as the opening diameter ratio a/b is 80% or less. In terms of allowing the suction sheet 201 to have a good through-thickness gas permeability, the opening diameter b is preferably 0.05 μm or more and 20 μm or less and more preferably 0.5 μm or more and 10 μm or less. When the opening diameter b is in such a range, for example, a good through-thickness gas permeability which is 10 seconds/100 mL or less as expressed in terms of the Gurley number can be reliably achieved.

The opening diameters of the through holes 3 at each principal surface of the polymer film 1 need not be exactly equal for all of the openings lying at the principal surface. However, it is preferable for the openings in the effective portion of the polymer film 1 (the portion that can be used as the suction sheet 201) to have such uniform diameters that the diameters can be considered substantially equal (e.g., the standard deviation is 10% or less of the average). The above-described method for producing the polymer film 1 is capable of forming the suction sheet 201 in which the diameters of the openings at each principal surface are uniform. In the suction sheet 201, the opening diameter a and/or opening diameter b of all of the through holes 3 in the effective portion can be within the range(s) specified above.

The density of distribution of the through holes 3 (hole density) in the polymer film 1 is not particularly limited and is, for example, $1\times10^1$ holes/cm$^2$ or more and $1\times10^8$ holes/cm$^2$ or less. When the hole density is in this range, it is easy to control the gas permeability of the suction sheet 201 within a preferred range and also to prevent damage to a workpiece during suction holding. A sufficient mechanical strength of the suction sheet 201 can also be achieved. The hole density is more preferably $5×10^3$ holes/cm$^2$ or more and $7×10^7$ holes/cm$^2$ or less. The hole density need not be exactly constant over the entirety of the polymer film 1. The hole density in the effective portion of the polymer film 1 is preferably so uniform that the maximum value of the hole density is equal to or less than 1.5 times the minimum value of the hole density.

It is preferable for the suction sheet 201 to have a gas permeability of 10 seconds/100 mL or less as expressed in terms of the Gurley number in the thickness direction. The gas permeability is more preferably 3 seconds/100 mL or less. The gas permeability of the suction sheet 201 can be controlled, for example, by adjusting the diameters of the through holes 3 and/or the hole density. The upper limit of the gas permeability is not particularly defined and is, for example, 0.01 seconds/100 mL as expressed in terms of the Gurley number.

The surface roughness (arithmetic average roughness Ra) of one of the two principal surfaces of the suction sheet 201 that has the smaller-diameter openings of the through holes 3 is preferably 2 μm or less, more preferably 1.5 μm or less, and even more preferably 1.0 μm or less. The surface roughness Ra can be measured according to JIS B 0601 (2001). When the surface roughness Ra is in the above range, damage to a workpiece caused by suction holding can be more reliably prevented. This effect is significant, particularly when a ceramic green sheet having a very small thickness and a low stiffness is to be held by suction, i.e., when the workpiece is highly susceptible to damage during suction holding. Examples of defects caused by the damage include the deformation of the workpiece and/or the occurrence of minute flaws on the surface of the workpiece. In addition, the occurrence of poor stacking of ceramic green sheets can be prevented in the production process of a ceramic capacitor.

It is preferable that the variation in thickness of the suction sheet 201 be within about ±2 μm when the thickness is in the range of 12.5 to 100 μm. The thickness of the suction sheet 201 is, for example, about 15 to 90 μm and is preferably 15 to 50 μm, in terms of allowing the suction sheet to have a gas permeability within a preferred range and reliably preventing damage to a workpiece during suction holding.

The visible light transmittance of the suction sheet 201 is preferably 60% or less and more preferably 50% or less, since in this case foreign matters attached to the sheet can easily be found. The visible light transmittance of the suction sheet 201 can be evaluated according to JIS K 7105-1981. For the evaluation, for example, a spectrophotometer can be used. An example of the spectrophotometer is U-4100 manufactured by Hitachi High-Technologies Corporation. The measurement wavelength for evaluation of the visible light transmittance is, for example, in the range of 300 to 800 nm.

The suction sheet 201 can have all of the above preferred features together. For example, the average roughness Ra of the principal surface having the smaller-diameter openings of the through holes can be 2 μm or less while the gas permeability in the thickness direction can be 10 seconds/100 mL or less as expressed in terms of the Gurley number.

The polymer film 1 included in the suction sheet of the present invention can have any structure, as long as the ratio a/b of the opening diameter a of the through holes 3 at the one principal surface 2a to the opening diameter b of the through holes 3 at the other principal surface 2b is 80% or less and the opening diameter a is 10 μm or less, and the suction sheet of the present invention can include any of the polymer films 1 of the present invention such as those which are shown in FIGS. 2 to 6.

Figure 24:
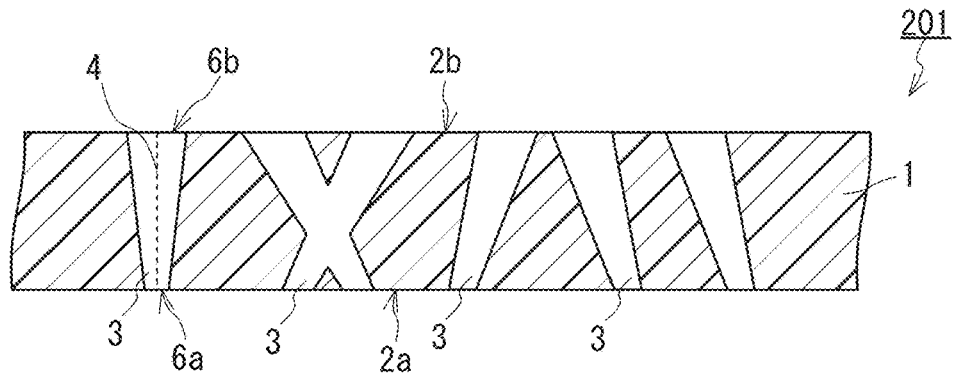
FIG. 24 is a cross-sectional view schematically showing another example of the suction sheet of the present invention.

For example, the suction sheet 201 can include the polymer film 1 as shown in FIG. 2 or 3 which has through holes 3 extending obliquely to the perpendicular direction to the principal surfaces 2a and 2b or can include the polymer film 1 as shown in FIG. 3 which has through holes 3 extending in different oblique directions. An example of the suction sheet 201 including the polymer film 1 having through holes 3 extending in different oblique directions is shown in FIG. 24. It should be noted that the gas permeability of the suction sheet 201 is at a maximum when the direction in which the through holes 3 extend is perpendicular to the principal surfaces 2a and 2b of the polymer film 1 as shown in FIG. 1. In view of this, the suction sheet 201 can be a sheet including the polymer film 1 having through holes 3 extending in the perpendicular direction to the principal surfaces 2a and 2b.

The suction sheet 201 has two or more through holes 3. The through holes 3 can typically be separate from each other. In the suction sheet 201, two or more of the through holes 3 may connect to each other at the surfaces of, or in the interior of, the polymer film 1. The manner of the connection is not limited. For example, when the through holes 3 extend in the perpendicular direction to the principal surfaces 2a and 2b of the polymer sheet 1, the openings of the through holes 3 at the one principal surface 2a can be separate from each other while the openings at the other principal surface 2b can be continuous with each other, since the opening diameter differs between the principal surfaces 2a and 2b.

The suction sheet 201 may include two or more polymer films 1. Such a suction sheet 201 can be formed, for example, by ion beam irradiation and chemical etching of a stack of two or more original films. The suction sheet 201 can be a sheet including one polymer film 1.

The suction sheet 201 can contain a material other than a resin (polymer). The material can be contained, for example, in the interior of the polymer film 1. Examples of the material include: additives such as a light stabilizer and an antioxidant; oligomer components derived from the material of the polymer film 1; and metal oxides (specific examples of which include white pigments such as alumina and titanium oxide).

The suction sheet 201 may be subjected to a coloring treatment. The color imparted to the sheet is not limited. In terms of the ease of visual check for foreign matters, in particular foreign matters with a thick dark color such as black or green, which are attached to a workpiece such as a ceramic green sheet, a clear light color is preferred, and white is more preferred.

A coloring treatment for imparting white color can be accomplished, for example, by incorporating white particles into the polymer sheet 1 and/or forming a white coating layer on a principal surface of the polymer sheet 1. When the suction sheet 201 is colored white, the Hunter whiteness of the principal surface having the smaller-diameter openings is preferably 70 or more, more preferably 75 or more, and even more preferably 80 or more.

The Hunter whiteness W is determined by the following expression: $W=100-[(100-L)^2+a^2+b^2]^{1/2}$. L, a, and b represent lightness, redness, and yellowness of the evaluation object, respectively. The Hunter whiteness can be evaluated, for example, using a spectrophotometric whiteness and color-difference meter. An example of the measuring instrument is ND-1001 DP manufactured by NIPPON DEN- SHOKU INDUSTRIES CO., LTD. The Hunter whiteness of the evaluation object can be evaluated by employing Illuminant C (one of the standard illuminants specified by International Commission on Illumination (CIE)) in this color-difference meter. The observer angle employed for the evaluation is, for example, 2°. In the evaluation using this color-difference meter, light with a dominant wavelength of 475 nm which has been passed through a blue filter is applied to a test sample of the evaluation object at an incident angle of 45°, and light reflected in the perpendicular direction to the principal surfaces of the test sample (0° direction) is collected to electrically measure the amount of reflection. Besides this, a magnesium oxide standard white plate is used as a test sample, for which the amount of reflection is electrically measured using the same conditions as above. The amount of reflection measured for the standard white plate is defined as 100, by relative comparison with which the whiteness of the evaluation object can be determined.

The whiteness of the suction sheet 201 can be controlled, for example, by adjusting the content and/or particle diameter of the white particles in the polymer film 1.

Figure 25:
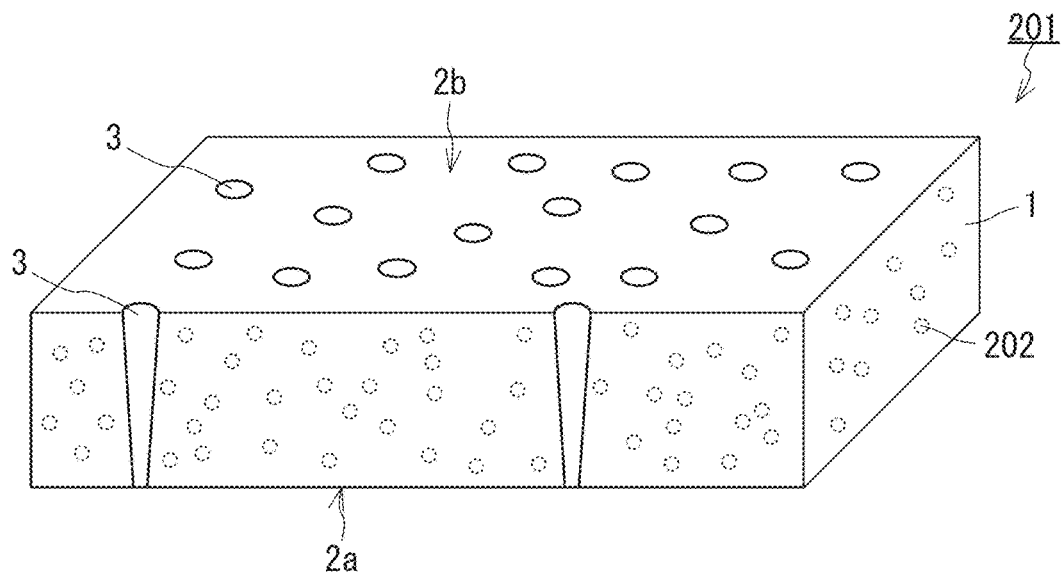
FIG. 25 is a perspective view schematically showing still another example of the suction sheet of the present invention.

FIG. 25 shows an example of the suction sheet 201 colored white by incorporating white particles 202 in the polymer film 1. The suction sheet 201 of FIG. 25 includes the polymer film 1 having the white particles 202 dispersed therein. An example of such a polymer film 1 is a PET film in which titanium oxide particles as the white particles 202 are dispersed. This PET film can be formed, for example, by allowing a monomer solution containing terephthalic acid, ethylene glycol, and titanium oxide particles dispersed in the solution to undergo polymerization and then by shaping the resulting polymer.

The content of the white particles 202 in the polymer film 1 can, for example, be such that a Hunter whiteness within the above range can be achieved. The particle diameter (average particle diameter) of the white particles 202 can, for example, be such that a Hunter whiteness within the above range can be achieved. The particle diameter and/or content of the white particles 202 in the polymer film 1 can be adjusted to achieve a Hunter whiteness within the above range.

The white particles 202 are not limited and are, for example, inorganic particles (particles composed of an inorganic substance). Specific examples include titanium oxide particles, zirconium oxide particles, silicon oxide particles, and alumina particles. When titanium oxide particles are employed as the white particles 202, the suction sheet 201 has improved weather resistance and is thus capable of maintaining the whiteness over a long period of time.

Figure 26:
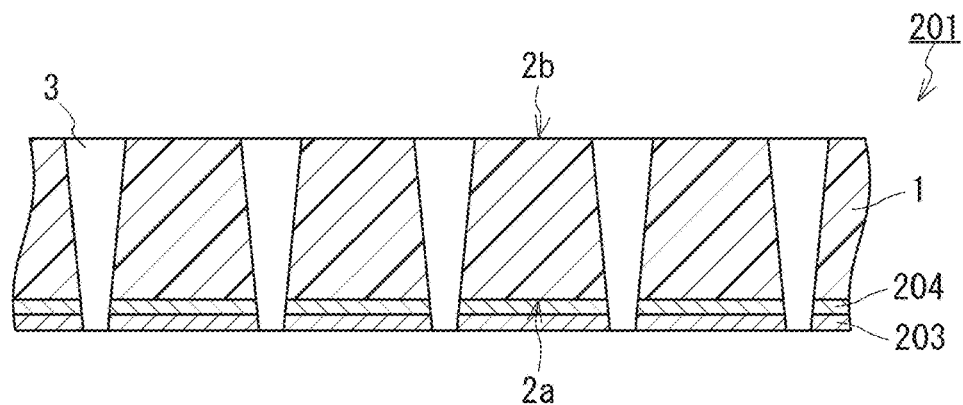
FIG. 26 is a cross-sectional view schematically showing still another example of the suction sheet of the present invention.

FIG. 26 shows an example of the suction sheet 201 colored white by placing a white coating layer 203 on the one principal surface 2a of the polymer film 1. The white coating layer 203 is formed over the principal surface 2a of the polymer film 1, with an underlayer 204 interposed therebetween. That is, the white coating layer 203 is placed on that principal surface of the suction sheet 201 which is to face a workpiece.

The white coating layer 203 is, for example, a layer composed of a material identical to the material composing the white particles 202 shown in FIG. 25. The white coating layer 203 can be formed, for example, by applying a solution containing white particles and then drying the resulting coating. The white coating layer 203 can be formed also by a thin-film formation process such as sputtering, vapor deposition (vacuum deposition), or chemical vapor deposition (CVD). Forming the white coating layer 203 by a thin-film formation process can result in a particularly high surface smoothness of the white coating layer 203. In the suction sheet 201 shown in FIG. 26, for example, the surface roughness (arithmetic average roughness Ra) of the principal surface coated with the coating layer 203 (the principal surface having the smaller-diameter openings) can be controlled to 0.1 to 1.5 μm.

The white coating layer 203 has openings positioned in register with the openings of the through holes 3. The above method is capable of forming such a white coating layer 203.

The thickness of the white coating layer 203 can, for example, be such that a Hunter whiteness within the above range can be achieved.

In the example shown in FIG. 26, the underlayer 204 is placed between the polymer film 1 and the white coating layer 203. The underlayer 204 is in contact with the polymer sheet 1 and the white coating layer 203. The underlayer 204 need not be placed when, for example, the suction sheet 201 has a whiteness within the above range. Placing the underlayer 204 between the polymer film 1 and the white coating layer 203 provides, for example, a decrease in the light transmittance (through-thickness light transmittance) of the suction sheet 201. Specifically, placing the underlayer 204 allows the formation of the suction sheet 201 having a through-thickness visible light transmittance of 10% or less.

The underlayer 204 can make easier the formation of the white coating layer 203 on the polymer film 1. Specifically, the underlayer 204 can make easier the deposition of the white coating layer 203 onto the polymer film 1.

The material composing the underlayer 204 is, for example, at least one selected from a metal, a metal carbide, a metal nitride, a metal oxide, and a metal fluoride. A specific example of the underlayer 204 is an alumina layer. The underlayer 204 in the form of an alumina layer has good heat resistance and good insulating properties. In addition, such an underlayer 204 can be formed relatively inexpensively and easily by a thin-film formation technique such as sputtering and is very easy to handle during and after the formation. The underlayer 204 and the white coating layer 203 may be composed of the same material or may be composed of different materials. An example of the combination of the underlayer 204 and the white coating layer 203 is a combination of an alumina layer as the underlayer 204 and a titanium oxide layer as the white coating layer 203.

The underlayer 204 can be formed, for example, by a thin-film formation technique such as sputtering or vapor deposition (vacuum deposition). The combination of the underlayer 204 and white coating layer 203 mentioned above as an example can be formed, for example, by sputtering or vapor-depositing the alumina layer on the polymer film 1 and then vapor-depositing the titanium oxide layer on the alumina layer.

In the example shown in FIG. 26, the polymer film 1 does not contain the white particles 202 therein. The suction sheet 201 may include: the polymer film 1 containing the white particles 202 (the polymer film 1 shown in FIG. 25, for example); and the white coating layer 203 or a combination of the underlayer 204 and white coating layer 203 which is formed on a principal surface of the polymer film 1.

When the white coating layer 203 or a combination of the underlayer 204 and white coating layer 203 is placed on a principal surface of the suction sheet 201, these layers may be placed on one principal surface or both principal surfaces of the suction sheet 201. These layers are preferably formed on the principal surface having the smaller-diameter openings (i.e., the principal surface that faces a workpiece during suction holding of the workpiece), as shown in FIG. 26.

In the suction sheet of the present invention, a release coating layer for improving the ease of release of the workpiece held by suction may be placed on at least one principal surface of the suction sheet. When the release coating layer is provided, this layer is preferably formed on the principal surface having the smaller-diameter openings. The release coating layer is, for example, a layer composed of a compound that reduces the surface friction coefficient, and examples of the compound include fluorine compounds.

In the suction sheet of the present invention, an adhesive layer can be placed on one principal surface of the suction sheet. It should be noted that the principal surface on which the adhesive layer is placed is the principal surface that does not face the workpiece during suction holding of the workpiece, typically the principal surface that faces the suction face of the suction unit. The adhesive layer is placed in such a manner that at least part or all of the openings of the through holes 3 are exposed to the outside. This placement is preferably done so that the suction sheet can possess the gas permeability as described above.

The suction sheet of the present invention can further include any member and/or layer other than those described above, as long as the sheet can be used as a suction sheet and the effects of the present invention are obtained.

The method for using the suction sheet of the present invention is not limited. The suction sheet of the present invention is used typically by being placed on a suction face of a suction unit in such a manner that the principal surface 2a of the polymer film 1 faces a workpiece. In this case, the principal surface 2b of the polymer film 1 which has the larger-diameter openings faces the suction face.

When the white coating layer 203 is formed on a principal surface of the suction sheet 201, it is preferable to use the suction sheet 201 by placing the sheet 201 on the suction face of the suction unit in such a manner that the principal surface with the white coating layer 203 formed thereon faces the workpiece.

When the release coating layer is formed on a principal surface of the suction sheet 201, it is preferable to use the suction sheet 201 by placing the sheet 201 on the suction face of the suction unit in such a manner that the principal surface with the release coating layer formed thereon faces the workpiece.

When the adhesive layer is formed on a principal surface of the suction sheet 201, the suction sheet 201 is used in such a manner that the principal surface with the adhesive layer formed thereon faces the suction face of the suction unit.

The suction sheet of the present invention can be used in a wide variety of applications such as production of ceramic capacitors, production of semiconductor wafers, and suction fixing of microparts.

The suction sheet of the present invention can be used not only in a suction unit for holding a ceramic green sheet by suction, but also in various other suction units such as a fixing unit for cutting or sucking a semiconductor wafer and a unit for suction fixing of microparts.

The method for producing the suction sheet 201 including the polymer film 1 having the through holes 3 is not particularly limited.

The method for producing the polymer film 1 is as described above. The polymer film 1 obtained by the method may be used per se as the suction sheet 201, or may be subjected to an additional step such as a step of coloring treatment or placement of various layers and then the resulting sheet may be used as the suction sheet 201. The suction sheet 201 with a coating layer such as the white coating layer (and optionally the underlayer 204) can, depending on the specific features of the layer, be formed by ion beam irradiation and non-uniform etching of an original film having a principal surface with the layer(s) placed thereon.

(Method for Suction Holding)

The method of the present invention for suction holding includes a step of holding a workpiece by suction on a suction face of a suction unit. The details of the step are not limited as long as the suction sheet 201 of the present invention is placed on the suction face of the suction unit, and the step can be performed according to a known method. The method for placing the suction sheet on the suction face of the suction unit is not limited, and the placement can be done according to a known method.

Specifically, the method of the present invention for suction holding includes a step of holding a workpiece by suction on a suction unit, the step including holding a workpiece by suction using a suction unit having a suction face with a suction sheet placed thereon, the holding being accomplished without direct contact between the suction face and the workpiece due to the presence of the suction sheet between the suction face and the workpiece. The suction sheet is the suction sheet 201 of the present invention. The suction sheet 201 is placed on the suction face of the suction unit in such a manner that one of the two principal surfaces of the sheet that has the smaller-diameter openings of the through holes faces the workpiece.

Placing the suction sheet 201 for suction holding of the workpiece provides protection of the suction face of the suction unit. Furthermore, placing the suction sheet 201 allows efficient suction holding of the workpiece while preventing damage to the workpiece caused by suction holding. When the workpiece is a ceramic green sheet, for example, the placement of the suction sheet 201 ensures separation of the ceramic green sheet from a release sheet and, at the same time, can prevent the deformation of the ceramic green sheet or the formation of suction traces during the separation and suction transfer, thereby reducing the occurrence of poor stacking of ceramic green sheets in the subsequent stacking step. This effect is significant, particularly when the workpiece is a thin ceramic green sheet which is susceptible to damage during suction holding.

Figure 27:
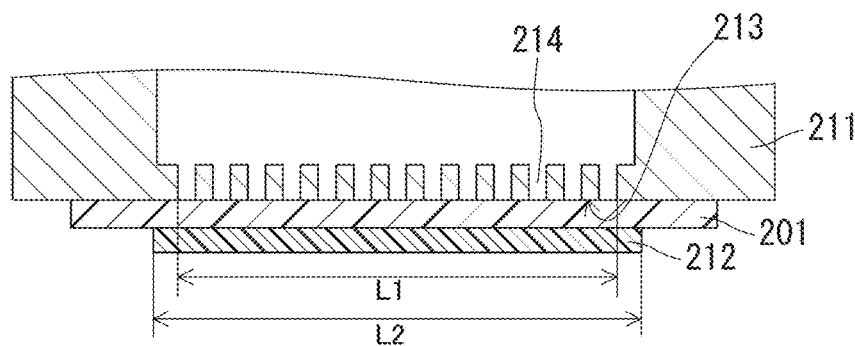
FIG. 27 is a schematic diagram for illustrating an example of the suction method of the present invention.

FIG. 27 shows an example of the method of the present invention for suction holding. In the method shown in FIG. 27, a workpiece 212 is held by suction on a suction unit 211. The suction sheet 201 of the present invention is placed on a suction face 213 of the suction unit 211, and the workpiece 212 is held by suction without direct contact with the suction face 213 due to the presence of the suction sheet 201. The suction sheet 201 is placed in such a manner that the principal surface having the larger-diameter openings of the through holes faces the suction face 213 of the suction unit 211, while the principal surface having the smaller-diameter openings of the through holes faces the workpiece 212.

In general, one suction sheet 201 is placed on the suction face 213. One suction sheet 201 can provide the effects described above. For example, this is advantageous for suction holding on an industrial scale, since the need for a cumbersome operation such as alignment of suction sheets can be eliminated unlike the case where two or more suction sheets with different average hole diameters are placed on the suction face.

The suction force (drawing force) for drawing the workpiece 212 to the suction face 213 of the suction unit 211 is generated, for example, by a negative pressure created in the suction unit 211 by a pump connected to the unit 211. A plurality of ports 214 are formed in the suction face 213 of the suction unit 211 shown in FIG. 27, and the negative pressure is transmitted to the suction sheet 201 through the ports 214 so that the workpiece 212 is held by suction. The region L1 of the suction face 213 where the ports 214 are formed is preferably narrower than the region L2 of the suction face 213 where the workpiece 212 is held by suction.

In an embodiment, the suction sheet 201 is colored white. Specifically, the suction sheet 201 includes the polymer sheet 1 containing the white particles 202 therein and/or has a principal surface with the white coating layer 203 formed thereon. The white coating layer 203 is formed, for example, on that surface of the suction sheet 201 which is to face the workpiece 212. In this embodiment, when foreign matters are attached to that principal surface of the suction sheet 201 which is to face the workpiece, the attached foreign matters are easily visible. This reduces the possibility that the workpiece held by suction is damaged by the attached foreign matters.

In another embodiment, a release coating layer is placed on a principal surface of the suction sheet 201. The release coating layer is placed, for example, on that surface of the suction sheet 201 which is to face the workpiece 212. This embodiment provides an increase in the ease of release of the workpiece 212 from the suction unit 211.

In still another embodiment, an adhesive layer is placed on that principal surface of the suction sheet 201 which is to face the suction face 213. This embodiment provides an increase in the reliability and stability of the placement of the suction sheet 201 on the suction face 213.

These embodiments can be implemented together in any combination.

(Method for Producing Ceramic Capacitor)

The method of the present invention for producing a ceramic capacitor includes: a separation step of drawing by suction a ceramic green sheet formed on a release film to a suction face of a suction unit so as to separate the ceramic green sheet from the release film; a stacking step of transferring the separated ceramic green sheet to a place while keeping the ceramic green sheet held by suction on the suction face, and then stacking the ceramic green sheet onto another ceramic green sheet at the place; and a sintering step of sintering a stack of ceramic green sheets that is formed by two or more repetitions of the separation step and the stacking step. The details of the separation step and the stacking step are not particularly limited as long as the suction sheet 201 of the present invention is placed on the suction face of the suction unit, and the steps can be performed according to known methods. The method for placing the suction sheet on the suction face of the suction unit is not particularly limited, and the placement can be done according to a known method.

Specifically, in the separation step and stacking step (suction transfer) in the method of the present invention for producing a ceramic capacitor, a workpiece is held by suction using a suction unit having a suction face with a suction sheet placed thereon, so that the holding is accomplished without direct contact between the suction face and the workpiece due to the presence of the suction sheet between the suction face and the workpiece. The suction sheet is the suction sheet 201 of the present invention. The suction sheet 201 is placed on the suction face of the suction unit in such a manner that one of the two principal surfaces of the sheet that has the smaller-diameter openings of the through holes faces a ceramic green sheet.

Placing the suction sheet 201 for suction holding of a ceramic green sheet provides protection of the suction face of the suction unit. Furthermore, placing the suction sheet 201 allows efficient suction holding of the ceramic green sheet while preventing damage to the ceramic green sheet caused by suction holding. Specifically, the placement of the suction sheet 201 ensures separation of the ceramic green sheet from a release sheet and, at the same time, can prevent the deformation of the ceramic green sheet or the formation of suction traces during the separation and suction transfer, thereby reducing the occurrence of poor stacking of the ceramic green sheets in the stacking step. This effect is significant, particularly when the ceramic green sheet as a workpiece is a thin ceramic green sheet which is susceptible to damage during suction holding.

The suction sheet 201 is placed in such a manner that the principal surface having the larger-diameter openings of the through holes faces the suction face 213 of the suction unit 211, while the principal surface having the smaller-diameter openings of the through holes faces the ceramic green sheet.

In general, one suction sheet 201 is placed on the suction face 213. One suction sheet 201 can provide the effects described above. For example, this is advantageous for production of ceramic capacitors on an industrial scale, since the need for a cumbersome operation such as alignment of suction sheets can be eliminated unlike the case where two or more suction sheets with different average hole diameters are placed on the suction face.

Figure 28A:
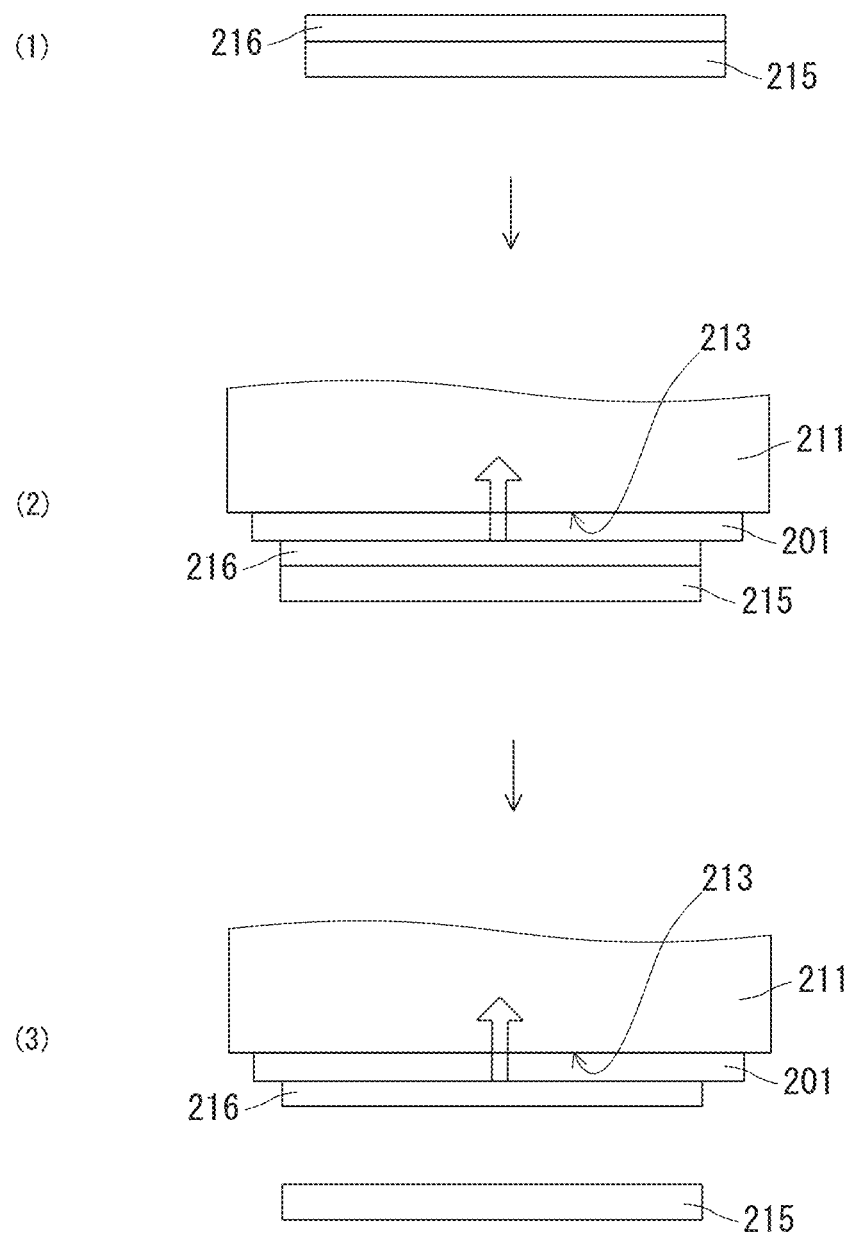
FIG. 28A is a process diagram schematically showing a separation step in an example of the method of the present invention for producing a ceramic capacitor.
Figure 28B:
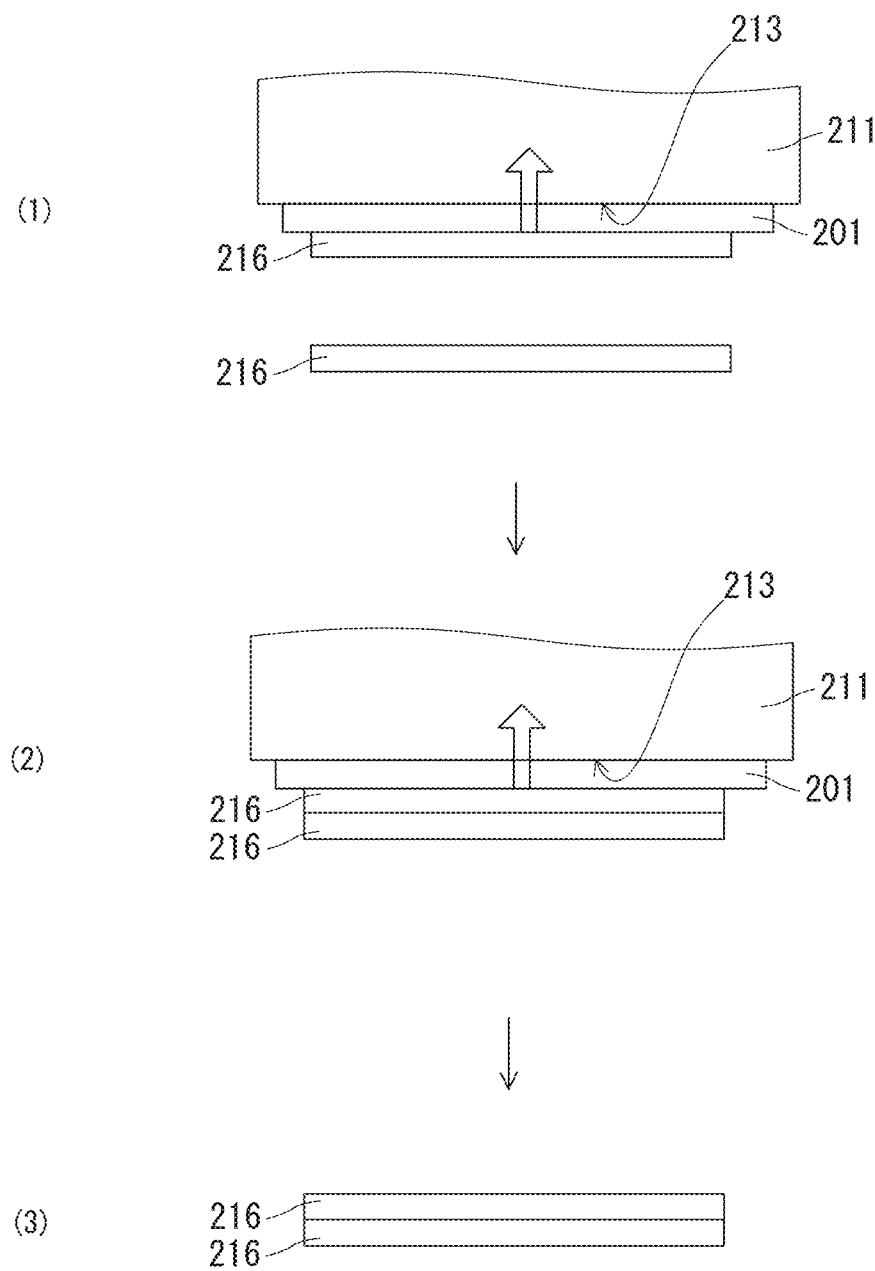
FIG. 28B is a process diagram schematically showing a stacking step in an example of the method of the present invention for producing a ceramic capacitor.
Figure 28C:
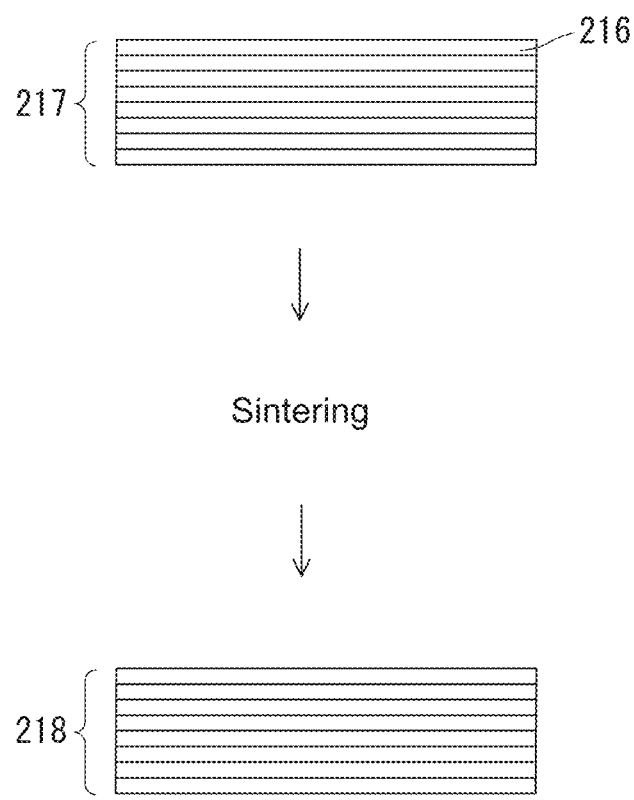
FIG. 28C is a process diagram schematically showing a sintering step in an example of the method of the present invention for producing a ceramic capacitor.

FIGS. 28A to 28C illustrate an example of the method of the present invention for producing a ceramic capacitor. FIG. 28A illustrates the separation step, FIG. 28B illustrates the stacking step, and FIG. 28C illustrates the sintering step. In the separation step illustrated in FIG. 28A, a ceramic green sheet 216 formed on a release film 215 (see (1)) is drawn by suction to the suction face 213 of the suction unit 211 and thus separated from the release film 215 (see (2) and (3)). The suction face 213 has the suction sheet 201 placed thereon. The ceramic green sheet 216 is drawn by suction to the suction face 213 in the presence of the suction sheet 201 between the ceramic green sheet 216 and the suction face 213.

In the stacking step illustrated in FIG. 28B, the ceramic green sheet 216 separated in the separation step is transferred to a place while being held by suction on the suction face 213 of the suction unit 211, and is stacked onto another ceramic green sheet 216 (a sheet 216 having been previously transferred by suction, for example) at the place (see (1) to (3)).

In the sintering step illustrated in FIG. 28C, a stack 217 of the ceramic green sheets 216, which has been obtained by two or more repetitions of the separation step illustrated in FIG. 28A and the stacking step illustrated in FIG. 28B, is sintered to form a sintered product 218. This is followed, for example, by a step of placing an electrode on the sintered product 218, and thus a ceramic capacitor is fabricated. The stack 217 in FIG. 28C is shown in the form of an eight-layer stack to illustrate the configuration of the stack in an easy-to-understand manner. In an actual case, the stack can consist of a greater number of (e.g., 300 or more) ceramic green sheets 216 stacked together by further repetitions of the separation step and stacking step.

The details of the separation step, stacking step, and sintering step in the method of the present invention for producing a ceramic capacitor may be identical to those in a known method for producing a ceramic capacitor, except for the placement of the suction sheet 201.

The method of the present invention for producing a ceramic capacitor can include any step other than the separation step, stacking step, and sintering step described above, as long as the effects of the present invention are obtained.

In an embodiment, the suction sheet 201 is colored white. Specifically, the suction sheet 201 includes the polymer sheet 1 containing the white particles 202 therein and/or has a principal surface with the white coating layer 203 placed thereon. The white coating layer 203 is placed, for example, on that surface of the suction sheet 201 which is to face the ceramic green sheet 216. In this embodiment, when foreign matters are attached to that principal surface of the suction sheet 201 which is to face the ceramic green sheet 216, the attached foreign matters are easily visible and removable. This reduces the possibility that the ceramic green sheet 216 held by suction is damaged by the attached foreign matters and thus the ceramic capacitor produced has poor quality.

In another embodiment, a release coating layer is placed on a principal surface of the suction sheet 201. The release coating layer is placed, for example, on that surface of the suction sheet 201 which is to face the ceramic green sheet 216. This embodiment provides an increase in the ease of release of the ceramic green sheet 216 from the suction unit 211.

In still another embodiment, an adhesive layer is placed on that principal surface of the suction sheet 201 which is to face the suction face 213. This embodiment provides an increase in the reliability and stability of the placement of the suction sheet 201 on the suction face 213.

These embodiments can be implemented together in any combination.

Embodiment 4: Optical Film

Another example of the applications of the polymer film 1 is the use in an optical film. The polymer film 1 has through-thickness passages constituted by the through holes 3. In a waterproof sound-permeable membrane, waterproof gas-permeable membrane, and suction sheet, these passages are used as gas (sound) passages. In the optical film of the present invention, these passages are used as an element for achieving an optical property of the film. It should be understood that the passages may be used as passages of gas and/or sound in the optical film of the present invention. In this case, the optical film of the present invention can further have gas permeability and/or sound permeability. Examples of the optical property achieved in the optical film of the present invention include a reflectance difference between the front and back sides of the film.

An optical film whose reflectance differs between its front and back sides, i.e., an optical film whose reflectance differs between its one surface and the other surface, may be obtained, for example, by stacking a functional layer of inorganic material or the like on one principal surface of a film. However, the stacking of the functional layer causes problems such as an increase in thickness and hence a decrease in bendability of the resulting optical film. These problems can pose an obstacle to the use of the optical film in an electronic device such as a tablet PC or smartphone. This is because the optical film should have a small thickness and high pliability when used in the above electronic devices which are strongly required to be lightweight and to allow high flexibility in design. The same can be said for the use of the optical film as a component of a display (as an optical member inside the display) of an electronic device and for the use of the optical film as an additional film stacked on a screen of a display to provide the display with an additional function such as that related to visibility. The reflectance difference between the two sides of an optical film can be created also by microfabrication of the surface of the optical film instead of stacking a functional layer; however, the microfabrication involves high cost. The optical film of the present invention includes the polymer film 1, and this makes it possible to achieve a particular optical property such as a reflectance difference between front and back sides without stacking of a functional layer or surface microfabrication. Such an optical film can, for example, provide an improvement in visibility (such as a widening of the viewing angle) of a display with the film placed thereon.

Figure 29:
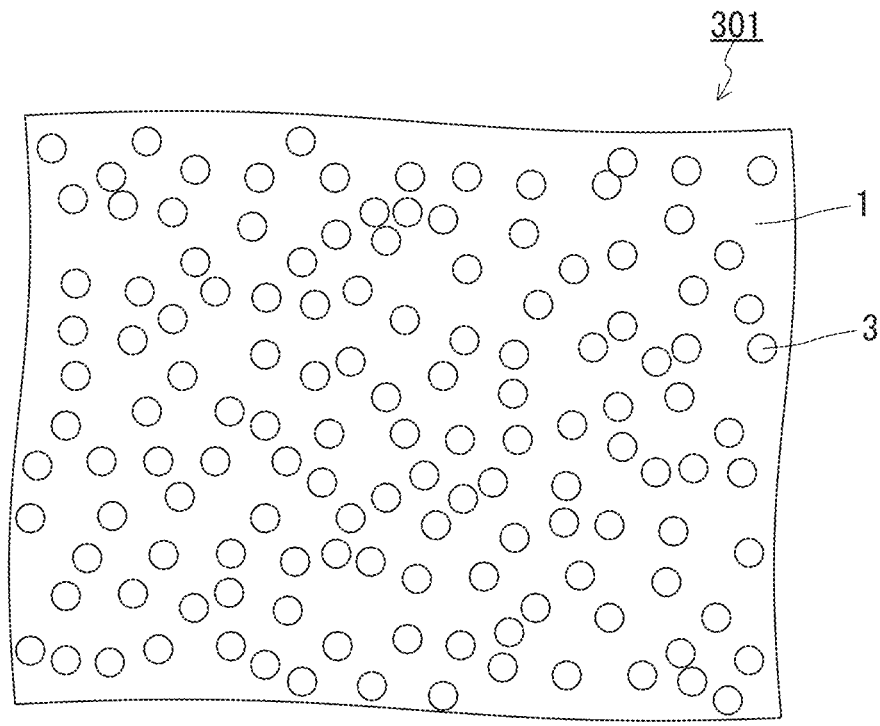
FIG. 29 is a plan view schematically showing an example of the optical film of the present invention.
Figure 30:
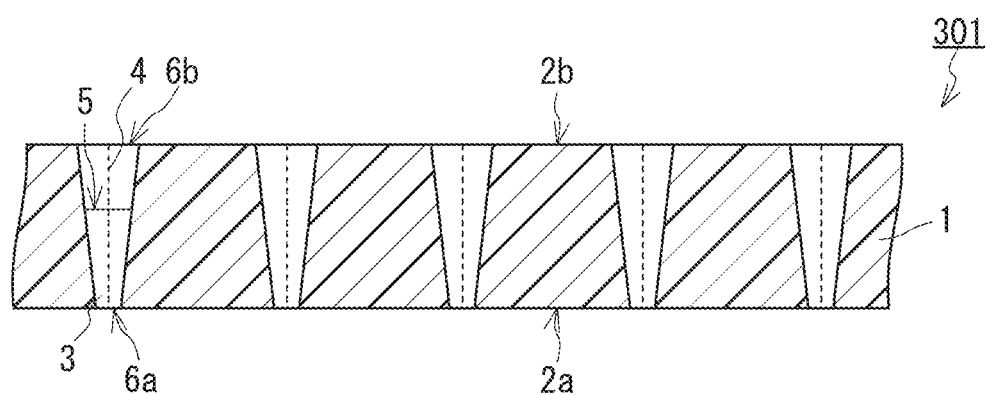
FIG. 30 is a cross-sectional view schematically showing an example of the optical film of the present invention.

FIGS. 29 and 30 show an example of the optical film including the polymer film 1 (the optical film of the present invention). The polymer film 1 has through holes 3 extending from one principal surface 2a of the film 1 to the other principal surface 2b. The through holes 3 are straight holes having a central axis (axial line) 4 extending straight and have a shape in which the area of a cross-section 5 perpendicular to the direction of the central axis 4 increases from the one principal surface 2a of the polymer film 1 toward the other principal surface 2b. The ratio a/b of the diameter (opening diameter) a of openings 6a of the through holes 3 at the one principal surface 2a to the diameter b of openings 6b of the through holes 3 at the other principal surface 2b is less than 80%. The diameter a of the openings 6a of the through holes 3 at the one principal surface 2a is 20 μm or less. At least by virtue of such a shape of the through holes 3, the optical film 301 can show a particular optical property. An example of the optical property is a reflectance (light reflectance) difference between the front and back sides of the film.

The shape of the through holes 3 is not limited, provided that: the through holes 3 extend from the one principal surface 2a of the polymer film 1 to the other principal surface 2b; the through holes 3 are straight holes having the central axis (axial line) 4 extending straight; the through holes 3 have a shape in which the area of the cross-section 5 perpendicular to the direction of the central axis 4 increases from the one principal surface 2a of the polymer film 1 toward the other principal surface 2b; the opening diameter ratio a/b is less than 80%; and the diameter a of the openings 6a at the one principal surface 2a is 20 μm or less. For example, the optical film 301 can be an optical film including the polymer film 1 having the through holes 3 having the cross-section 5 the area of which increases continuously from the principal surface 2a toward the principal surface 2b, and can also be an optical film in which the increase rate of the area is constant or substantially constant.

The ratio a/b of the diameter (opening diameter a) of the opening 6a to the diameter (opening diameter b) of the opening 6b in each through hole 3 is less than 80%. In terms of ensuring the achievement of the optical property based on the through holes 3, the ratio a/b is preferably 75% or less, more preferably 70% or less, and even more preferably 60% or less. The lower limit of the ratio a/b is not particularly defined and is, for example, 10%.

The diameter (opening diameter a) of the openings 6a, which are the smaller openings, is 20 μm or less. The opening diameter a is preferably 10 μm or less and more preferably 5 μm or less. The lower limit of the opening diameter a is not particularly defined and is, for example, 0.05 μm.

When the ratio a/b and/or the opening diameter a are/is in the above preferred range(s), the reflectance difference between the front and back sides of the optical film 301 is large.

The diameter (opening diameter b) of the openings 6b, which are the larger openings, is not limited as long as the opening ratio a/b is less than 80%. The opening diameter b is, for example, 0.1 μm or more and 30 μm or less and preferably 1.0 μm or more and 20 μm or less.

The opening diameters of the through holes 3 at each principal surface of the polymer film 1 need not be exactly equal for all of the openings lying at the principal surface. However, it is preferable for the openings in the effective portion of the polymer film 1 (the portion that can be used as the optical film 301) to have such uniform diameters that the diameters can be considered substantially equal (e.g., the standard deviation is 10% or less of the average). The above-described method for producing the polymer film 1 is capable of forming the optical film 301 in which the diameters of the openings at each principal surface are uniform. In the optical film 301, the opening diameter a and/or opening diameter b of all of the through holes 3 in the effective portion can be within the range(s) specified above.

The density of distribution of the through holes 3 (hole density) in the polymer film 1 is not particularly limited and is, for example, $1 \times 10^1$ holes/cm² or more and $1 \times 10^{10}$ holes/cm² or less and can be $1 \times 10^3$ holes/cm² or more and $1 \times 10^{10}$ holes/cm² or less. When the hole density is in this range, an optical property of the optical film 301 such as a reflectance difference between the front and back sides can be achieved within a preferred range. A sufficient mechanical strength of the optical film 301 can also be achieved. The hole density is more preferably $5 \times 10^3$ holes/cm² or more and $7 \times 10^7$ holes/cm² or less. The hole density need not be exactly constant over the entirety of the polymer film 1. The hole density in the effective portion of the polymer film 1 is preferably so uniform that the maximum value of the hole density is equal to or less than 1.5 times the minimum value of the hole density.

The ratio c/d of the opening area ratio c of the one principal surface 2a of the polymer film 1 to the opening area ratio d of the other principal surface 2b is preferably 65% or less, more preferably 63% or less, and even more preferably 60% or less, in terms of increasing the reflectance difference between the front and back sides of the optical film 301.

In terms of obtaining good reflectance, the thickness of the optical film 301 is, for example, 1 to 100 μm, preferably 5 to 90 μm, and more preferably 5 to 80 μm. In general, when the thickness is in such a range, the problem of a decrease in bendability of the optical film 301 is less likely to arise.

For example, the reflectance (light reflectance) of the principal surfaces of the optical film 301 for light in the wavelength range of 300 to 800 nm is different for each principal surface of the optical film 301. The difference between the reflectance of one principal surface and the reflectance of the other principal surface is preferably 2% or more and more preferably 3% or more. The difference in reflectance can be created by using one polymer film 1. The optical film 301 is thus more suitable for industrial production than an optical film including a stack of two or more layers differing in reflectance, since the need for alignment of two or more layers can be eliminated in production of the optical film 301.

The optical film 301 can have all of these preferred features together.

The polymer film 1 included in the optical film of the present invention can have any structure, as long as the ratio a/b of the opening diameter a of the through holes 3 at the one principal surface 2a to the opening diameter b of the through holes 3 at the other principal surface 2b is less than 80% and the opening diameter a is 20 μm or less, and the optical film of the present invention can include any of the polymer films 1 of the present invention such as those which are shown in FIGS. 2 to 6.

Figure 31:
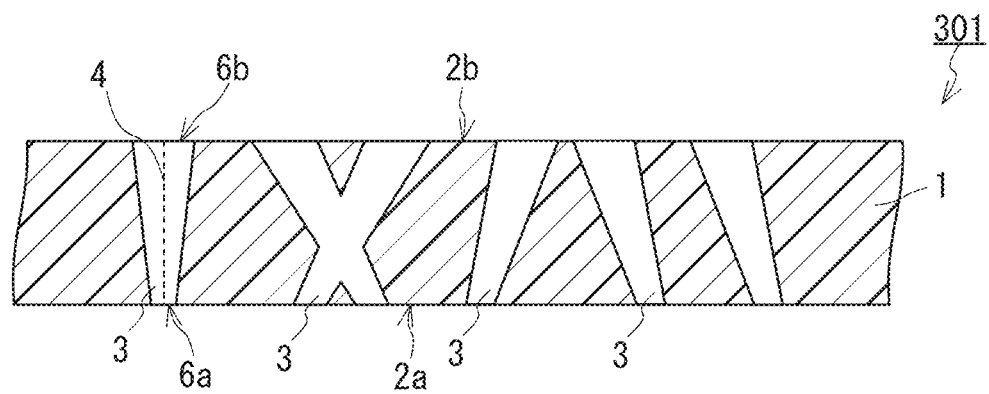
FIG. 31 is a cross-sectional view schematically showing another example of the optical film of the present invention.

For example, the optical film 301 can include the polymer film 1 as shown in FIG. 2 or 3 which has through holes 3 extending obliquely to the perpendicular direction to the principal surfaces 2a and 2b or can include the polymer film 1 as shown in FIG. 3 which has through holes 3 extending in different oblique directions. An example of the optical film 301 including the polymer film 1 having through holes 3 extending in different oblique directions is shown in FIG. 31. The optical film 301 can include the polymer film 1 as shown in FIG. 1 which has through holes 3 extending in the perpendicular direction to the principal surfaces 2a and 2b.

The optical film 301 has two or more through holes 3. The through holes 3 can typically be separate from each other. In the optical film 301, two or more of the through holes 3 may connect to each other at the surfaces of, or in the interior of, the polymer film 1. The manner of the connection is not limited. For example, when the through holes 3 extend in the perpendicular direction to the principal surfaces 2a and 2b of the polymer sheet 1, the openings of the through holes 3 at the one principal surface 2a can be separate from each other while the openings at the other principal surface 2b can be continuous with each other, since the opening diameter differs between the principal surfaces 2a and 2b.

The optical film 301 may include two or more polymer films 1. Such an optical film 301 can be formed, for example, by ion beam irradiation and chemical etching of a stack of two or more original films. The optical film 301 preferably includes one polymer film 1; in this case, the need for alignment of polymer films 1 to be stacked is eliminated, and a thickness reduction of the optical film 301 can be achieved.

The optical film of the present invention can include an additional layer in addition to the polymer film 1. When the through-thickness gas permeability and sound permeability are unnecessary, the openings 6a and/or 6b of the through holes 3 of the polymer film 1 may be covered by the additional layer.

The optical film 301 can contain a material other than a resin (polymer). The material can be contained, for example, in the interior of the polymer film 1. Examples of the material include: additives such as a light stabilizer and an antioxidant; oligomer components derived from the material of the polymer film 1; and metal oxides (specific examples of which include white pigments such as alumina and titanium oxide). It should be understood that the optical film 301 can contain none of these materials or, for example, can be free of any of these materials that is contained in the interior of the polymer film 1.

The applications of the optical film of the present invention are not particularly limited, and the optical film can be used in various optics applications in which conventional optical films have been used. Specific examples of the optics applications include: various displays for use in electronic paper, personal computer monitors, laptop computers, copying machines, mobile phones (including smartphones and tablet PCs), timepieces, digital cameras, portable information terminals (PDAs), portable game consoles, video cameras, televisions, microwave ovens, back monitors, monitors for car navigation systems, car audio systems, monitors for nursing purposes, and monitors for medical purposes; polarizing plates; optical lenses; and lighting members. Examples of the displays include a liquid crystal display (LCD) and an organic EL display. When used in a display, the optical film of the present invention can be incorporated within the display or can be placed on the surface of the display. The optical film of the present invention can be in the form of any of various functional films such as a polarizer-protecting film, phase difference film, and viewing angle-widening film for use in displays. The front and back sides of the optical film of the present invention can be used for different purposes, respectively, due to the difference in reflectance.

The method for producing the optical film 301 including the polymer film 1 having the through holes 3 is not particularly limited.

The method for producing the polymer film 1 is as described above. The polymer film 1 obtained by the method may be used per se as the optical film 301, or may be subjected to an additional step such as a step of a treatment or placement of various layers and then the resulting film may be used as the optical film 301.

An optical member of the present invention includes the optical film of the present invention. The configuration of the optical member of the present invention is not limited as long as the optical member includes the optical film of the present invention. The optical member of the present invention can have a configuration in which the optical film of the present invention and an additional member are joined together. The additional member is not particularly limited. The additional member can be an optical member such as an optical film different from the optical film of the present invention.

A composition of the present invention includes ground pieces of the optical film of the present invention. This composition can show optical properties attributed to the ground pieces of the optical film of the present invention. Specific examples of the optical properties include random reflection (gloss), high reflectance, and play of color attributed to the fact that the composition contains ground pieces whose reflectance differs between their front and back sides.

The constitution of the composition of the present invention is not limited as long as the composition contains ground pieces of the optical film of the present invention. The composition of the present invention can contain a material other than the ground pieces. The application of the composition of the present invention is not limited, and the application is, for example, a paint composition or cosmetic composition.

The method for obtaining the ground pieces of the optical film of the present invention is not limited. An example of methods that can be used is to optionally cut the optical film with a cutter, and then grind the film with a grinder. The type of the grinder is not limited, and examples include: shear grinders such as a biaxial rotation shear crusher and a uniaxial rotation shear crusher; impact grinders such as a hammer mill and an impact crusher; and shredders. The size of the ground pieces is not particularly limited and can be adjusted depending on the type of the composition.

EXAMPLES

Hereinafter, the present invention will be described in more detail by way of examples. The present invention is not limited to the examples given below.

[Examples of Waterproof Sound-Permeable Membrane]

First, the methods for evaluation of polymer films and waterproof sound-permeable membranes fabricated in Examples and Comparative Examples will be described.

(Opening Diameter of Through Holes)

Both principal surfaces of each polymer film were observed with a scanning electron microscope (SEM), 10 through holes were randomly selected from those captured in the SEM image obtained for each principal surface, and the opening diameters of the selected through holes were determined on the basis of the image. The average of the opening diameters was determined as the opening diameter of the through holes in the polymer film.

(Opening Area Ratio)

The opening area ratio of each principal surface of each polymer film was determined through image processing of a SEM image obtained by SEM observation of the principal surface. The opening area ratio refers to the ratio (%) of the sum of the areas of the openings of the through holes lying in the observed portion of the principal surface to the area of the observed portion.

(Gas Permeability)

The through-thickness gas permeability was determined for each waterproof sound-permeable membrane according to JIS L 1096 (Method A of gas permeability measurement: Frazier method).

(Water Entry Pressure)

The water entry pressure was determined for each waterproof sound-permeable membrane according to Method B (high hydraulic pressure method) of water penetration test specified in JIS L 1092. If a test piece of the membrane has an area specified in this standard, the membrane undergoes a significant change in shape. Thus, in order to reduce the change in shape of the membrane to some extent, a stainless steel mesh (opening diameter=2 mm) was placed on one side of the membrane opposite to its surface subjected to pressure, and in this state the measurement was performed.

(Hole Density)

The hole density of each polymer film was determined by observing both principal surfaces of the film with a SEM, visually counting the number of the through holes captured in the obtained SEM images, and converting the counted number to the number per unit area. In capturing the SEM images, the field of view was set to allow the outlines of the openings to be included in the images as fully as possible. In the captured area, adjacent openings continuous with each other and openings having a portion lying outside the boundary of the captured image were excluded from the evaluation of the opening diameter and hole density (Oil Repellency)

The oil repellency of each waterproof sound-permeable membrane was evaluated as follows. The waterproof sound-permeable membrane and a sheet of copy paper (regular paper) were stacked in such a manner that the waterproof sound-permeable membrane formed an upper layer and the sheet of copy paper formed an under layer. A drop of castor oil was applied to the waterproof sound-permeable membrane with a dropper, and the stack was then left for 1 minute. The waterproof sound-permeable membrane was then removed, and the condition of the sheet of copy paper was checked. In the case where the sheet of copy paper was wet with the castor oil, the waterproof sound-permeable membrane was determined to lack oil repellency, while in the case where the sheet of copy paper was not wet, the waterproof sound-permeable membrane was determined to possess oil repellency (Acoustic Property)

The acoustic properties (including sound pressure loss) was evaluated for each fabricated waterproof sound-permeable membrane as a measure of its sound permeability. The evaluation method was as follows.

Figure 32A:
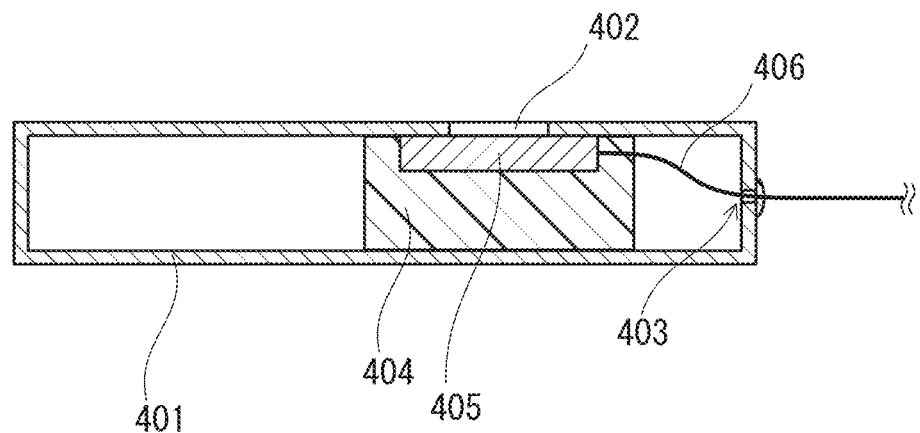
FIG. 32A is a cross-sectional view schematically showing: a simulated housing used for evaluation of sound pressure loss caused by waterproof sound-permeable membranes in Examples; and how a speaker is placed in the housing.

First, as shown in FIG. 32A, a simulated housing 401 (made of polystyrene and having outer dimensions of 60 mm×50 mm×28 mm) imitating a housing of a mobile phone was prepared. The simulated housing 401 was provided with one speaker attachment hole 402 (having the shape of a circle of 2.5 mm diameter) serving as an opening for allowing sound output from a speaker to be transmitted to the outside of the housing and with one guide hole 403 for a speaker cable. The housing had no openings other than these holes. Next, a speaker 405 (SCG-16A, manufactured by STAR MICRONICS CO., LTD) was embedded into a filler 404 made of urethane sponge and having formed therein a sound passage hole having the shape of a circle of 5 mm diameter, and the filler 404 with the speaker 405 was placed inside the housing 401. The speaker cable 406 of the speaker 405 was led to the outside of the housing 401 through the guide hole 403, and then the guide hole 403 was filled with putty.

Figure 32B:
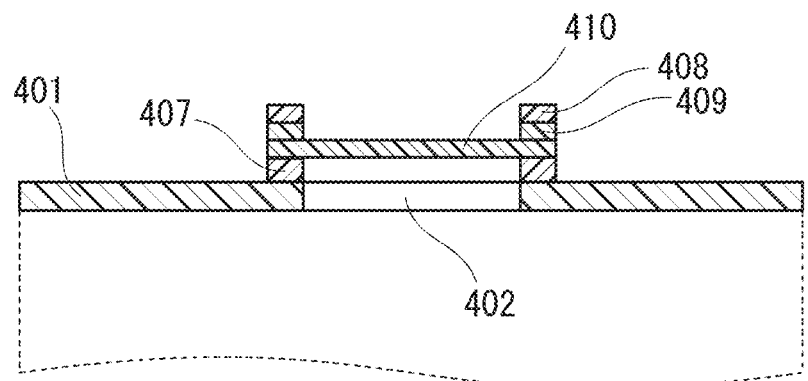
FIG. 32B is a cross-sectional view schematically showing: a waterproof sound-permeable member prepared for evaluation of sound pressure loss caused by waterproof sound-permeable membranes in Examples; and a state where the member is attached to a simulated housing.

Next, a double-sided tape 407 (manufactured by NITTO DENKO CORPORATION, identified as No. 57120B, and having a thickness of 0.2 mm) made of a polyethylene foam, a PET film 408 (having a thickness of 0.1 mm), and a double-sided tape 409 (manufactured by NITTO DENKO CORPORATION, identified as No. 5603, and having a thickness of 0.03 mm) made of PET were prepared. Two ring-shaped pieces, one of which had an inner diameter of 2.5 mm and an outer diameter of 5.8 mm and the other of which had an inner diameter of 1.0 mm and an outer diameter of 5.8 mm, were punched from each of the prepared tapes and film. Additionally, circular pieces having a diameter of 5.8 mm were punched from each of the waterproof sound-permeable membranes 410 fabricated in Examples and Comparative Examples. Next, the ring-shaped piece of the double-sided tape 407 having an inner diameter of 2.5 mm, the circular piece of the waterproof sound-permeable membrane 410, the ring-shaped piece of the double-sided tape 409 having an inner diameter of 2.5 mm, and the ring-shaped piece of the PET film 408 having an inner diameter of 2.5 mm were stacked in this order in such a manner that their entire outer peripheries exactly overlapped each other. Thus, a waterproof sound-permeable member A (in which the waterproof sound-permeable membrane had an effective area of 4.9 mm$^2$) for acoustic property evaluation was prepared (see FIG. 32B). Besides this, the ring-shaped piece of the double-sided tape 407 having an inner diameter of 1.0 mm, the circular piece of the waterproof sound-permeable membrane 410, the ring-shaped piece of the double-sided tape 409 having an inner diameter of 1.0 mm, and the ring-shaped piece of the PET film 408 having an inner diameter of 1.0 mm were stacked in this order in such a manner that their entire outer peripheries exactly overlapped each other. Thus, a waterproof sound-permeable member B (in which the waterproof sound-permeable membrane had an effective area of 0.8 mm$^2$) for acoustic property evaluation was prepared.

Next, each of the waterproof sound-permeable members prepared was individually attached to the exterior of the simulated housing 401 by means of the polyethylene foam double-sided tape 407 of the member so that the waterproof sound-permeable membrane 410 fully covered the opening 402. This was done so that no gap was formed between the waterproof sound-permeable membrane 410 and the double-sided tape 407 and between the double-sided tape 407 and the simulated housing 401.

Next, the speaker cable 406 and a microphone (Spm0405Hd4H-W8 manufactured by Knowles Acoustic) were connected to an acoustic evaluation system (Multi-analyzer System 3560-B-030 manufactured by B&K Sound & Vibration Measurement A/S), and the microphone was placed at a distance of 21 mm from the opening 402 of the simulated housing 401. Then, SSR analysis (test signals of 20 Hz to 10 kHz, sweep) was selected as an evaluation mode and carried out to evaluate the acoustic properties (THD and sound pressure loss) of the waterproof sound-permeable membrane 410. The sound pressure loss was automatically determined on the basis of the signal input to the speaker 405 from the acoustic evaluation system and the signal detected through the microphone. Additionally, a sound pressure loss in a blank state without the waterproof sound-permeable membrane was determined in the same manner, and a value obtained by subtracting the blank sound pressure loss from the sound pressure loss determined in the presence of the waterproof sound-permeable membrane was determined as the sound pressure loss (insertion loss) of the waterproof sound-permeable membrane. A smaller insertion loss can be considered to indicate better maintenance of the properties of sound transmitted through the waterproof sound-permeable membrane. This evaluation was carried out for both of the waterproof sound-permeable members A and B differing in membrane effective area which were prepared for each of the waterproof sound-permeable membranes fabricated in Examples and Comparative Examples.

Example 1

There was prepared a commercially-available non-porous PET film (Track-etched membrane manufactured by it4ip S.A. and having a thickness of 50 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes are straight holes that have a diameter of 0.25 μm and in which the area of a cross-section perpendicular to the direction of the central axis does not vary (is constant) in the thickness direction of the film; (2) the through holes extend in a perpendicular direction to the principal surfaces of the film; and (3) the hole density is $2.0 \times 10^6$ holes/cm$^2$.

Next, a polyethylene film (of 55 μm thickness) as a masking layer was attached to one principal surface of the prepared PET film with an acrylic adhesive. The PET film was then immersed in an etching solution (an aqueous solution of 20 mass % potassium hydroxide) held at 80° C. for 23 minutes. After the etching, the film was taken out of the etching solution, immersed and washed in RO water (water filtered through a reverse osmosis membrane), and then dried by a drying oven set at 50° C. After that, the masking layer was separated to obtain a polymer film 1 having through holes 3 formed therein.

The polymer film obtained in Example 1 was confirmed to have through holes having a shape in which the area of the cross-section perpendicular to the direction of the central axis increases from one principal surface (masked surface) toward the other principal surface (etched surface). The opening diameter of the through holes at the principal surfaces was 4.5 μm for the masked surface and 6.4 μm for the etched surface. The thickness of the film was 45 μm.

Next, a liquid-repellent treatment solution was applied to all the surfaces, including the two principal surfaces, of the fabricated polymer film 1, and then left to dry at ordinary temperature for 30 minutes to form a liquid-repellent layer 52 on the surfaces of the film 1 and on the inner peripheral surfaces of the through holes 3, thus obtaining a waterproof sound-permeable membrane 51. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 mass %.

For the waterproof sound-permeable membrane 51 thus obtained, the Frazier gas permeability was 15 cm$^3$/(cm$^2$·second), the water entry pressure was 20 kPa for the masked surface and 15 kPa for the etched surface, the oil repellency was "possessed", and the opening area ratio was 31.8% for the masked surface and 64.3% for the etched surface. The results of evaluation of these properties (excluding the results for the water entry pressure) are collectively shown in Table 1 below together with the evaluation results for the waterproof sound-permeable membranes fabricated in the other examples and comparative examples. In the cells for Examples 1 to 3 in Table 1, the value on the left of "/" represents the evaluation result for the masked surface, while the value on the right of "/" represents the evaluation result for the etched surface.

In addition, for the waterproof sound-permeable membrane 51 obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure. In the cells for Examples 1 to 3 in Table 2, the value on the left of "/" represents the (maximum) sound pressure loss or water entry pressure (water entry pressure for the masked surface) measured when the masked surface (the principal surface having the smaller-diameter openings of the through holes) of the polymer film 1 was directed to the outside of the simulated housing, while the value on the right of "/" represents the (maximum) sound pressure loss or water entry pressure (water entry pressure for the etched surface) measured when the etched surface (the principal surface having the larger-diameter openings of the through holes) of the polymer film 1 was directed to the outside of the simulated housing.

Comparative Example 1

A polymer film was obtained by performing chemical etching in the same manner as in Example 1, except for not placing a masking layer and changing the length of time of the chemical etching to 15 minutes. The opening diameter of the through holes at the principal surfaces of the polymer film thus obtained was 4.5 μm for both of the principal surfaces. The thickness of the film was 45 μm.

Next, the polymer film fabricated was subjected to a liquid-repellent treatment in the same manner as in Example 1. For the waterproof sound-permeable membrane thus obtained, the Frazier gas permeability was 8 cm$^3$/(cm$^2$·second), the water entry pressure was 20 kPa for both of the principal surfaces, the oil repellency was "possessed", and the opening area ratio was 31.8% for both of the principal surfaces.

In addition, for the waterproof sound-permeable membrane obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

Comparative Example 2

A polymer film was obtained by performing chemical etching in the same manner as in Example 1, except for not placing a masking layer and changing the length of time of the chemical etching to 20 minutes. The opening diameter of the through holes at the principal surfaces of the polymer film thus obtained was 6.0 μm for both of the principal surfaces. The thickness of the film was 45 μm.

Next, the polymer film fabricated was subjected to a liquid-repellent treatment in the same manner as in Example 1. For the waterproof sound-permeable membrane thus obtained, the Frazier gas permeability was 18 cm$^3$/(cm$^2$·second), the water entry pressure was 15 kPa for both of the principal surfaces, the oil repellency was "possessed", and the opening area ratio was 56.5% for both of the principal surfaces.

In addition, for the waterproof sound-permeable membrane obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

Example 2

A polymer film 1 was obtained by performing chemical etching in the same manner as in Example 1, except that the hole density of a commercially-available PET film prepared first was 4.0×10$^5$ holes/cm$^2$ and that the length of time of the chemical etching was changed to 35 minutes. The opening diameter of the through holes at the principal surfaces of the polymer film thus obtained was 10.0 μm for the masked surface and 12.5 μm for the etched surface. The thickness of the film was 45 μm.

Next, the polymer film fabricated was subjected to a liquid-repellent treatment in the same manner as in Example 1. For the waterproof sound-permeable membrane thus obtained, the Frazier gas permeability was 65 cm$^3$/(cm$^2$·second), the water entry pressure was 7 kPa for the masked surface and 5 kPa for the etched surface, the oil repellency was "possessed", and the opening area ratio was 31.4% for the masked surface and 49.1% for the etched surface.

In addition, for the waterproof sound-permeable membrane 51 obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

Comparative Example 3

A polymer film was obtained by performing chemical etching in the same manner as in Example 2, except for not placing a masking layer and changing the length of time of the chemical etching to 25 minutes. The opening diameter of the through holes at the principal surfaces of the polymer film thus obtained was 10.0 μm for both of the principal surfaces. The thickness of the film was 45 μm.

Next, the polymer film fabricated was subjected to a liquid-repellent treatment in the same manner as in Example 1. For the waterproof sound-permeable membrane thus obtained, the Frazier gas permeability was 50 cm$^3$/(cm$^2$·second), the water entry pressure was 7 kPa for both of the principal surfaces, the oil repellency was "possessed", and the opening area ratio was 31.0% for both of the principal surfaces.

In addition, for the waterproof sound-permeable membrane obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

Comparative Example 4

A polymer film was obtained by performing chemical etching in the same manner as in Example 2, except for not placing a masking layer and changing the length of time of the chemical etching to 33 minutes. The opening diameter of the through holes at the principal surfaces of the polymer film thus obtained was 12.5 μm for both of the principal surfaces. The thickness of the film was 45 μm.

Next, the polymer film fabricated was subjected to a liquid-repellent treatment in the same manner as in Example 1. For the waterproof sound-permeable membrane thus obtained, the Frazier gas permeability was 75 cm$^3$/(cm$^2$·second), the water entry pressure was 5 kPa for both of the principal surfaces, the oil repellency was "possessed", and the opening area ratio was 48.8% for both of the principal surfaces.

In addition, for the waterproof sound-permeable membrane obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

Example 3

A polymer film 1 was obtained by performing chemical etching in the same manner as in Example 1, except for changing the length of time of the chemical etching to 16 minutes. The opening diameter of the through holes at the principal surfaces of the polymer film thus obtained was 3.0 μm for the masked surface and 4.0 μm for the etched surface. The thickness of the film was 45 μm.

Next, the polymer film fabricated was subjected to a liquid-repellent treatment in the same manner as in Example 1. For the waterproof sound-permeable membrane thus obtained, the Frazier gas permeability was 4.5 cm$^3$/(cm$^2$·second), the water entry pressure was 35 kPa for the masked surface and 21 kPa for the etched surface, the oil repellency was "possessed", and the opening area ratio was 14.1% for the masked surface and 25.1% for the etched surface.

In addition, for the waterproof sound-permeable membrane 51 obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

Comparative Example 5

A polymer film was obtained by performing chemical etching in the same manner as in Example 3, except for not placing a masking layer and changing the length of time of the chemical etching to 12 minutes. The opening diameter of the through holes at the principal surfaces of the polymer film thus obtained was 3.0 μm for both of the principal surfaces. The thickness of the film was 45 μm.

Next, the polymer film fabricated was subjected to a liquid-repellent treatment in the same manner as in Example 1. For the waterproof sound-permeable membrane thus obtained, the Frazier gas permeability was 2.5 cm$^3$/(cm$^2$·second), the water entry pressure was 35 kPa for both of the principal surfaces, the oil repellency was "possessed", and the opening area ratio was 14.0% for both of the principal surfaces.

In addition, for the waterproof sound-permeable membrane obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

Comparative Example 6

A polymer film was obtained by performing chemical etching in the same manner as in Example 3, except for not placing a masking layer and changing the length of time of the chemical etching to 14 minutes. The opening diameter of the through holes at the principal surfaces of the polymer film thus obtained was 4.0 μm for both of the principal surfaces. The thickness of the film was 45 μm.

Next, the polymer film fabricated was subjected to a liquid-repellent treatment in the same manner as in Example 1. For the waterproof sound-permeable membrane thus obtained, the Frazier gas permeability was 5 cm$^3$/(cm$^2$·second), the water entry pressure was 21 kPa for both of the principal surfaces, the oil repellency was "possessed", and the opening area ratio was 26.5% for both of the principal surfaces.

In addition, for the waterproof sound-permeable membrane obtained as described above, the sound pressure losses at sound frequencies of 1 kHz and 3 kHz and the maximum sound pressure loss in the frequency range of 100 Hz to 3 kHz were measured. The results are shown in Table 2 below together with the results of measurement of the water entry pressure.

TABLE 1

| | Opening diameter/ μm | Gas permeability/ cm$^3$/(cm$^2$ · second) | Hole density/ holes/cm$^3$ |
|---|---|---|---|
| Example 1 | 4.5/6.4 | 15 | $2.0 \times 10^6$ |
| Comparative Example 1 | 4.5 | 8 | $2.0 \times 10^6$ |
| Comparative Example 2 | 6.0 | 18 | $2.0 \times 10^6$ |
| Example 2 | 10.0/12.5 | 65 | $4.0 \times 10^5$ |
| Comparative Example 3 | 10.0 | 50 | $4.0 \times 10^5$ |
| Comparative Example 4 | 12.5 | 75 | $4.0 \times 10^5$ |
| Example 3 | 3.0/4.0 | 4.5 | $2.0 \times 10^6$ |
| Comparative Example 5 | 3.0 | 2.5 | $2.0 \times 10^6$ |
| Comparative Example 6 | 4.0 | 5 | $2.0 \times 10^6$ |

TABLE 2

| | Water entry pressure/ kPa | Sound pressure loss (effective area: 4.9 mm²)/ dB | | | Sound pressure loss (effective are: 0.8 mm²)/ dB | | |
|---|---|---|---|---|---|---|---|
| | | 1 kHz | 3 kHz | 100 Hz to 3 kHz | 1 kHz | 3 kHz | 100 Hz to 3 kHz |
| Example 1 | 20/15 | 0/0 | 0.2/0.6 | 0.2/0.6 | 0.8/4.5 | 4.7/15.1 | 4.7/15.1 |
| Comparative Example 1 | 20 | 0 | 0.3 | 0.3 | 2.2 | 8.1 | 8.1 |
| Comparative Example 2 | 15 | 0 | 0.2 | 0.2 | 0.8 | 4.8 | 4.8 |
| Example 2 | 7/5 | 0/0 | 0/0.1 | 0/0.3 | 0.3/0.9 | 1.2/3.9 | 1.2/3.9 |
| Comparative Example 3 | 7 | 0 | 0.1 | 0.1 | 0.5 | 1.9 | 1.9 |
| Comparative Example 4 | 5 | 0 | 0 | 0 | 0.3 | 1 | 1 |
| Example 3 | 35/21 | 0/0 | 0.5/1.0 | 0.5/1.0 | 2.6/5.7 | 8.6/17.7 | 8.6/17.7 |
| Comparative Example 5 | 35 | 0 | 0.6 | 0.6 | 2.8 | 9.2 | 9.2 |
| Comparative Example 6 | 21 | 0 | 0.5 | 0.5 | 2.4 | 8.4 | 8.4 |

As shown in Table 2, when placed in such a manner that the masked surface of the polymer film 1 faced the outside of the housing, the waterproof sound-permeable membrane of Example 1 yielded a lower sound pressure loss than the waterproof sound-permeable membrane of Comparative Example 1 while exhibiting as high resistance to water entry from the outside of the housing as the waterproof sound-permeable membrane of Comparative Example 1. In particular, the decreasing effect on sound pressure loss was greater when the effective area of the waterproof sound-permeable membrane was smaller (when the effective area was 0.8 mm²). In addition, the waterproof sound-permeable membrane of Example 1, when placed in such a manner that the masked surface of the polymer film 1 faced the outside of the housing, exhibited higher resistance to water entry from the outside of the housing than the waterproof sound-permeable membrane of Comparative Example 2 while yielding as low a sound pressure loss as the waterproof sound-permeable membrane of Comparative Example 2. The same relationship was observed between Example 2 and Comparative Examples 3 and 4 and between Example 3 and Comparative Examples 5 and 6.

Examples of Waterproof Gas-Permeable Membrane

First, the methods for evaluation of polymer films and waterproof gas-permeable membranes fabricated in Examples and Comparative Examples will be described.

(Opening Diameter of Through Holes)

Both principal surfaces of each polymer film were observed with a scanning electron microscope (SEM), 10 through holes were randomly selected from those captured in the SEM image obtained for each principal surface, and the opening diameters of the selected through holes were determined on the basis of the image. The average of the opening diameters was determined as the opening diameter of the through holes in the polymer film.

(Gas Permeability)

The through-thickness gas permeability was determined for each waterproof gas-permeable membrane according to JIS L 1096 (Method A of gas permeability measurement: Gurley method).

(Water Entry Pressure)

The water entry pressure was determined for each waterproof gas-permeable membrane according to Method B (high hydraulic pressure method) of water penetration test specified in JIS L 1092. If a test piece of the membrane has an area specified in this standard, the membrane undergoes a significant change in shape. Thus, in order to reduce the change in shape of the membrane to some extent, a stainless steel mesh (opening diameter=2 mm) was placed on one side of the membrane opposite to its surface subjected to pressure, and in this state the measurement was performed.

(Hole Density)

The hole density of each polymer film was determined by observing both principal surfaces of the film with a SEM, visually counting the number of the through holes captured in the obtained SEM images, and converting the counted number to the number per unit area. In capturing the SEM images, the field of view was set to allow the outlines of the openings to be included in the images as fully as possible. In the captured area, adjacent openings continuous with each other and openings having a portion lying outside the boundary of the captured image were excluded from the evaluation of the opening diameter and hole density.

(Oil Repellency)

The oil repellency of each waterproof gas-permeable membrane was evaluated as follows. The waterproof gas-permeable membrane and a sheet of copy paper (regular paper) were stacked in such a manner that the waterproof gas-permeable membrane formed an upper layer and the sheet of copy paper formed an under layer. A drop of castor oil was applied to the waterproof gas-permeable membrane with a dropper, and the stack was then left for 1 minute. The waterproof gas-permeable membrane was then removed, and the condition of the sheet of copy paper was checked. In the case where the sheet of copy paper was wet with the castor oil, the waterproof gas-permeable membrane was determined to lack oil repellency, while in the case where the sheet of copy paper was not wet, the waterproof gas-permeable membrane was determined to possess oil repellency.

Example 11

There was prepared a commercially-available non-porous PET film (Track-etched membrane manufactured by it4ip S.A. and having a thickness of 50 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes are straight holes that have a diameter of 0.25 μm and in which the area of a cross-section perpendicular to the direction of the central axis does not vary (is constant) in the thickness direction of the film; (2) the through holes extend in a perpendicular direction to the principal surfaces of the film; and (3) the hole density is $2.0 \times 10^6$ holes/cm$^2$.

Next, a polyethylene film (of 55 μm thickness) as a masking layer was attached to one principal surface of the prepared PET film with an acrylic adhesive. The PET film was then immersed in an etching solution (an aqueous solution of 30 mass % ethanol and 10 mass % potassium hydroxide) held at 80° C. for 25 minutes. After the etching, the film was taken out of the etching solution, immersed and washed in RO water (water filtered through a reverse osmosis membrane), and then dried by a drying oven set at 50° C. After that, the masking layer was separated to obtain a polymer film 1 having through holes 3 formed therein.

Figure 33:
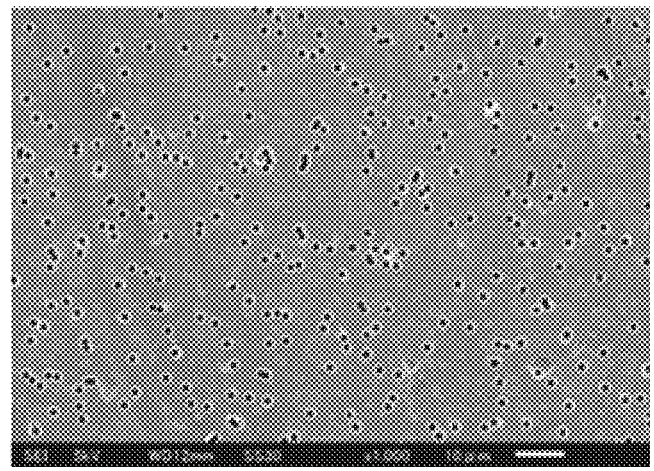
FIG. 33 shows a scanning electron microscope (SEM) image of one principal surface (masked surface) of a polymer film fabricated for use in the waterproof gas-permeable membrane of Example 11.
Figure 34:
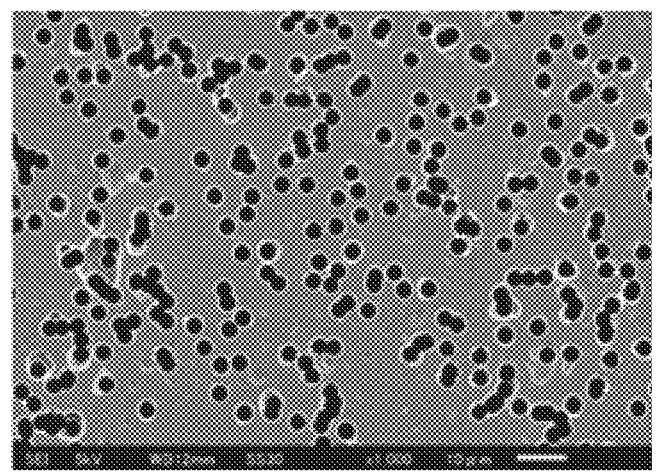
FIG. 34 shows a SEM image of the other principal surface (etched surface) of the polymer film fabricated for use in the waterproof gas-permeable membrane of Example 11.

FIGS. 33 and 34 show the conditions of the surfaces of the obtained polymer film 1 (images obtained by observation with a scanning electron microscope (SEM)). FIG. 33 shows the principal surface on which the masking layer was placed (masked surface), while FIG. 34 shows the principal surface on which no masking layer was placed (etched surface). The magnification was the same for FIGS. 33 and 34. As shown in FIGS. 33 and 34, the polymer film obtained in Example 11 was confirmed to have through holes having a shape in which the area of the cross-section perpendicular to the direction of the central axis increases from one principal surface (masked surface) toward the other principal surface (etched surface). The opening diameter of the through holes, as determined from the SEM images for the principal surfaces, was 1.6 μm for the masked surface and 3.2 μm for the etched surface. That is, the ratio a/b was 50%.

Next, a liquid-repellent treatment solution was applied to all the surfaces, including the two principal surfaces, of the fabricated polymer film 1, and then left to dry at ordinary temperature for 30 minutes to form a liquid-repellent layer 52 on the surfaces of the film 1 and on the inner peripheral surfaces of the through holes 3, thus obtaining a waterproof gas-permeable membrane 101. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 mass %.

For the waterproof gas-permeable membrane 101 thus obtained, the gas permeability (Gurley number) was 14 seconds, the water entry pressure was 25 kPa for the masked surface and 15 kPa for the etched surface, and the oil repellency was "possessed".

Example 12

A polymer film was obtained by performing chemical etching in the same manner as in Example 11, except for changing the etching solution used to an aqueous solution of 20 mass % ethanol and 15 mass % potassium hydroxide. The opening diameter of the through holes at the principal surfaces of the polymer film thus obtained was 4.0 μm for the masked surface and 5.0 μm for the etched surface. That is, the ratio a/b was 80%.

Next, the polymer film fabricated was subjected to a liquid-repellent treatment in the same manner as in Example 11. For the waterproof gas-permeable membrane thus obtained, the gas permeability (Gurley number) was 1.5 seconds, the water entry pressure was 13 kPa for the masked surface and 8 kPa for the etched surface, and the oil repellency was "possessed".

Comparative Example 11

A polymer film was obtained by performing chemical etching in the same manner as in Example 11, except for not placing a masking layer and changing the length of time of the chemical etching to 10 minutes. The opening diameter of the through holes at the principal surfaces of the polymer film thus obtained was 1.6 μm for both of the principal surfaces.

Next, the polymer film fabricated was subjected to a liquid-repellent treatment in the same manner as in Example 11. For the waterproof gas-permeable membrane thus obtained, the gas permeability (Gurley number) was 66 seconds, the water entry pressure was 25 kPa for both of the principal surfaces, and the oil repellency was "possessed".

Comparative Example 12

A polymer film was obtained by performing chemical etching in the same manner as in Example 11, except for not placing a masking layer and changing the length of time of the chemical etching to 20 minutes. The opening diameter of the through holes at the principal surfaces of the polymer film thus obtained was 3.2 μm for both of the principal surfaces.

Next, the polymer film fabricated was subjected to a liquid-repellent treatment in the same manner as in Example 11. For the waterproof gas-permeable membrane thus obtained, the gas permeability (Gurley number) was 6 seconds, the water entry pressure was 9 kPa for both of the principal surfaces, and the oil repellency was "possessed".

Comparative Example 13

A polymer film was obtained by performing chemical etching in the same manner as in Example 12, except for not placing a masking layer and changing the length of time of the chemical etching to 15 minutes. The opening diameter of the through holes at the principal surfaces of the polymer film thus obtained was 4.0 μm for both of the principal surfaces.

Next, the polymer film fabricated was subjected to a liquid-repellent treatment in the same manner as in Example 11. For the waterproof gas-permeable membrane thus obtained, the gas permeability (Gurley number) was 4.5 seconds, the water entry pressure was 13 kPa for both of the principal surfaces, and the oil repellency was "possessed".

Comparative Example 14

A polymer film was obtained by performing chemical etching in the same manner as in Example 12, except for not placing a masking layer and changing the length of time of the chemical etching to 23 minutes. The opening diameter of the through holes at the principal surfaces of the polymer film thus obtained was 5.0 μm for both of the principal surfaces.

Next, the polymer film fabricated was subjected to a liquid-repellent treatment in the same manner as in Example 11. For the waterproof gas-permeable membrane thus obtained, the gas permeability (Gurley number) was 0.5 seconds, the water entry pressure was 9 kPa for both of the principal surfaces, and the oil repellency was "possessed".

[Examples of Suction Sheet]

First, the methods for evaluation of suction sheets fabricated in Examples and Comparative Examples will be described.

(Opening Diameter of Through Holes)

Both principal surfaces of each suction sheet were observed with a SEM (JSM-6510 LV, manufactured by JEOL Ltd.), 10 through holes were randomly selected from those captured in the SEM image obtained for each principal surface, and the opening diameters of the selected through holes were determined on the basis of the image. The average of the opening diameters was determined as the opening diameter of the through holes in the suction sheet.

(Hole Density)

The hole density of each suction sheet was determined by observing both principal surfaces of the sheet with a SEM, visually counting the number of the through holes captured in the obtained SEM images, and converting the counted number to the number per unit area. In capturing the SEM images, the field of view was set to allow the outlines of the openings to be included in the images as fully as possible. In the captured area, adjacent openings continuous with each other and openings having a portion lying outside the boundary of the captured image were excluded from the evaluation of the opening diameter and hole density.

(Surface Roughness)

The surface roughness (arithmetic average roughness Ra) of each suction sheet was evaluated using a stylus-based surface roughness meter (SURFCOM 550A manufactured by TOKYO SEIMITSU CO., LTD.). The measurement conditions were such that the tip radius R of the measurement stylus was 250 µm, the measurement speed was 0.3 mm/second, and the measurement length was 4 mm.

(Gas Permeability)

The through-thickness gas permeability of each suction sheet was determined according to JIS L 1096 using a Gurley type densometer (manufactured by YASUDA SEIKI SEISAKUSHO, LTD.) or an Oken type air permeability tester (EG02-S manufactured by ASAHI SEIKO CO., LTD.).

Example 21

There was prepared a commercially-available non-porous PET film (Track etched membrane manufactured by it4ip S.A. and having a thickness of 25 µm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 0.2 µm.

(2) The film has through holes extending in a perpendicular direction to the principal surfaces of the film.

(3) The hole density of the film is $5.7 \times 10^7$ holes/cm$^2$.

Next, a polyethylene film (of 55 µm thickness) as a masking layer was attached to one principal surface of the prepared PET film with a silicone adhesive. The PET film was then immersed in an etching solution (an aqueous solution of 25 mass % ethanol and 10 mass % potassium hydroxide) held at 75° C. for 20 minutes. After the etching, the film was taken out of the etching solution, immersed and washed in RO water (water filtered through a reverse osmosis membrane), and then dried by a drying oven set at 50° C. After that, the masking layer was separated to obtain a polymer film 1 having asymmetrical through holes 3 formed therein.

This polymer film 1 was regarded as a suction sheet, and the suction sheet was evaluated for the thickness, the hole density, the opening diameters, the surface roughness (Ra) of the masked surface, and the through-thickness gas permeability (Gurley number). The evaluation results are shown in Table 3.

Example 22

There was prepared a commercially-available non-porous PET film (Track etched membrane manufactured by it4ip S.A. and having a thickness of 50 µm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 1 µm.

(2) The film has through holes extending in a perpendicular direction to the principal surfaces of the film.

(3) The hole density of the film is $2 \times 10^5$ holes/cm$^2$.

Next, a polyethylene film (of 55 µm thickness) as a masking layer was attached to one principal surface of the prepared PET film with a silicone adhesive. The PET film was then immersed in an etching solution (an aqueous solution of 25 mass % ethanol and 10 mass % potassium hydroxide) held at 85° C. for 30 minutes. After the etching, the film was taken out of the etching solution, immersed and washed in RO water (water filtered through a reverse osmosis membrane), and then dried by a drying oven set at 50° C. After that, the masking layer was separated to obtain a polymer film 1 having asymmetrical through holes 3 formed therein.

This polymer film 1 was regarded as a suction sheet, and the suction sheet was evaluated for the thickness, the hole density, the opening diameters, the surface roughness (Ra) of the masked surface, and the through-thickness gas permeability (Gurley number). The evaluation results are shown in Table 3.

Example 23

There was prepared a commercially-available non-porous PET film (Track etched membrane manufactured by it4ip S.A. and having a thickness of 50 µm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 1 µm.

(2) The film has through holes extending in a perpendicular direction to the principal surfaces of the film.

(3) The hole density of the film is $2 \times 10^6$ holes/cm$^2$.

Next, a polyethylene film (of 55 µm thickness) as a masking layer was attached to one principal surface of the prepared PET film with a silicone adhesive. The PET film was then immersed in an etching solution (an aqueous solution of 25 mass % ethanol and 10 mass % potassium hydroxide) held at 85° C. for 25 minutes. After the etching, the film was taken out of the etching solution, immersed and washed in RO water (water filtered through a reverse osmosis membrane), and then dried by a drying oven set at 50° C. After that, the masking layer was separated to obtain a polymer film 1 having asymmetrical through holes 3 formed therein.

This polymer film 1 was regarded as a suction sheet, and the suction sheet was evaluated for the thickness, the hole density, the opening diameters, the surface roughness (Ra) of the masked surface, and the through-thickness gas permeability (Gurley number). The evaluation results are shown in Table 3.

Comparative Example 21

There was prepared a commercially-available non-porous PET film (Track etched membrane manufactured by it4ip S.A. and having a thickness of 24 μm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 0.6 μm.
(2) The film has through holes extending in a perpendicular direction to the principal surfaces of the film.
(3) The hole density of the film is $5.7 \times 10^7$ holes/cm$^2$.

This film was regarded as a suction sheet, and the suction sheet was evaluated for the thickness, the hole density, the opening diameters, the surface roughness (Ra), and the through-thickness gas permeability (Gurley number). The evaluation results are shown in Table 3.

Comparative Example 22

There was prepared a commercially-available non-porous PET film (Track etched membrane manufactured by it4ip S.A. and having a thickness of 25 μm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 0.4 μm.
(2) The film has through holes extending in a perpendicular direction to the principal surfaces of the film.
(3) The hole density of the film is $5.7 \times 10^7$ holes/cm$^2$.

Next, a polyethylene film (of 55 μm thickness) as a masking layer was attached to one principal surface of the prepared PET film with a silicone adhesive. The PET film was then immersed in an etching solution (an aqueous solution of 23 mass % ethanol and 10 mass % potassium hydroxide) held at 75° C. for 10 minutes. After the etching, the film was taken out of the etching solution, immersed and washed in RO water (water filtered through a reverse osmosis membrane), and then dried by a drying oven set at 50° C. After that, the masking layer was separated to obtain a polymer film having asymmetrical through holes formed therein.

This polymer film was regarded as a suction sheet, and the suction sheet was evaluated for the thickness, the hole density, the opening diameters, the surface roughness (Ra) of the masked surface, and the through-thickness gas permeability (Gurley number). The evaluation results are shown in Table 3.

Comparative Example 23

There was prepared a commercially-available non-porous PET film (Track etched membrane manufactured by it4ip S.A. and having a thickness of 42 μm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 15 μm.
(2) The film has through holes extending in a perpendicular direction to the principal surfaces of the film.
(3) The hole density of the film is $1 \times 10^5$ holes/cm$^2$.

This film was regarded as a suction sheet, and the suction sheet was evaluated for the thickness, the hole density, the opening diameters, the surface roughness (Ra), and the gas permeability (Gurley number). The evaluation results are shown in Table 3.

TABLE 3

| | Thickness (μm) | Hole density (holes/cm$^2$) | Opening diameters of sheet (μm) | | Opening diameter ratio (%) | Surface roughness Ra (μm) | Gas permeability (seconds/100 mL) |
| | | | One principal surface | Other principal surface | | | |
|---|---|---|---|---|---|---|---|
| Example 21 | 23 | 5.70E+07 | 0.6 | 1.2 | 50 | 0.13 | 2.9 |
| Example 22 | 44 | 2.00E+05 | 8 | 15 | 53 | 1.20 | 0.05 |
| Example 23 | 46 | 2.00E+06 | 3 | 5 | 60 | 0.92 | 0.4 |
| Comparative Example 21 | 24 | 5.70E+07 | 0.6 | 0.6 | 100 | 0.13 | 12.2 |
| Comparative Example 22 | 24 | 5.70E+07 | 0.6 | 0.7 | 86 | 0.13 | 10.5 |
| Comparative Example 23 | 42 | 1.00E+05 | 15 | 15 | 100 | 3.00 | 0.05 |

In Examples, the opening diameter at the one principal surface corresponds to the opening diameter a, the opening diameter at the other principal surface corresponds to the opening diameter b, and the opening diameter ratio corresponds to the ratio a/b.
The surface roughness Ra in Comparative Examples 21 and 23 is Ra of either of the principal surfaces (Ra is the same for both of the principal surfaces in Comparative Examples 21 and 23).

an ion beam and chemically etching the irradiated film. SEM observation of the surfaces and a cross-section of this film confirmed the following.

As shown in Table 3, in Example 21 where a polymer film 1 having through holes 3 that are through holes of asymmetrical shape and in which the opening diameter ratio a/b is 80% or less was used as a suction sheet, a much higher through-thickness gas permeability was achieved than in Comparative Examples 21 and 22 where the opening diameter at the one principal surface was equal (0.6 μm) to that in Example 1. The gas permeability in Example 22 was equal to the gas permeability in Comparative Example 23 where the opening diameter was as large as 15 μm. By virtue of the very small opening diameter a at the one principal surface, the suction sheet of Example 21 makes it possible to prevent damage to a workpiece during suction holding of the workpiece while achieving a high through-thickness gas permeability. The suction sheets of Examples 22 and 23, in which the opening diameter a was not more than 10 μm, exerted an even higher gas permeability. The suction sheets of Examples 22 and 23 also make it possible to prevent damage to a workpiece during suction holding of the workpiece while achieving a high through-thickness gas permeability, by virtue of the small opening diameter a at the one principal surface.

[Examples of Optical Film]

First, the methods for evaluation of optical films fabricated in Examples and Comparative Examples will be described.

(Opening Diameter of Through Holes)

Both principal surfaces (front and back sides) of each optical film were observed with a SEM (JSM-6510 LV, manufactured by JEOL Ltd.), 10 through holes were randomly selected from those captured in the SEM image obtained for each principal surface, and the opening diameters of the selected through holes were determined on the basis of the image. The average of the opening diameters was determined as the opening diameter of the through holes in the optical film.

(Hole Density)

The hole density of each optical film was determined by observing both principal surfaces of the film with a SEM, visually counting the number of the through holes captured in the obtained SEM images, and converting the counted number to the number per unit area. In capturing the SEM images, the field of view was set to allow the outlines of the openings to be included in the images as fully as possible. In the captured area, adjacent openings continuous with each other and/or openings having a portion lying outside the boundary of the captured image were excluded from the evaluation of the opening diameter, the hole density, and the opening area ratio.

(Opening Area Ratio)

To determine the opening area ratio for each optical film, both principal surfaces of the film were observed with a SEM, and the number of through holes captured in each obtained SEM image was visually counted. Next, the opening area was calculated for the counted through holes by using the opening diameter separately determined by the method described above. The opening area ratio of each principal surface was determined using the following formula from the number of the through holes, the opening area ($\mu m^2$), and the area S ($\mu m^2$) of the film corresponding to the area of the field of view of the SEM image.

Opening area ratio (%)={(Opening area×Number of through holes)/Film area $S$}×100(%)

(Optical Property)

The reflectance (light reflectance) of each principal surface of each optical film was evaluated as an optical property of the optical film. Specifically, the reflectance was determined by an ultraviolet-visible spectrophotometer (V-560 manufactured by JASCO Corporation, double beam spectrophotometer incorporating a photomultiplier tube as a detector) equipped with an integrating sphere unit (ISV-469 manufactured by JASCO Corporation). The measurement wavelength was set to the range of 300 to 800 nm, and a barium sulfate plate was used as a standard reflection plate. The determined reflectance was an average of values of reflectance for light having wavelengths of 300 to 800 nm and was a relative value calculated with respect to the reflectance of the standard reflection plate which was defined as 100.

Example 31

There was prepared a commercially-available non-porous PET film (Track etched membrane manufactured by it4ip S.A. and having a thickness of 50 μm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 0.25 μm.
(2) The film has through holes extending in a perpendicular direction to the principal surfaces of the film.
(3) The hole density of the film is $2.0 \times 10^6$ holes/$cm^2$.

Next, a polyethylene film (of 55 μm thickness) as a masking layer was attached to one principal surface of the prepared PET film with an acrylic adhesive. The PET film was then immersed in an etching solution (an aqueous solution of 20 mass % potassium hydroxide) held at 80° C. for 23 minutes. After the etching, the film was taken out of the etching solution, immersed and washed in RO water (water filtered through a reverse osmosis membrane), and then dried by a drying oven set at 50° C. After that, the masking layer was separated to obtain a polymer film 1 having asymmetrical through holes 3 formed therein.

This polymer film 1 was regarded as an optical film, and the optical film was evaluated for the opening diameters, opening area ratios, and reflectances of both principal surfaces. Using the results of the evaluation of the opening diameters and opening area ratios, the ratio between the opening diameters of the two principal surfaces and the ratio between the opening area ratios of the two principal surfaces were calculated. The evaluation results are shown in Table 4. The opening diameter at the surface on which the masking layer was placed for etching was smaller than the opening diameter at the other surface on which no masking layer was placed.

Example 32

A polymer film 1 having asymmetrical through holes 3 formed therein was obtained in the same manner as in Example 31, except for changing the length of time of immersion in the etching solution to 20 minutes. This polymer film 1 was regarded as an optical film, and the optical film was evaluated for the opening diameters, opening area ratios, and reflectances of both principal surfaces. Using the results of the evaluation of the opening diameters and opening area ratios, the ratio between the opening diameters of the two principal surfaces and the ratio between the opening area ratios of the two principal surfaces were calculated. The evaluation results are shown in Table 4.

Example 33

A polymer film 1 having asymmetrical through holes 3 formed therein was obtained in the same manner as in Example 31, except for changing the length of time of immersion in the etching solution to 10 minutes. This polymer film 1 was regarded as an optical film, and the optical film was evaluated for the opening diameters, opening area ratios, and reflectances of both principal surfaces. Using the results of the evaluation of the opening diameters and opening area ratios, the ratio between the opening diameters of the two principal surfaces and the ratio between the opening area ratios of the two principal surfaces were calculated. The evaluation results are shown in Table 4.

Comparative Example 31

There was prepared a commercially-available non-porous PET film (Track etched membrane manufactured by it4ip S.A. and having a thickness of 50 μm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 0.25 μm.
(2) The film has through holes extending in a perpendicular direction to the principal surfaces of the film.
(3) The hole density of the film is $2.0 \times 10^6$ holes/cm$^2$.

Next, the prepared PET film was immersed in an etching solution (an aqueous solution of 20 mass % potassium hydroxide) held at 80° C. for 20 minutes without placing any masking layer. After the etching, the film was taken out of the etching solution, immersed and washed in RO water, and then dried by a drying oven set at 50° C. to obtain a polymer film.

This polymer film was regarded as an optical film, and the optical film was evaluated for the opening diameters, opening area ratios, and reflectances of both principal surfaces. Using the results of the evaluation of the opening diameters and opening area ratios, the ratio between the opening diameters of the two principal surfaces and the ratio between the opening area ratios of the two principal surfaces were calculated. The evaluation results are shown in Table 4.

Comparative Example 32

There was prepared a commercially-available non-porous PET film (Track etched membrane manufactured by it4ip S.A. and having a thickness of 50 μm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 0.25 μm.
(2) The film has through holes extending in a perpendicular direction to the principal surfaces of the film.
(3) The hole density of the film is $2.0 \times 10^6$ holes/cm$^2$.

Next, the prepared PET film was immersed in an etching solution (an aqueous solution of 20 mass % potassium hydroxide) held at 80° C. for 23 minutes without placing any masking layer. After the etching, the film was taken out of the etching solution, immersed and washed in RO water, and then dried by a drying oven set at 50° C. to obtain a polymer film.

This polymer film was regarded as an optical film, and the optical film was evaluated for the opening diameters, opening area ratios, and reflectances of both principal surfaces. Using the results of the evaluation of the opening diameters and opening area ratios, the ratio between the opening diameters of the two principal surfaces and the ratio between the opening area ratios of the two principal surfaces were calculated. The evaluation results are shown in Table 4.

Comparative Example 33

There was prepared a commercially-available non-porous PET film (Track etched membrane manufactured by it4ip S.A. and having a thickness of 50 μm) having through holes formed to extend through the thickness of the film. This film is one produced by irradiating an imperforate PET film with an ion beam and chemically etching the irradiated film. SEM observation of the surfaces and a cross-section of this film confirmed the following.

(1) The through holes are straight holes having a diameter of 0.25 μm.
(2) The film has through holes extending in a perpendicular direction to the principal surfaces of the film.
(3) The hole density of the film is $2.0 \times 10^6$ holes/cm$^2$.

Next, a polyethylene film (of 55 μm thickness) as a masking layer was attached to one principal surface of the prepared PET film with an acrylic adhesive. The PET film was then immersed in an etching solution (an aqueous solution of 20 mass % potassium hydroxide) held at 80° C. for 5 minutes. After the etching, the film was taken out of the etching solution, immersed and washed in RO water, and then dried by a drying oven set at 50° C. After that, the masking layer was separated to obtain a polymer film that had asymmetrical through holes but in which the ratio between the opening diameter of the through holes at one principal surface and the opening diameter of the through holes at the other principal surface was not less than 80%.

This polymer film was regarded as an optical film, and the optical film was evaluated for the opening diameters, opening area ratios, and reflectances of both principal surfaces. Using the results of the evaluation of the opening diameters and opening area ratios, the ratio between the opening diameters of the two principal surfaces and the ratio between the opening area ratios of the two principal surfaces were calculated. The evaluation results are shown in Table 4.

In the cells for the opening diameter, opening area ratio, and reflectance in Table 4, the values on the left of "/" represent the properties determined for one principal surface (the surface on which a masking layer was placed for etching in Examples 31 to 33 and Comparative Example 33), while the values on the right of "/" represent the properties determined for the other principal surface (the surface on which no masking layer was placed for etching in Examples 31 to 33 and Comparative Example 33). In the cell for the ratio between opening diameters and the ratio between opening area ratios in Table 4, the values represent the ratios of the values of the properties determined for the one principal surface to the values of the properties determined for the other principal surface.

TABLE 4

|  | Opening diameter (μm) | Opening area ratio (%) | Ratio between opening diameters (%) | Ratio between opening area ratios (%) | Reflectance (%) |
| --- | --- | --- | --- | --- | --- |
| Example 31 | 4.7/6.3 | 34.7/62.3 | 74.6 | 55.7 | 16/20 |
| Example 32 | 4.1/5.4 | 26.4/45.8 | 75.9 | 57.6 | 15/18 |

TABLE 4-continued

|  | Opening diameter (μm) | Opening area ratio (%) | Ratio between opening diameters (%) | Ratio between opening area ratios (%) | Reflectance (%) |
|---|---|---|---|---|---|
| Example 33 | 2.8/3.6 | 12.3/20.3 | 77.8 | 60.6 | 14/17 |
| Comparative Example 31 | 4.6/4.7 | 33.2/34.7 | 97.9 | 95.7 | 14/14 |
| Comparative Example 32 | 6.2/6.3 | 60.4/62.3 | 98.4 | 97.0 | 16/16 |
| Comparative Example 33 | 1.2/1.5 | 2.3/3.5 | 80.0 | 65.7 | 11/12 |

As shown in Table 4, in the optical films of Examples 31 to 33, the reflectance was significantly different between the two principal surfaces. By contrast, in the optical films of Comparative Examples 31 to 33, the reflectance was equal or substantially equal for the two principal surfaces. When the optical film of Example 31 and the optical films of Comparative Examples 31 and 32 are compared in terms of the reflectance of their principal surfaces for which the opening diameters of the through holes were equal, it is seen that the reflectance of the optical film of Example 31 was higher. Specifically, the reflectance of the principal surface having an opening diameter of 4.7 μm was 16% in Example 31, while in Comparative Example 31 the reflectance of the principal surface having an opening diameter of 4.7 μm was only 14%. The reflectance of the principal surface having an opening diameter of 6.3 μm was 20% in Example 31, while in Comparative Example 32 the reflectance of the principal surface having an opening diameter of 6.3 μm was only 16%.

Figure 35:
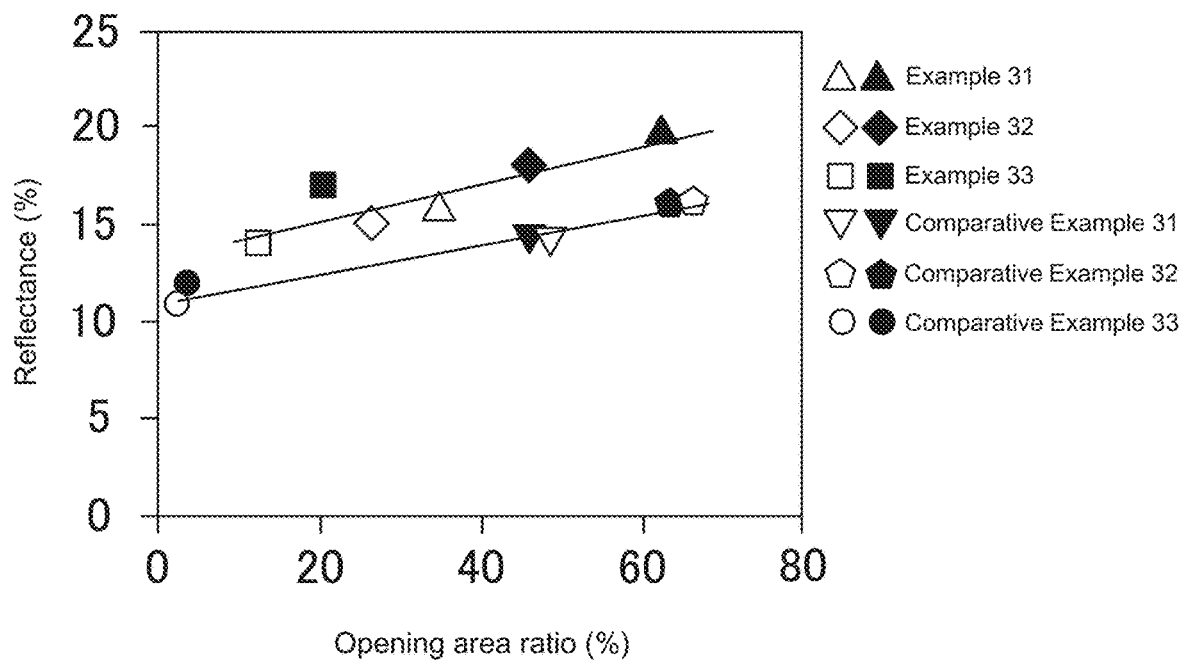
FIG. 35 is a graph showing the relationship of reflectance versus opening area ratio for optical films of Examples 31 to 33 and Comparative Examples 31 to 33 which were evaluated as examples of optical films.

FIG. 35 shows the relationship of the reflectance of each principal surface versus the opening area ratio of the principal surface collectively for the optical films of Examples 31 to 33 and Comparative Examples 31 to 33. In FIG. 35, the white symbols each represent the one principal surface, while the black symbols each represent the other principal surface. As shown in FIG. 35, the optical films of Examples had higher reflectance than the optical films of Comparative Examples when the opening area ratios were equal.

Figure 36:
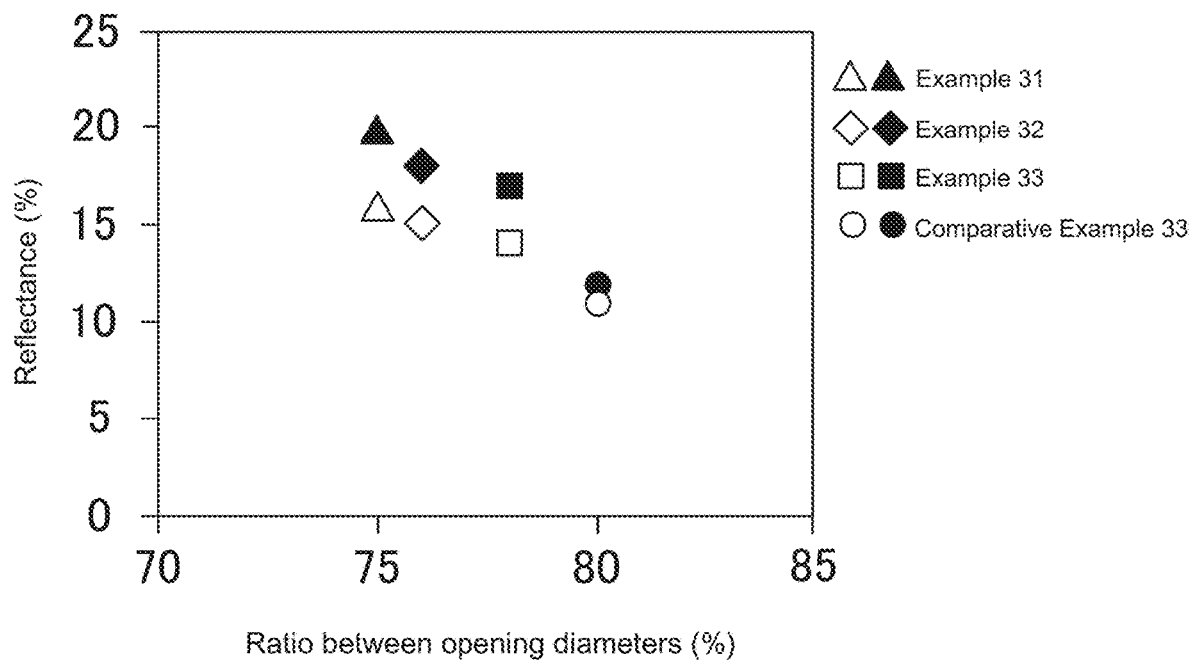
FIG. 36 is a graph showing the relationship of reflectance versus opening diameter ratio for optical films of Examples 31 to 33 and Comparative Example 33 which were evaluated as examples of optical films.

FIG. 36 shows the relationship of the reflectance of each principal surface versus the ratio between the opening diameters at the two principal surfaces collectively for the optical films of Examples 31 to 33 and Comparative Example 33. In FIG. 36, the white symbols each represent the one principal surface, while the black symbols each represent the other principal surface. As shown in FIG. 36, the reflectance of each principal surface of the optical film increased as the ratio between opening diameters decreased below 80%. When the ratio between opening diameters was less than 80%, there was a significant difference in reflectance between the two principal surfaces of the optical film.

Figure 37:
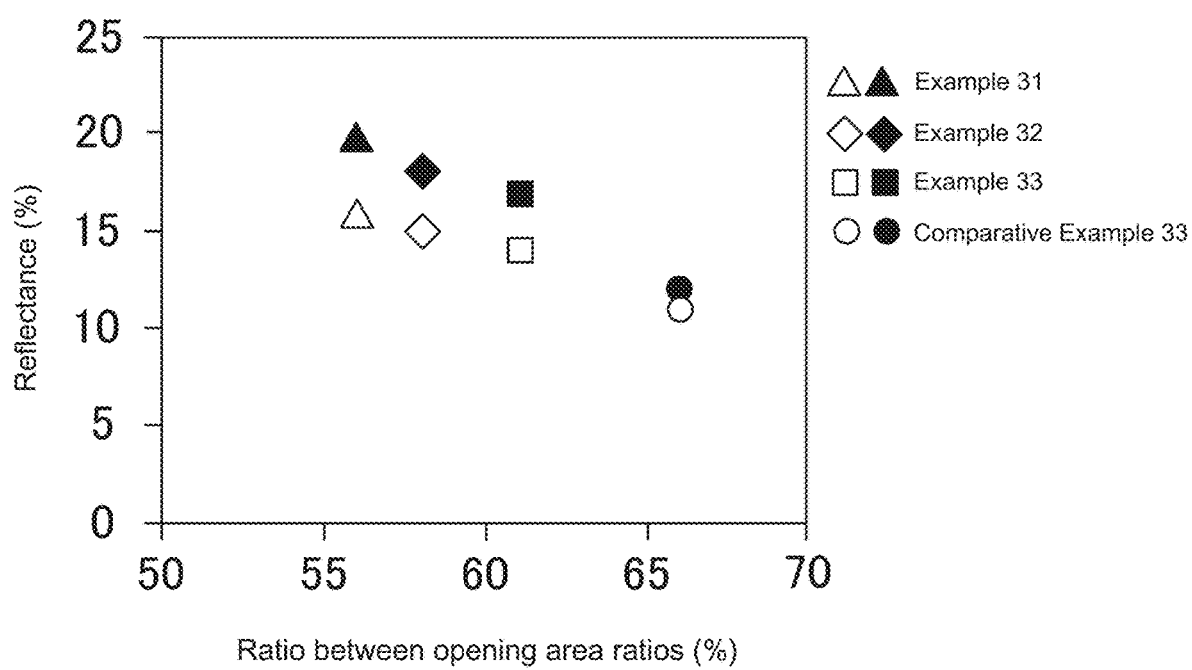
FIG. 37 is a graph showing the relationship of reflectance versus ratio between opening area ratios for optical films of Examples 31 to 33 and Comparative Example 33 which were evaluated as examples of optical films.

FIG. 37 shows the relationship of the reflectance of each principal surface versus the ratio between the opening area ratios of the two principal surfaces collectively for the optical films of Examples 31 to 33 and Comparative Example 33. In FIG. 37, the white symbols each represent the one principal surface, while the black symbols each represent the other principal surface. As shown in FIG. 37, when the ratio between opening area ratios was 65% or less, the reflectance of each principal surface of the optical film was high.

The present invention may be embodied in other forms without departing from the spirit or essential characteristics thereof. The embodiments disclosed in this specification are to be considered in all respects as illustrative and not limiting. The scope of the present invention is indicated by the appended claims rather than by the foregoing description, and all changes which come within the meaning and range of equivalency of the claims are intended to be embraced therein.

INDUSTRIAL APPLICABILITY

The polymer film of the present invention can be used in various applications. Examples of the applications include uses in a waterproof sound-permeable membrane, in a waterproof gas-permeable membrane, in a suction sheet, and in an optical film.

What is claimed is:

1. A polymer film comprising:
   through holes extending from one principal surface of the polymer film to an other principal surface of the polymer film, wherein
   the through holes are straight holes having a central axis extending straight,
   the through holes have a shape in which an area of a cross-section perpendicular to a direction of the central axis increases from the one principal surface of the polymer film toward the other principal surface,
   the polymer film includes a set of the through holes including:
      at least one first through hole, the central axis of which extends in one direction, and
      at least one second through hole, the central axis of which extends in another direction different from the one direction,
   the through holes include a first pair of through holes and a second pair of through holes, the first pair of through holes including central axes that converge toward one another in a direction from the one principal surface toward the other principal surface, and the second pair of through holes including central axes that diverge from one another in the direction from the one principal surface toward the other principal surface, and
   the through holes have an opening diameter a at the one principal surface and an opening diameter b at the other principal surface, and a ratio a/b of the opening diameter a to the opening diameter b is 80% or is less than 80%.

2. The polymer film according to claim 1, the polymer film being composed of at least one selected from polyethylene terephthalate, polycarbonate, polyimide, polyethylene naphthalate, and polyvinylidene fluoride.

3. A waterproof sound-permeable membrane comprising the polymer film according to claim 1, wherein
   the through holes have an opening diameter a of 12.0 μm or less at the one principal surface, and
   a gas permeability from the other principal surface to the one principal surface, as expressed in terms of Frazier number measured according to JIS L 1096, is 2.0 cm$^3$/(cm$^2$·second) or more and 80 cm$^3$/(cm$^2$·second) or less.

4. The waterproof sound-permeable membrane according to claim 3, wherein
   the through holes of the polymer film include:
      through holes having the central axis extending in a first oblique direction with respect to a perpendicular direction to the principal surfaces of the polymer film; and through holes having the central axis extending in a second oblique direction with respect to the perpendicular direction, and the first and second oblique directions are different from each other.

5. The waterproof sound-permeable membrane according to claim 3, wherein a water entry pressure as measured according to Method B (high hydraulic pressure method) of water penetration test specified in JIS L 1092 is 3 kPa or more.

6. The waterproof sound-permeable membrane according to claim 3, further comprising a sound-permeable supporting layer stacked with the polymer film.

7. A waterproof sound-permeable member comprising:
the waterproof sound-permeable membrane according to claim 3; and
a support joined to the waterproof sound-permeable membrane.

8. An electronic device comprising:
a housing enclosing an audio structure and provided with an opening to transmit sound between the audio structure and an outside of the housing; and
a waterproof sound-permeable membrane placed to cover the opening and to permit transmission of sound between the audio structure and the outside of the housing and prevent water from entering the housing from the outside through the opening, wherein
the waterproof sound-permeable membrane is the waterproof sound-permeable membrane according to claim 3.

9. An electronic device case for enclosing an electronic device having an audio structure, the electronic device case comprising:
an opening provided to transmit sound between the audio structure of the electronic device and an outside of the case; and
a waterproof sound-permeable membrane placed to cover the opening and to permit transmission of sound between the audio structure of the electronic device and the outside of the case and prevent water from entering the case from the outside through the opening, wherein
the waterproof sound-permeable membrane is the waterproof sound-permeable membrane according to claim 3.

10. A waterproof sound transmission structure comprising:
a housing provided with an opening to transmit sound between an inside and outside of the housing; and
a waterproof sound-permeable membrane placed to cover the opening and to permit transmission of sound between the inside and outside of the housing and prevent water from entering the housing from the outside through the opening, wherein
the waterproof sound-permeable membrane is the waterproof sound-permeable membrane according to claim 3.

11. A waterproof gas-permeable membrane comprising the polymer film according to claim 1.

12. The waterproof gas-permeable membrane according to claim 11, wherein the opening diameter a is 12 μm or less.

13. The waterproof gas-permeable membrane according to claim 11, wherein a density of distribution of the through holes in the polymer film is $1 \times 10^3$ holes/cm$^2$ or more and $1 \times 10^9$ holes/cm$^2$ or less.

14. The waterproof gas-permeable membrane according to claim 11, wherein an opening area ratio of the one principal surface is 50% or less.

15. The waterproof gas-permeable membrane according to claim 11, wherein
the through holes of the polymer film include:
through holes having the central axis extending in a first oblique direction with respect to a perpendicular direction to the principal surfaces of the polymer film; and
through holes having the central axis extending in a second oblique direction with respect to the perpendicular direction, and
the first and second oblique directions are different from each other.

16. The waterproof gas-permeable membrane according to claim 11, having a gas permeability in a thickness direction thereof, the gas permeability being 0.5 seconds/100 mL or more as expressed in terms of Gurley number measured according to JIS L 1096.

17. The waterproof gas-permeable membrane according to claim 11, wherein a water entry pressure as measured according to Method B (high hydraulic pressure method) of water penetration test specified in JIS L 1092 is 5 kPa or more.

18. The waterproof gas-permeable membrane according to claim 11, further comprising a gas-permeable supporting layer stacked with the polymer film.

19. A waterproof gas-permeable member comprising:
the waterproof gas-permeable membrane according to claim 11; and
a support joined to the waterproof gas-permeable membrane.

20. A waterproof ventilation structure comprising:
a housing having an opening; and
a waterproof gas-permeable membrane placed to cover the opening and to permit permeation of gas between an inside and outside of the housing and prevent water from entering the housing from the outside through the opening, wherein
the waterproof gas-permeable membrane is the waterproof gas-permeable membrane according to claim 11.

21. A suction sheet to be placed on a suction face of a suction unit that holds a workpiece by suction, the suction sheet comprising the polymer film according to claim 1, wherein
the opening diameter a is 10 μm or less.

22. The suction sheet according to claim 21, wherein
one principal surface of the suction sheet has a surface roughness (Ra) of 2 μm or less, the one principal surface having smaller-diameter openings of the through holes, and
the suction sheet has a gas permeability in a thickness direction thereof, the gas permeability being 10 seconds/100 mL or less as expressed in terms of Gurley number measured according to JIS L 1096.

23. A method for holding a workpiece by suction on a suction unit, the method comprising:
holding a workpiece by suction using a suction unit having a suction face with a suction sheet placed thereon, the holding being accomplished without direct contact between the suction face and the workpiece due to a presence of the suction sheet between the suction face and the workpiece, wherein
the suction sheet is the suction sheet according to claim 21, and
one principal surface of the suction sheet that has smaller-diameter openings of the through holes faces the workpiece.

24. A method for producing a ceramic capacitor, comprising:
- drawing by suction a ceramic green sheet formed on a release film to a suction face of a suction unit so as to separate the ceramic green sheet from the release film;
- transferring the separated ceramic green sheet to a place while keeping the ceramic green sheet held by suction on the suction face, and then stacking the ceramic green sheet onto another ceramic green sheet at the place; and
- sintering a stack of the ceramic green sheets that is formed by two or more repetitions of the drawing, transferring, and then stacking, wherein
- a suction sheet is placed on the suction face so that the ceramic green sheet is held by suction on the suction unit without direct contact between the suction face and the ceramic green sheet,
- the suction sheet is the suction sheet according to claim 21, and
- one principal surface of the suction sheet that has smaller-diameter openings of the through holes faces the ceramic green sheet.

\* \* \* \* \*